(12) United States Patent
Katagami et al.

(10) Patent No.: US 7,368,149 B2
(45) Date of Patent: May 6, 2008

(54) DISPLAY DEVICE HAVING A COLOR FILTER

(75) Inventors: Satoru Katagami, Hara-mura (JP); Tomomi Kawase, Matsumoto (JP); Tatsuya Ito, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 81 days.

(21) Appl. No.: 11/268,601

(22) Filed: Nov. 8, 2005

(65) Prior Publication Data

US 2006/0051498 A1 Mar. 9, 2006

Related U.S. Application Data

(62) Division of application No. 10/359,602, filed on Feb. 7, 2003, now abandoned.

(30) Foreign Application Priority Data

Feb. 12, 2002 (JP) ............................. 2002-034706
Dec. 25, 2002 (JP) ............................. 2002-375562

(51) Int. Cl.
 *B05D 5/06* (2006.01)
(52) U.S. Cl. ................ 427/162; 427/421.1; 427/421.4; 427/424; 427/425; 427/427.3
(58) Field of Classification Search ................ 427/162, 427/421.1, 424, 425, 427.3
See application file for complete search history.

(56) References Cited

U.S. PATENT DOCUMENTS 5,121,030 A 6/1992 Schott
5,661,371 A 8/1997 Salerno et al.
5,670,205 A 9/1997 Miyazaki et al.
5,935,331 A 8/1999 Naka et al.
6,024,798 A 2/2000 Yamada et al.
6,227,647 B1 5/2001 Akahira et al.
6,364,450 B1 4/2002 Yamaguchi et al.
6,783,208 B2 8/2004 Kawase et al.
6,874,883 B1 4/2005 Shigemura et al.
6,905,190 B1 6/2005 Otsuka et al.
2002/0105688 A1 8/2002 Katagami et al.

FOREIGN PATENT DOCUMENTS

CN 1116713 A 2/1996
CN 1127696 A 7/1996

(Continued)

*Primary Examiner*—Alain L. Bashore
(74) *Attorney, Agent, or Firm*—Oliff & Berridge, PLC

(57) ABSTRACT

A device and a method are provided to form a film by discharging a liquid material with a liquid discharge head or the like, such as an ink jet head, and which can reduce the unevenness resulting from variation of the amount of the discharged liquid material. To provide a device and a method to form a film by discharging a liquid material and which can increase process efficiency while suppressing the increase of costs, even if the liquid material is discharged onto various objects. When a color filter is manufactured, nozzles of a liquid discharge head discharge filter element materials onto filter-element-forming regions. In this instance, one color of the filter element materials is discharged while the liquid discharge head is swept in the longitudinal direction of a mother substrate. The other colors are discharged while the liquid discharge head is swept in the width direction of the mother substrate.

9 Claims, 59 Drawing Sheets

FOREIGN PATENT DOCUMENTS

| | | |
|---|---|---|
| EP | 0 101 280 A1 | 2/1984 |
| EP | 0 675 385 A1 | 10/1995 |
| EP | 0 754 553 A2 | 1/1997 |
| EP | 0 790 509 A2 | 8/1997 |
| EP | 0 832 744 A2 | 4/1998 |
| EP | 1 074 861 A2 | 2/2001 |
| EP | 1 225 472 A2 | 7/2002 |
| JP | A- 8-292319 | 11/1996 |
| JP | A- 9-101412 | 4/1997 |
| JP | A- 9-138306 | 5/1997 |
| JP | A-09-281324 | 10/1997 |
| JP | A- 9-300664 | 11/1997 |
| JP | A-10-151755 | 6/1998 |
| JP | A-10-278314 | 10/1998 |
| JP | A-10-282321 | 10/1998 |
| JP | A-10-300918 | 11/1998 |
| JP | A- 11-14816 | 1/1999 |
| JP | A-11-248925 | 9/1999 |
| JP | A-11-248927 | 9/1999 |
| JP | 2000-051766 | 2/2000 |
| JP | 2000-284113 | 10/2000 |
| JP | A-2001-130033 | 5/2001 |
| JP | A- 2002-221616 | 8/2002 |
| JP | A-2002-221617 | 8/2002 |
| JP | A- 2002-225259 | 8/2002 |
| JP | A-2002-250811 | 9/2002 |
| JP | A- 2002-250811 | 9/2002 |
| JP | A- 2002-273868 | 9/2002 |
| JP | A- 2002-273869 | 9/2002 |
| JP | A-2003-307613 | 10/2003 |

STRIPED

MOSAIC

DELTA

FIG. 12
(a)
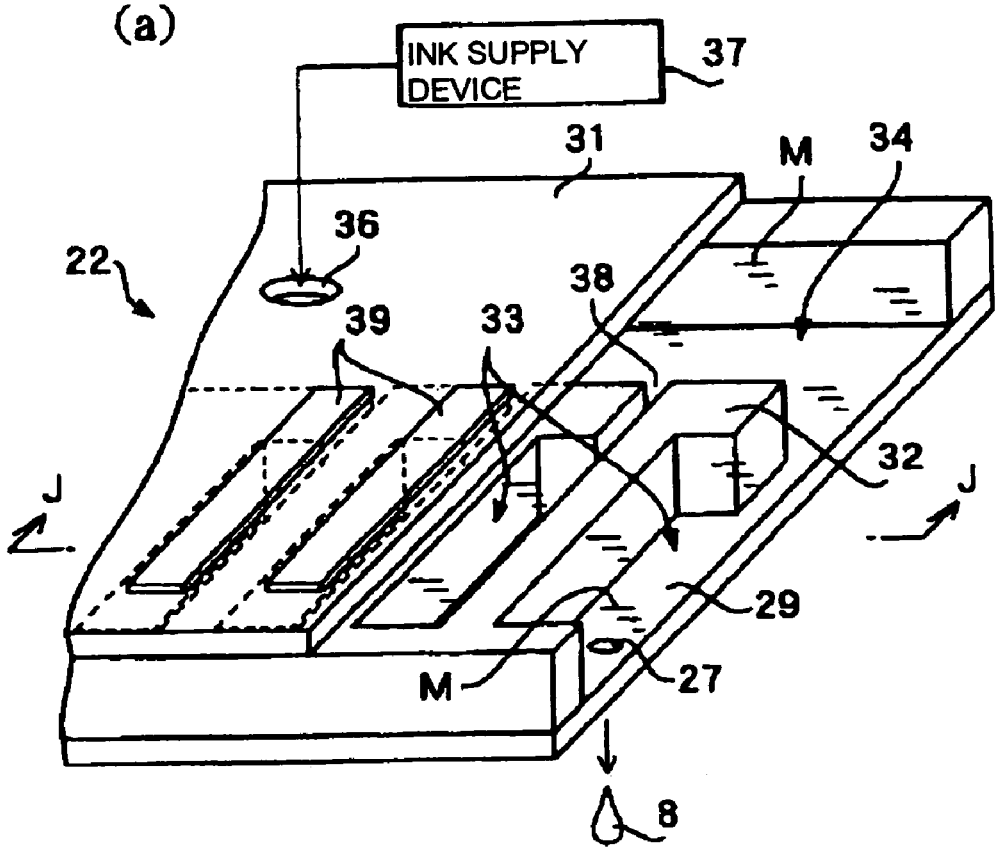
(b)
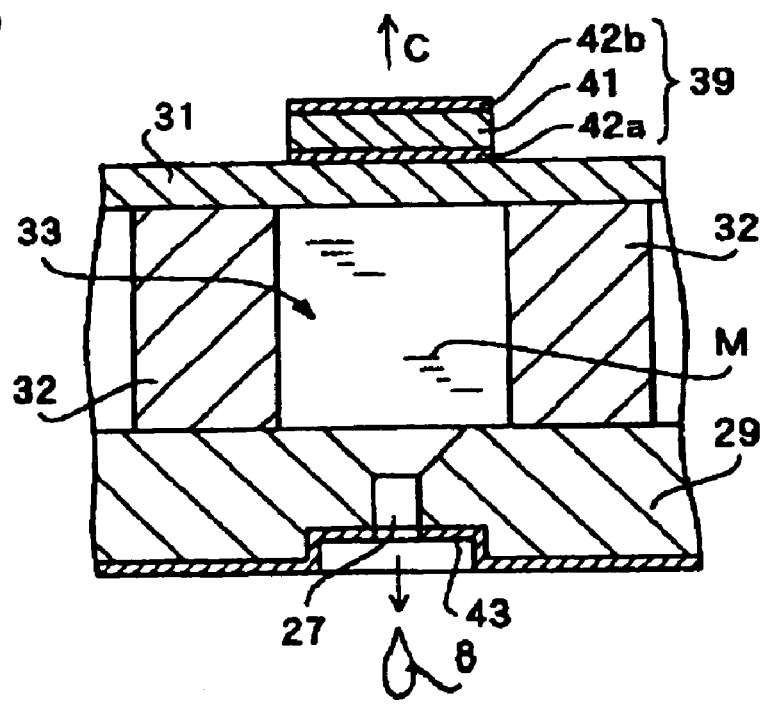

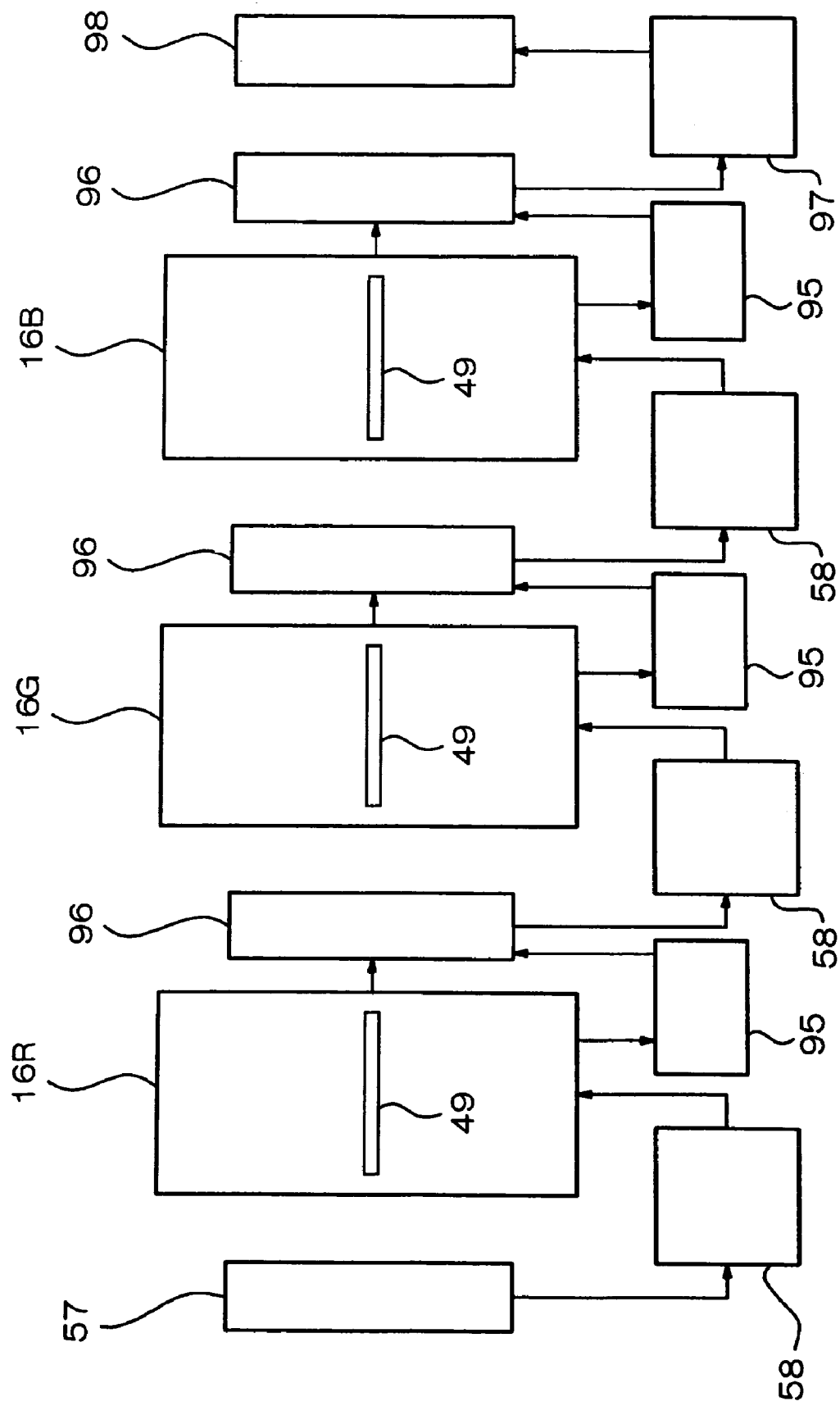

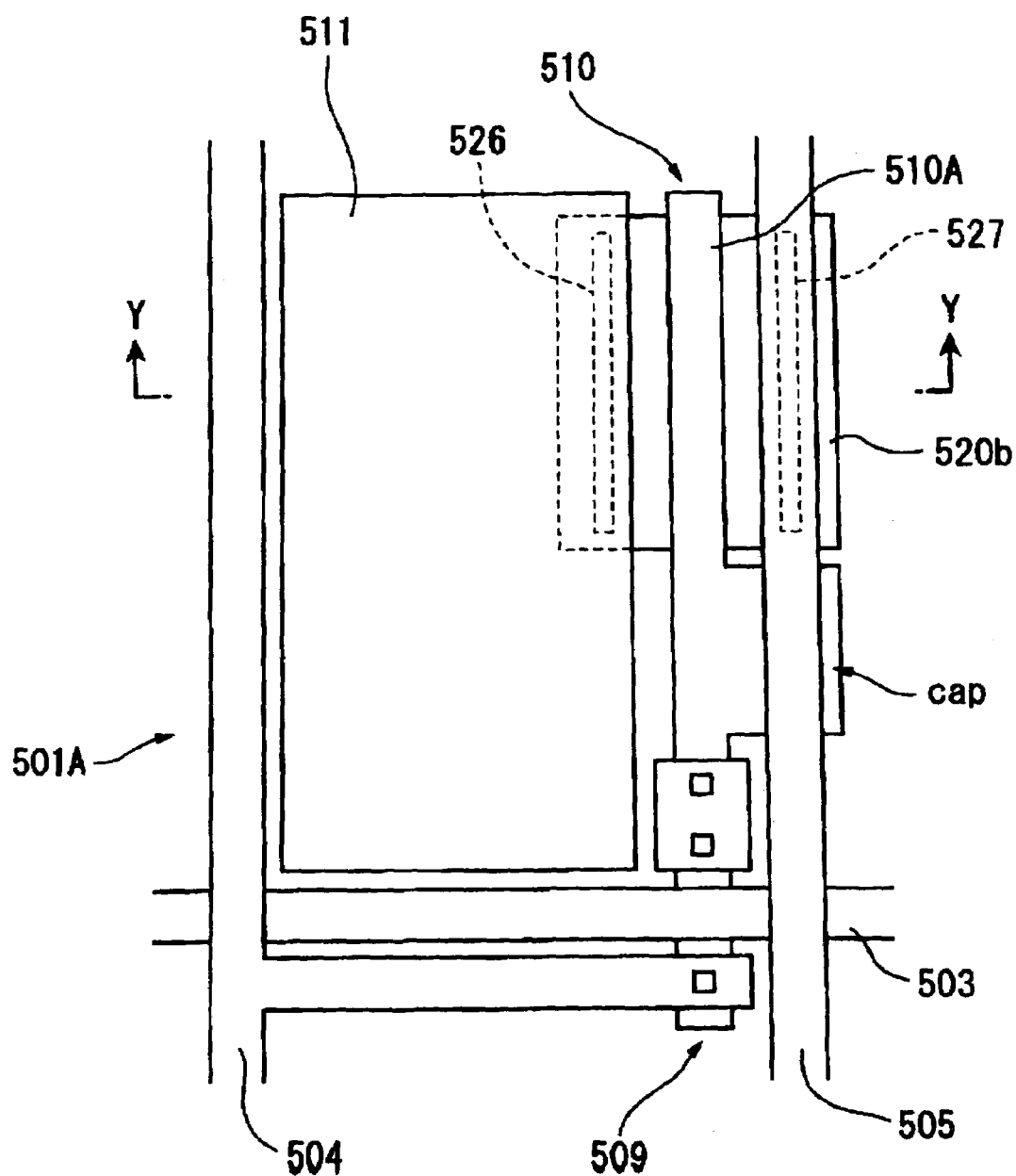

DISPLAY DEVICE HAVING A COLOR FILTER

This is a Divisional of application Ser. No. 10/359,602 filed Feb. 7, 2003 now abandoned. The entire disclosure of the prior application is hereby incorporated by reference herein in its entirety.

BACKGROUND OF THE INVENTION

1. Field of Invention

The present invention relates to a method for depositing a film, a device for depositing a film, a device for discharging droplets, a method for manufacturing a color filter, a display device including a color filter, a method for a manufacturing display device, a display device, and an electronic apparatus, and particularly to a technique for depositing a film by discharging droplets.

2. Description of Related Art

Various types of display devices using electro-optic devices, such as liquid crystal display devices and electroluminescent display devices (hereinafter referred to as EL devices), as display means and electronic apparatuses having such a display device, such as cellular phones and personal digital assistants, have been generally known. Since it is becoming common that these display devices display color images, the display devices often include a color filter in which R (red), G (green), and B (blue) dots serving as filter elements are arrayed on the surface of a substrate formed of glass, resin, or the like in a predetermined arrangement, such as a striped arrangement, a delta arrangement, or a mosaic arrangement.

In an EL device capable of displaying color images, display dots comprising R (red), G (green), and B (blue) dots serving as EL luminescent films disposed in a predetermined arrangement, such as a striped arrangement, a delta arrangement, a mosaic arrangement, or the like between pairs of electrodes are formed on a substrate of glass, resin, or the like. The display dots each emit light having predetermined color and gradation by controlling voltage applied to the electrodes from one display dot to another.

When these display devices are manufactured, the filter elements for colors of the color filter and the luminescent films for colors of the EL device are generally patterned by photolithography. Unfortunately, such a patterning step using photolithography requires complicated, time-consuming treatments, such as material deposition, exposure, and development. Also, the patterning step undesirably consumes a large amount of color materials and resist, consequently increasing costs.

In order to solve this problem, a method has been proposed in which droplets containing a filter element material or an EL luminescent material and a solvent are discharged by an ink jet technique to land on the surface of a substrate, thus forming filter elements or luminescent films arrayed in a dot manner. A process of forming filter elements 303 will now be illustrated in which filter elements 303 are arrayed by a ink jet technique, in a dot manner as shown in FIG. 61(b), in a plurality of unit regions 302 on a so-called mother substrate 301, which is a large-area substrate formed of glass, resin, or the like, as shown in FIG. 61(a).

In this instance, for example, while an ink jet head 306 having a nozzle line 305 comprising a plurality of nozzles 304 as shown in FIG. 61(c) linearly sweeps over each unit region 302 a plurality of times (two times in FIG. 61), as designated by the arrows A1 and A2 in FIG. 61(b), the plurality of nozzles 304 selectively discharge ink, or a filter material, to form filter elements 303 in desired positions.

These filter elements 303 are formed by arraying colors, such as R, G, and B, in a predetermined arrangement pattern, such as a striped arrangement, a delta arrangement, or a mosaic arrangement, as described above. Therefore, it is generally needed to use R, G, and B color ink jet heads 306 one by one in order to form a color filter in a predetermined color arrangement on the mother substrate 301.

In the ink jet head 306, the discharge quantity from the nozzles 304 constituting the nozzle line 305 generally varies. The ink jet head 306 has an ink discharge quality Q in that, for example, nozzles 304 at both ends of the nozzle line 305 offer the largest discharge quantity, nozzles 304 in the center of nozzle line 305 offer the larger discharge quantity, and the other nozzles 304 offer the smallest discharge quantity, as shown in FIG. 62(a).

As a result, when the filter elements 303 are formed with the ink jet head 306, as shown in FIG. 61(b), dense lines, that is, striped color shadings, are formed in either positions P1 at both ends of the ink jet head 306 or positions P2 at the middle of the ink jet head 306, or in both positions P1 and P2. As a result, light-transmission characteristics of the color filter disadvantageously have variation when viewed from above.

Accordingly, a method for reducing the unevenness of film deposition resulting from variation of the discharge quantity of droplets has been known (for example, refer to patent document 1 listed later) in which while sweeping and gradually shifting in the shifting direction (the horizontal direction in FIG. 61(b)), the ink jet head 306 discharges droplets a plurality of times to form each filter element 303 (hereinafter simply referred to as the "error variance" method).

Unfortunately, the error variance method greatly increases the times of sweeping in comparison with the known method even if an identical product is manufactured, thus increasing manufacturing time and reducing production efficiency. Accordingly, in order to solve the problem, a device is proposed (for example, patent document 2 listed below) in which a plurality of heads whose attitudes can be controlled are incorporated into a common carriage so that the heads sweep over a wide range at a time to increase the production efficiency.

[Patent Document 1]
Japanese Unexamined Patent Application Publication No. 2002-221616

[Patent Document 2]
Japanese Unexamined Patent Application Publication No. 2002-273868

SUMMARY OF THE INVENTION

Although various attempts including the above-described method and device are proposed in order to reduce the nonuniformity of film deposition or to suppress the reduction of production efficiency, it is difficult, in practice, to sufficiently reduce the unevenness of film deposition extending in a striped manner in the sweeping direction of the liquid discharge head. In particular, as the sweeping speed is set higher to increase productivity, the reduction of the striped nonuniformity becomes difficult even if the above-described method or device is employed.

On the other hand, when the plurality of unit regions 302 are formed on the mother substrate 301, different arrangement patterns (such as a striped arrangement, a delta arrangement, and a mosaic arrangement) are formed in the unit regions 302 in some cases so that the unit regions 302 correspond to the size or shape of the display of a resulting display device. Also, in order to increase the number of the unit regions 302, the number of or the intervals between display dots having the same color in a certain direction on the mother substrate 301 are often varied from one model to another. If the ink jet head is swept over such a mother substrate 301 without variation, process efficiency is undesirably reduced. In this instance, ink jet heads having different structures may be prepared for respective models to increase process efficiency. However, the preparation of many ink jet heads increases costs.

The present invention is intended to solve the above-described problems, and an object of the invention is to provide a technique for reducing the unevenness of film deposition in a method and a device for depositing films by discharging droplets with liquid discharge means. Another object of the present invention is to provide a device and a method for forming a film by discharging a liquid material with a liquid discharge head or the like, such as an ink jet head, and which can reduce the unevenness of film deposition resulting from variation of the quantity of the discharged liquid material. Still another object of the present invention is to provide a device and a method for forming a film by discharging a liquid material and which can increase process efficiency while suppressing the increase of costs, even if the liquid material is discharged onto various discharge objects.

In order to solve the problems, a method for forming a film by discharging a liquid material onto the surface of an object with a liquid discharge means is provided. The method comprises: a first sweeping step of discharging a plurality of droplets of the liquid material onto the surface of the object while the liquid discharge means sweeps over the object in a first direction with respect to the object, along the surface of the object; and a second sweeping step of discharging a plurality of droplets of the liquid material onto the surface while the liquid discharge means sweeps over the object in a second direction different from the first direction with respect to the object, along the surface of the object.

By varying the sweeping direction of the liquid discharge means with respect to the object between the first sweeping step and the second sweeping step and setting it in the first direction and the second direction, respectively, so that a plurality of droplets are sequentially deposited to form each film while sweeping is performed in two different directions, unevenness of film deposition resulting from the sweeping direction can be reduced. In particular, striped unevenness of film deposition extending in two different directions cancels each other out to become inconspicuous, even if such unevenness results from each sweeping step. Thus, uniform film deposition can be achieved on the whole.

Preferably, the first direction and the second direction are selected by rotating the object to orient in a direction different from each other between the first movement step and the second movement step such that the first direction and the second direction intersect each other. Since the orientation of the object is changed, it is not necessary to change the sweeping direction of the liquid discharge means. Consequently, film deposition can be performed by a simple system, but not a large mechanism.

According to another aspect, the present invention provides a film forming device comprising: liquid discharge means for discharging droplets of a liquid material onto the surface of an object; and shifting means for relatively moving the object and the liquid discharge means, along the surface of the object. The liquid discharge means is relatively moved in at least two directions with respect to the object along the surface of the object, and the liquid discharge means discharges the droplets one after another while moving in any direction of said at least two directions.

In the present invention, the sweeping direction can be selected from at least two directions, according to the film formation pattern which will be deposited onto an object. By discharging droplets one by one while sweeping is performed in at least two directions with respect to the object, unevenness of film formation resulting from the sweeping direction can be reduced.

Preferably, the film forming device further comprises an orientation means for orienting the object in at least two directions by rotating the object. By rotating the object with the orientation means to orient the object, the shifting means can become a simple structure in which the shifting means drives sweeping in only one direction. Thus, a miniaturized device and a reduced cost can be achieved on the whole.

According to another aspect, the present invention provides a liquid discharge device for discharging a liquid material onto an object. The liquid discharge device comprises a liquid discharge head for discharging the liquid material; shifting means for relatively moving the liquid discharge head and the object in a direction along the surface of the object, the liquid discharge head and the object opposing each other; and orientation means for horizontally orienting the object. The orientation means is capable of horizontally orienting the object in at least two different directions.

In the present invention, the orientation means for horizontally orienting the object is capable of horizontally orienting the object in at least two different directions. Therefore, the sweeping direction of the liquid discharge head relative to the object can be selected from at least two directions according to the arrangement of the regions on the object in which droplets will be discharged. Thus, efficiency of discharge can be increased. Also, the sweeping direction of the liquid discharge head driven by the shifting means can be varied by changing the horizontal orientation of the object. As a result, by sweeping the liquid discharge head in two different directions to discharge droplets onto one object for depositing a film, striped unevenness of the material resulting from the sweeping direction can be reduced.

Preferably, the orientation means comprises a plurality of observing means for observing different portions of the object. Some of the observing means are used in one orientation relationship and the other observing means are used in the other orientation relationship.

In the present invention, when the object is placed in different orientations, different observing means are used from each other. Therefore, since it is not needed to expand the observing area or to shift the observing means, the cost of the device can be reduced and the accuracy of observation can be increased.

Preferably, the observing means is capable of observing a plurality of portions of the object.

Since the plurality of observing means can each observe the plurality of portions of the object, the horizontal orientation of the object can be precisely observed. The observing means capable of observing a plurality of portions of the object may include two imaging devices.

Preferably, the observing position by the observing means is fixed in the device.

By fixing the observing position by the observing means in the device, no structure for shifting the observing means is needed, and thus, the accuracy of the observation can be increased.

Preferably, the two orientations are offered by rotating one horizontal orientation of the object about 90° on the normal of the surface of the object.

Thus, the liquid discharge head can be swept in two directions perpendicular to each other, with respect to the object. Consequently, striped unevenness of the material resulting from the sweeping direction of the liquid discharge head with respect to the object can be reduced most effectively.

According to another aspect, the present invention provides a liquid discharge device for discharging a liquid material onto an object. The liquid discharge device comprises: a liquid discharge head for discharging the liquid material; shifting means for relatively moving the liquid discharge head and the object in a direction along the surface of the object, the liquid discharge head and the object opposing each other; and orientation means for horizontally orienting the object. The sweeping direction in which the liquid discharge head moves while discharging droplets of the liquid material onto the object and the orientation of the object oriented by the orientation means have at least two orientation relationships.

In the present invention, the sweeping direction in which the liquid discharge head moves while discharging droplets of the liquid material onto the object and the orientation of the object oriented by the orientation means have at least two orientation relationships. Therefore, the sweeping direction of the liquid discharge head relative to the object can be selected from at least two directions according to the arrangement of the regions on the object in which droplets will be discharged. Thus, efficiency of discharge can be increased. Also, the sweeping direction of the liquid discharge head can be varied to two different directions with respect to the object. As a result, by sweeping the liquid discharge head in two different directions to discharge droplets onto one object, striped unevenness of the material resulting from the sweeping direction can be reduced.

Preferably, the orientation means comprises a plurality of observing means for observing different portions of the object. Some of the observing means are used in one orientation relationship and the other observing means are used in the other physical relationship.

In the present invention, when the object is placed in different orientations, different observing means are used from each other. Therefore, since it is not needed to expand the observing area or to shift the observing means, the cost of the device can be reduced and the accuracy of observation can be increased.

Preferably, the observing means is capable of observing a plurality of portions of the object.

Since the plurality of observing means can each observe the plurality of portions of the object, the horizontal orientation of the object can be precisely observed. The observing means capable of observing a plurality of portions of the object may include two imaging devices.

Preferably, the observing position by the observing means is fixed in the device.

By fixing the observing position by the observing means in the device, no structure for shifting the observing means is needed, and thus, the accuracy of the observation can be increased.

Preferably, the two orientations are offered by rotating one horizontal orientation of the object about 90° on the normal of the surface of the object.

Thus, the liquid discharge head can be swept in two directions perpendicular to each other, with respect to the object. Consequently, striped unevenness of the material resulting from the sweeping direction of the liquid discharge head with respect to the object can be reduced most effectively.

According to another aspect, the present invention provides a liquid discharge device for discharging a liquid material onto an object to form a film. The liquid discharge device comprises: a liquid discharge head for discharging the liquid material; shifting means for relatively moving the liquid discharge head and the object in a direction along the surface of the object, the liquid discharge head and the object opposing each other; and orientation means for horizontally orienting the object. The sweeping direction in which the liquid discharge head moves while discharging droplets of the liquid material onto the object is changed with respect to the orientation of the object oriented by the orientation means, during operation.

The sweeping direction of the liquid discharge head can be varied with respect to the object, during operation. As a result, by sweeping the liquid discharge head in two different directions to discharge droplets onto one object, striped unevenness of the material resulting from the sweeping direction can be reduced.

Preferably, the orientation means comprises a plurality of observing means for observing different portions of the object. Some of the observing means are used before the sweeping direction is changed and the other observing means are used after the sweeping direction is changed.

In the present invention, when the sweeping direction is changed, different observing means are used between before change and after change. Therefore, since it is not needed to expand the observing area or to shift the observing means, the cost of the device can be reduced and the accuracy of observation can be increased.

Preferably, the observing means is capable of observing a plurality of portions of the object.

Since the plurality of observing means can each observe the plurality of portions of the object, the horizontal orientation of the object can be precisely observed. The observing means capable of observing a plurality of portions of the object may include two imaging devices.

Preferably, the observing position by the observing means is fixed in the device.

By fixing the observing position by the observing means in the device, no structure for shifting the observing means is needed, and thus, the accuracy of the observation can be increased.

Preferably, the angle of the change in sweeping direction is about 90° C. on the normal of the surface of the object.

Thus, the liquid discharge head can be swept in two directions perpendicular to each other, with respect to the object. Consequently, striped unevenness of the material resulting from the sweeping direction with respect to the object can be reduced effectively.

The liquid material may be a liquid filter material capable of forming filter elements on the object, or a liquid luminescent material capable of forming EL films on the object. Thus, a color filter or EL elements included in a display device can enhance the quality of displayed color images.

According to another aspect, the present invention provides a method for manufacturing a color filter in which filter elements are formed by discharging a liquid material onto an object. The method comprises: a first discharge step of continuously discharging droplets of the liquid material onto the object, in a first sweeping direction; and a second discharge step of continuously discharging droplets of the liquid material onto the object, in a second sweeping direction.

When filter elements of a color filter is formed by discharging droplets of a liquid material, by performing sweeping in two directions of the first sweeping direction and the second sweeping direction, striped unevenness of color shading resulting from the sweeping direction can be reduced.

Preferably, in the first discharge step, first filter elements having a first color are formed in a first region of the object, and, in the second discharge step, second filter elements having a second color different from the first color are formed in a second region of the object, different from the first region.

By forming filter elements of different colors in different sweeping direction from one another, the manners of color shadings can be varied from one color to another. Thus, the resulting color shading is reduced on the whole.

Preferably, the filter elements comprises three types of filter elements having three colors, and one type of the filter elements, having one color exhibiting the strongest color shading resulting from the sweeping direction of droplets of a liquid material is discharged in one of the discharge steps and the other types having the other two colors are discharged in the other discharge step.

The sweeping direction of one type of the filter elements, having one color exhibiting the strongest color shading and the sweeping direction of the other types having the other two colors are different from each other. The difference between color shadings resulting from the difference between the sweeping directions easily cancels each other. Thus, color shading can be further reduced on the whole.

Preferably, the filter elements are formed with both the droplets discharged in the first discharge step and the droplets discharged in the second discharge step.

Since the filter elements are formed with a plurality of droplets discharged in different sweeping directions, variation of the amount of the discharged filter element material, resulting from the sweeping direction can be reduced. Thus, striped color shading resulting from the sweeping direction can be reduced.

Preferably, the first sweeping direction and the second sweeping direction form an angle of about 90° on the normal of the surface of the object.

Thus, the liquid discharge head can be swept in two directions perpendicular to each other, with respect to the object to discharge droplets. Consequently, striped unevenness of the material resulting from the sweeping direction with respect to the object can be reduced most effectively.

According to another aspect, the present invention provides a display device comprising a color filter having filter elements formed by discharging a liquid material onto an object. The color filter includes droplets of the liquid material which are continuously discharged in a plurality of sweeping directions.

The display device has a color filter formed with droplets of the liquid material which are continuously discharged in a plurality of sweeping directions. Specifically, the color filter is formed by mixing the droplets continuously discharged along one sweeping direction and the droplets continuously discharged along a different sweeping direction. Therefore, striped color shading resulting from the sweeping direction can be reduced, and the resulting display device can thus display a high quality images.

Preferably, the filter elements comprise a plurality of types of filer elements having different colors from one another. The types of filter elements are formed by continuously discharging droplets of the liquid material in sweeping directions different from one another.

Since the filter elements include a plurality of types of filer elements having different colors from one another and which are formed by continuously discharging droplets of the liquid material in sweeping directions different from one another, striped color shading resulting from the sweeping direction in which droplets are continuously discharged can be reduced.

Preferably, the filter elements comprise three types of filter elements having three colors, and one type of the filter elements having one color exhibiting the strongest color shading resulting from the sweeping direction is discharged in a sweeping direction different from the sweeping direction in which the other types, having the other two colors, are discharged.

Since the strongest color shading of one color mixed with the other color shadings, of the other two colors, color shading can be further reduced on the whole.

Preferably, the filter elements are formed by mixing droplets of the liquid material which are continuously discharged in different sweeping directions.

Since the filter elements are formed with a plurality of droplets discharged in different sweeping directions, variation of the amount of the discharged filter element material, resulting from the sweeping direction can be reduced. Thus, striped color shading resulting from the sweeping direction can be reduced.

Preferably, the different sweeping directions form an angle of about 90° on the normal of the surface of the color filter.

Thus, the color filter is formed by discharging droplets with sweeping in two directions perpendicular to each other. Consequently, striped unevenness of the material resulting from the sweeping direction of droplets can be reduced most effectively.

The display device of the present invention may be an electro-optic device in which an electro-optic material serves to display images. The electro-optic device may include a liquid crystal panel laid and the color filter laid one upon the other, or an EL layer and the color filter laid one upon the other.

According to another aspect, the present invention provides an electronic apparatus comprising a display device having any one of the color filters described above. The electronic apparatus of the present invention is not particularly limited, but is may be a personal digital assistant such as a cellular telephone, a mobile computer, or a portable electronic apparatus such as an electronic wrist watch.

According to another aspect, the present invention provides a method for manufacturing a display device, comprising: a first discharge step of continuously discharging droplets of a liquid material onto an substrate, in a first sweeping direction; and a second discharge step of continuously discharging droplets of the liquid material onto the substrate, in a second sweeping direction different from the first sweeping direction for depositing a film.

By discharging droplets onto the substrate to form a film with sweeping in two different directions, striped unevenness of the material resulting from the sweeping direction during discharge can be reduced. In particular, this is effective for a method for manufacturing an electronic apparatus.

Preferably, discharged droplets of the liquid material form display dots.

Thus, unevenness of the material in display dots resulting from the sweeping direction can be reduced and, consequently, unevenness of displayed images can be reduced. Thus, high-quality images can be achieved.

Preferably, each of the display dots is formed of a plurality of droplets of the liquid material, and some of the plurality of droplets are discharged in the first discharge step and the other droplets are discharged in the second discharge step.

Since each display dot is formed of a plurality of droplets discharged in different sweeping directions, unevenness of the material can be further reduced, and consequently, the quality of displayed images can be enhanced.

The display dots may have an EL layer. In this instance, preferably, the EL layer is formed by discharged droplets of a liquid material described above. The display dots may include an EL layer, a hole transport layer, and a pair of electrodes separated by these layers. In this instance, at least one of the EL layer, the hole transport layer, and the pair of electrodes may be formed by discharged droplets of a material described above.

Preferably, the first sweeping direction and the second sweeping direction form an angle of about 90° on the normal of the surface of the substrate.

By discharging droplets with sweeping in two directions perpendicular to each other, unevenness of the material can be reduced on the whole effectively.

According to another aspect, the present invention provides a display device comprising display dots discharging droplets of a liquid material onto a substrate for depositing a film. Preferably, the display dots each include droplets of the liquid material which are continuously discharged in a plurality of sweeping directions.

By discharging droplets onto the substrate to form display dots with sweeping in two different directions for depositing a film, striped unevenness of the material resulting from the sweeping direction during discharge can be reduced, and consequently, the quality of the displayed images can be enhanced. In particular, the present invention is effective for electronic apparatuses such as liquid crystal devices and EL devices.

Preferably, the display dots are formed by mixing droplets of the liquid material which are continuously discharged in different sweeping directions.

Since the display dots are formed with a plurality of droplets discharged in different sweeping directions, variation of the amount of the discharged material, resulting from the sweeping direction can be reduced. Thus, striped unevenness of displayed images resulting from the sweeping direction can be further reduced.

The display dots may have an EL layer. In this instance, preferably, the EL layer is formed by discharge described above. The display dots may include an EL layer, a hole transport layer, and a pair of electrodes separated by these layers. In this instance, at least one of the EL layer, the hole transport layer, and the pair of electrodes may be formed by discharged droplets described above.

Preferably, the different sweeping directions form an angle of about 90° on the normal of the surface of the color filter.

Thus, the display dots are formed by discharging droplets with sweeping in two directions perpendicular to each other. Consequently, striped unevenness of the material resulting from the sweeping direction of droplets can be reduced most effectively.

According to another aspect, the present invention provides an electronic apparatus comprising any one of the display devices described above. The electronic apparatus of the present invention is not particularly limited, but may be a personal digital assistant such as a cellular telephone, a mobile computer, or a portable electronic apparatus such as an electronic wrist watch.

BRIEF DESCRIPTION OF THE DRAWINGS

FIG. 12 is an illustration of the internal structure of the ink jet head, and (a) is a fragmentary perspective view and (b) is a sectional view taken along line J-J in (a).

FIG. 24 is a schematic illustration of a constitution of a manufacturing apparatus including a plurality of liquid discharge devices.

FIG. 41 is an enlarged plan view of a pixel region of the display device.

DETAILED DESCRIPTION OF PREFERRED EMBODIMENTS

Embodiments of a method for forming a film, a film forming device, a liquid discharge device, a method for manufacturing a color filter, a display device including a color filter, a method for manufacturing a display device, a display device, and an electronic apparatus will now be described in detail with reference to drawings.

[Device for Discharging Liquid]

Figure 8:
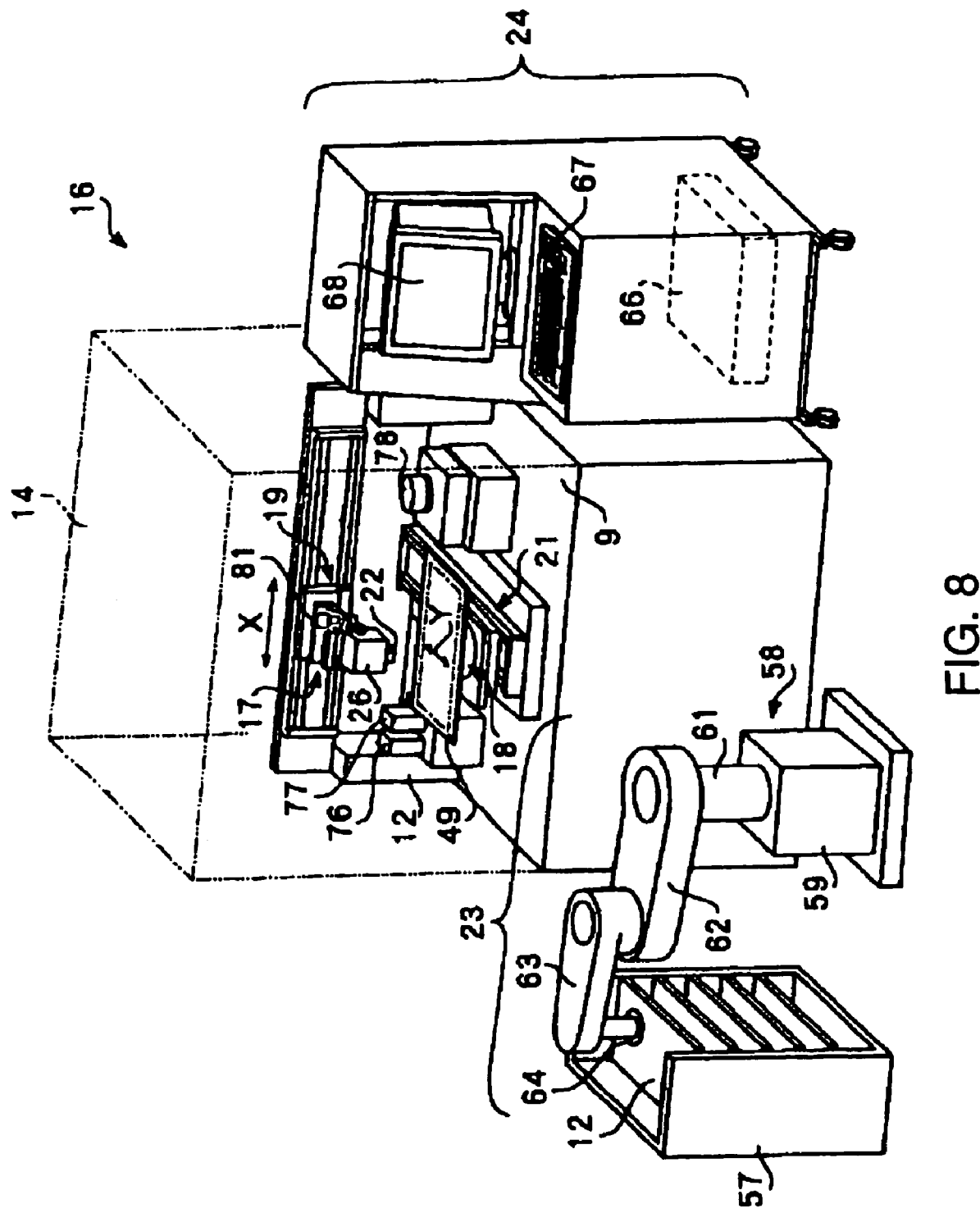
FIG. 8 is a perspective view of a liquid discharge device according to an embodiment of the present invention, which is a major part of a liquid discharge device, a color filter manufacturing device, devices for manufacturing various types of device, such as a liquid crystal device and an EL device, according to the present invention.

First, embodiments of a film forming device and a liquid discharge device will be described. As shown in FIG. 8, a liquid discharge device 16 has a head unit 26 including a liquid discharge head 22 serving as liquid discharge means, which may be an ink jet head used for a printer. The liquid discharge device 16 also has a head position controller 17 for controlling the position of the liquid discharge head 22, a substrate position controller 18 for controlling the position of a mother substrate 12, a sweeping driver 19 serving as sweeping operation driving means for sweeping the liquid discharge head 22 over the mother substrate 12 in a sweeping direction X, a shifting driver 21 for shifting the liquid discharge head 22 in a shifting direction Y intersecting (perpendicular to) the sweeping direction with respect to the mother substrate 12, a mother substrate feeding device 23 for feeding the mother substrate 12 to a predetermined position in the liquid discharge device 16, and a control apparatus 24 for generally controlling the liquid discharge device 16.

The head position controller 17, the substrate position controller 18, the sweeping driver 19, and the shifting driver 21 are disposed above a base 9. These devices may be provided with a cover 14 over them, if necessary. The head position controller 17, the sweeping driver 19, and the shifting driver 21 constitute shifting means.

Figure 10:
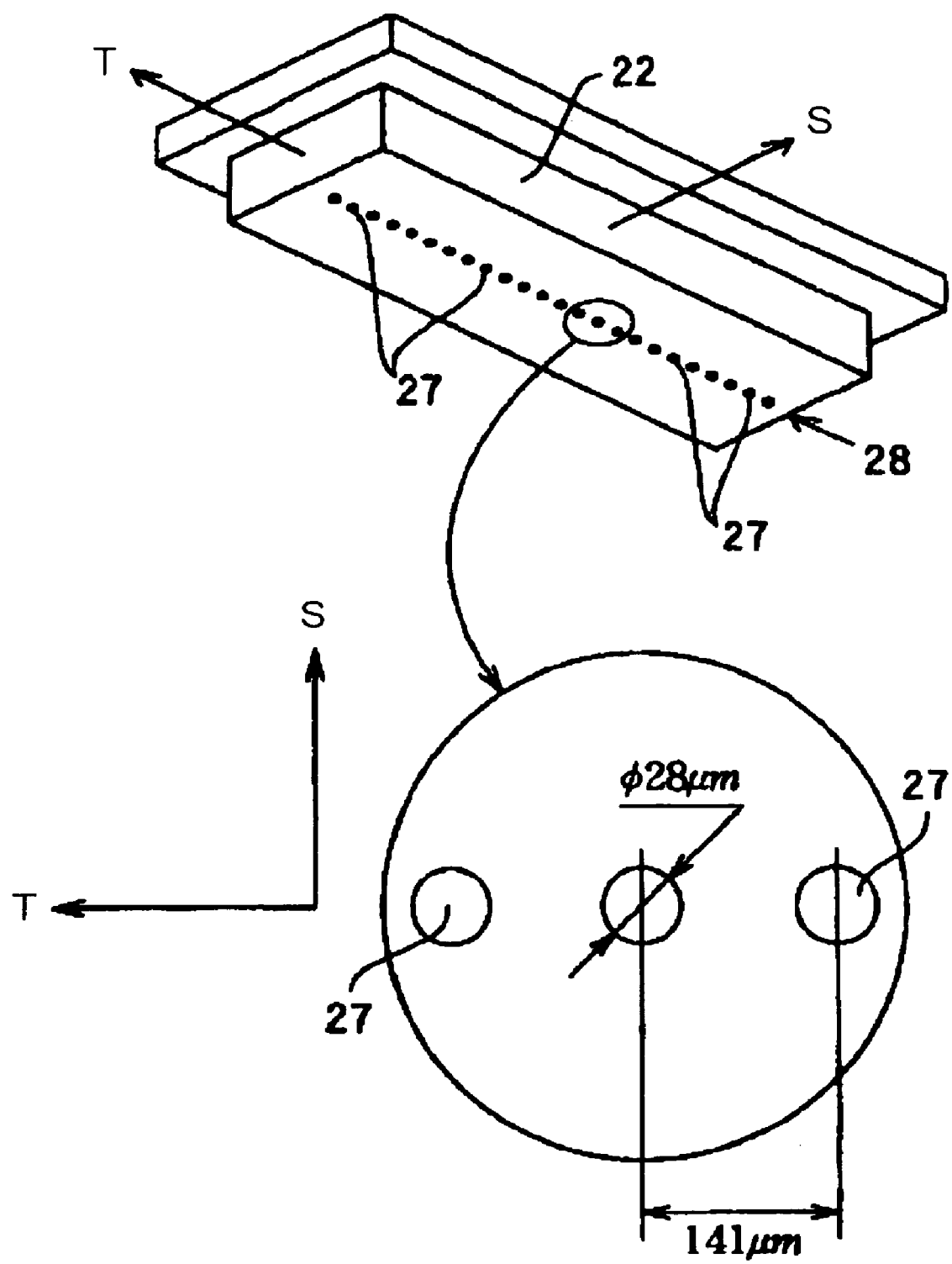
FIG. 10 is an enlarged perspective view of an ink jet head, which is a major part of the device shown in FIG. 9.

The liquid discharge head 22 has a nozzle line 28 comprising a plurality of nozzles 27, as shown, for example, in FIG. 10. The number of nozzles 27 is, for example, 180, and the diameter of the nozzles 27 is, for example, 28 µm. The pitch t between the nozzles 27 is, for example, 141 µm. The width direction M shown in FIG. 10 designates a standard direction in which the liquid discharge head sweeps, and the aligning direction T designates a direction in which the nozzles 27 in the nozzle line 28 align.

The liquid discharge head 22 has a nozzle plate 29 formed of stainless steel or the like, a diaphragm 31 opposing the nozzle plate 29, and a plurality of partition members 32 joining the nozzle plate 29 to the diaphragm 31, for example, as shown in FIG. 12(a) and FIG. 12(b). The partition members 32 define a plurality of ink chambers 33 and a liquid pool 34 between the nozzle plate 29 and the diaphragm 31. The ink chambers 33 communicate with the liquid pool 34 through passages 38.

The diaphragm 31 is provided with an ink supply port 36 in a proper position thereof. The ink supply port 36 is connected to an ink supply device 37. The ink supply device 37 supplies a filter element material M for one of R, G, and B colors, which may be an R-color filter element material, to the ink supply port 36. The supplied filter element material M fills the liquid pool 34 and then flows through the passages 38 to fill the ink chambers 33.

The nozzle plate 29 has nozzles 27 for jetting the filter element material M from the ink chambers 33. Ink pressurizers 39 are disposed, corresponding to the ink chambers 33, on the back surface of the diaphragm 31 opposite the surface opposing the ink chambers 33. The ink pressurizers 39 each have a piezoelectric element 41 and a pair of electrodes 42a and 42b separated by the piezoelectric element 41, as shown in FIG. 12(b). The piezoelectric element 41 is bent in the external direction designated by the arrow C by energization so that the volume of the corresponding ink chamber 33 increases. Accordingly, the filter element material M flows in an amount equivalent to the increased volume from the liquid pool 34 into the ink chamber 33 through the passage 38.

When current is removed from the piezoelectric element 41, the piezoelectric element 41 and the diaphragm 31 return to their original shapes. Since the ink chamber 33 also returns to its original shape, the pressure of the filter element material M in the ink chamber 33 increases to jet a droplet 8 of the filter element material M from the nozzle 27. In this instance, ink-repellent films 43 formed of, for example, Ni-tetrafluoroethylene eutectoid by plating are provided in the regions surrounding the nozzles 27 for preventing droplets 8 from being discharged in a wrong direction and from clogging the nozzles 27.

The head position controller 17, the substrate position controller 18, the sweeping driver 19, and the shifting driver 21, and other means disposed around the above-described liquid discharge head 22 will now be described with reference to FIG. 9. The head position controller 17 includes an α motor 44 for horizontally rotating the liquid discharge head 22 incorporated in the head unit 26, a β motor 46 for rotating the liquid discharge head 22 with reciprocation on an axis parallel to the shifting direction Y, a γ motor 47 for rotating the liquid discharge head 22 with reciprocation on an axis parallel to the sweeping direction X, and a z motor 48 for moving the liquid discharge head 22 in the vertical direction.

The substrate position controller 18 includes a table 49 on which the mother substrate 12 is placed and a θ motor 51 for horizontally rotating the table 49. The sweeping driver 19 has an X guide rail 52 extending in the sweeping direction X and an X slider 53 containing, for example, a pulse-driven linear motor. The X slider 53 moves in the sweeping direction X along the X guide rail 52 by, for example, activating the linear motor contained therein.

The shifting driver 19 has a Y guide rail 54 extending in the shifting direction Y and a Y slider 56 containing, for example, a pulse-driven linear motor. The Y slider 56 moves in the shifting direction Y along the Y guide rail 54 by, for example, activating the linear motor contained therein.

The linear motors contained in the X and Y sliders 53 and 56 can precisely control rotation angles of the output shafts by pulse signals applied thereto. Consequently, the position of the liquid discharge head 22, which is supported by the X slider 53, in the sweeping direction X and the position of the table 49 in the shifting direction Y can be controlled with high accuracy. The positions of the liquid discharge head 22 and the table 49 may be controlled by feedback with a servomotor or other desired methods, and the control of the positions is not limited to that by the pulse motor.

The table 49 is provided with positioning pins 50a and 50b thereon for controlling the horizontal position of the mother substrate 12. The mother substrate 12 is positioned by the substrate feeding device 23, which will be described later, such that end faces thereof in the sweeping direction X and the shifting direction Y are pressed to the positioning pins 50a and 50b. Preferably, the table 49 has known fixing means for fixing the positioned mother substrate 12 by, for example, air aspiration (vacuum drawing).

Figure 9:
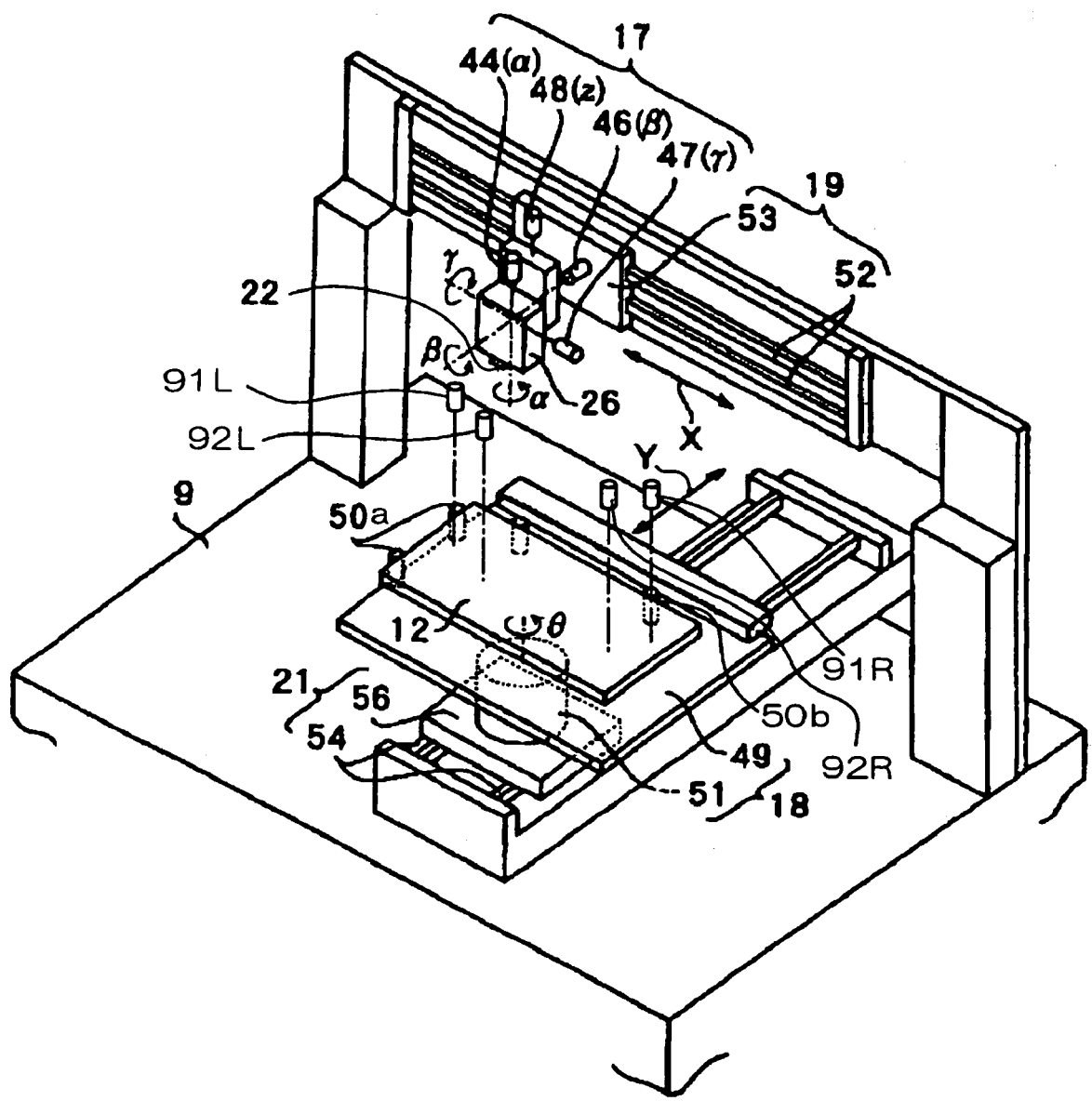
FIG. 9 is an enlarged perspective view of a major part of the device shown in FIG. 8.

The liquid discharge device 16 of the present embodiment is provided with a plurality of pairs (two pairs in the drawing) of imaging devices 91R and 91L and 92R and 92L above the table 49, as shown in FIG. 9. The drawing illustrates only the barrels of the imaging devices 91R and 91L and 92R and 92L, and the other parts and the structure of supporting the imaging devices are omitted. The imaging devices used for observation may be CCD cameras. FIG. 8 does not show the imaging devices.

Figure 22A:
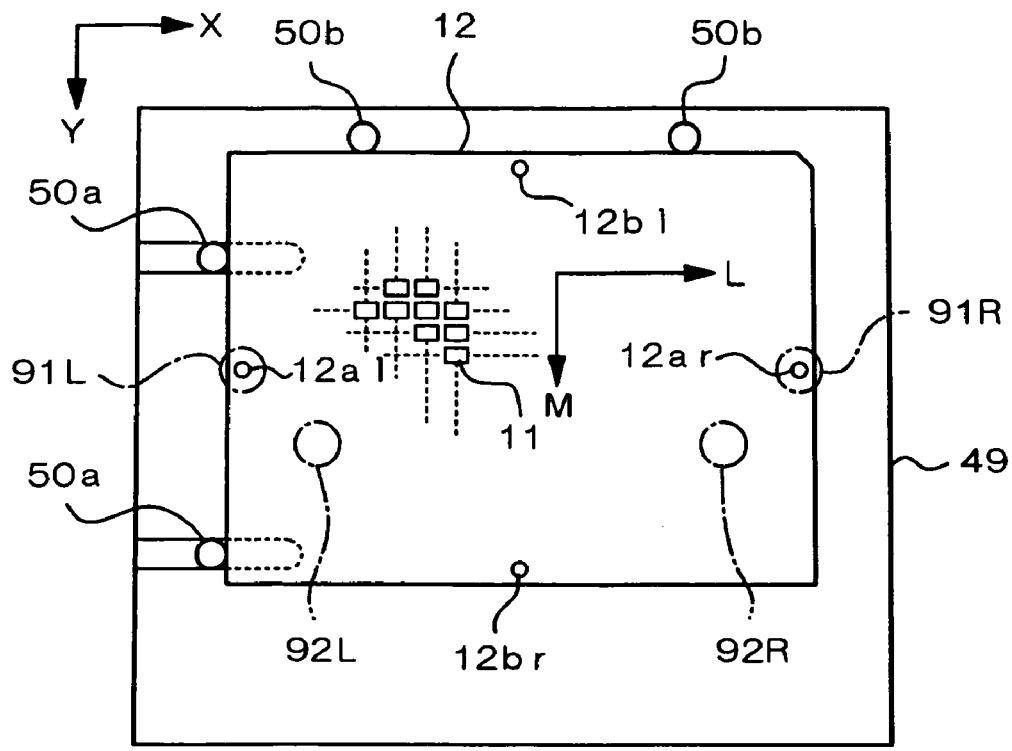
FIG. 22 is plan views (a) and (b) showing postures of a mother substrate on a table of a liquid discharge device according to an embodiment of the present invention.
Figure 22B:
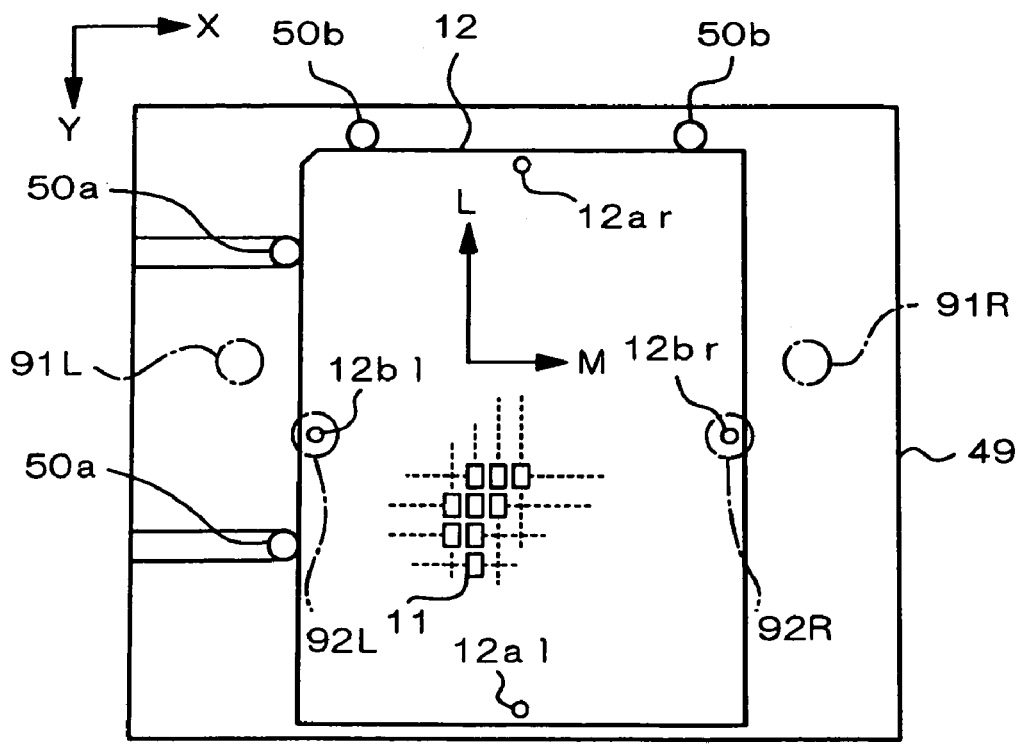

The structure of the imaging devices 91R and 91L and 92R and 92L will now be illustrated in detail. FIGS. 22(a) and 22(b) are plan views of the mother substrate 12 positioned on and supported by the table 49. The mother substrate 12 may be supported on the table 49 such that the longitudinal direction L thereof is parallel to the sweeping direction X when viewed from above, as shown in FIG. 22(a), or such that the longitudinal direction L is parallel to the shifting direction Y, as shown in FIG. 22(b). The positioning pins 50a, here in the drawing, can move in the horizontal direction of the drawing according to the horizontal position of the mother substrate 12 and the positioning pins 50b are fixed on the table 49. However, both the positioning pins 50a and 50b may be fixed on the table 49, as in the positioning pins 50b, or movable, as in the positioning pins 50a.

The mother substrate 12 is previously provided with two pairs, and a total of four, of alignment marks 12ar and 12al and 12br and 12bl in the outer region thereof. The alignment marks 12ar and 12al are provided at both sides of the mother substrate 12 in the longitudinal direction L, respectively. The alignment marks 12br and 12bl are provided at both sides of the mother substrate 12 in the width-extending direction, that is, in the width direction M, respectively. When the mother substrate 12 is supported on the table 49 such that the longitudinal direction L thereof is parallel to the sweeping direction X, as shown in FIG. 22(a), the imaging devices 91R and 91L shoot the alignment marks 12ar and 12al, respectively. When the mother substrate 12 is supported on the table 49 such that the longitudinal direction L thereof is parallel to the shifting direction Y, as shown in FIG. 22(b), the imaging devices 92R and 92L shoot the alignment marks 12br and 12bl, respectively.

The imaging devices 91R and 91L and 92R and 92L are each directly or indirectly fixed to a fixing portion (for example, the base 9) of the liquid discharge device 16. Thus, the position of the mother substrate 12 on the table 49 are accurately detected by observing the mother substrate 12 with the fixed imaging devices.

Returning to FIG. 8, description will be continued. The mother substrate feeding device 23 shown in FIG. 8 includes a mother substrate holder 57 for accommodating mother substrates 12 and a mother substrate carrier 58 for carrying the mother substrates 12, such as a robot. The mother substrate carrier 58 includes a base 59, an up-and-down shaft 61 rising and lowering with respect to the base 59, a first arm 62 rotating on the up-and-down shaft 61, a second arm 63 rotating on the basis of the movement of the first arm 62, and a sucking pad 64 provided on the undersurface of the end of the second arm 63. The sucking pad 64 is intended to hold the mother substrate 12 by air aspiration (vacuum drawing) or the like.

A capping device 76 and a cleaning device 77 are disposed at one side of the shifting driver 21 and under the sweeping locus of the liquid discharge head 22, as shown in FIG. 8. Furthermore, an electronic balance 78 is disposed at the other side of the shifting driver 21. The capping device 76 is intended to prevent the nozzles 27 (see FIG. 10) from drying while the liquid discharge head 22 is in standby. The cleaning device 77 is intended to clean the liquid discharge head 22. The electronic balance 78 is intended to weigh the ink droplet 8 discharged from each nozzle 27. Also, a head camera 81 shifting together with the liquid discharge head 22 is attached in the vicinity of the liquid discharge head 22.

The control apparatus 24 shown in FIG. 8 includes a computer main body 66 containing a processor, an input device 67, such as a keyboard, and a display device 68, such as a CRT. The computer main body 66 includes a CPU (central processing unit) 69 shown in FIG. 14 and an information-recording medium 71 serving as a memory for storing various types of information.

Figure 14:
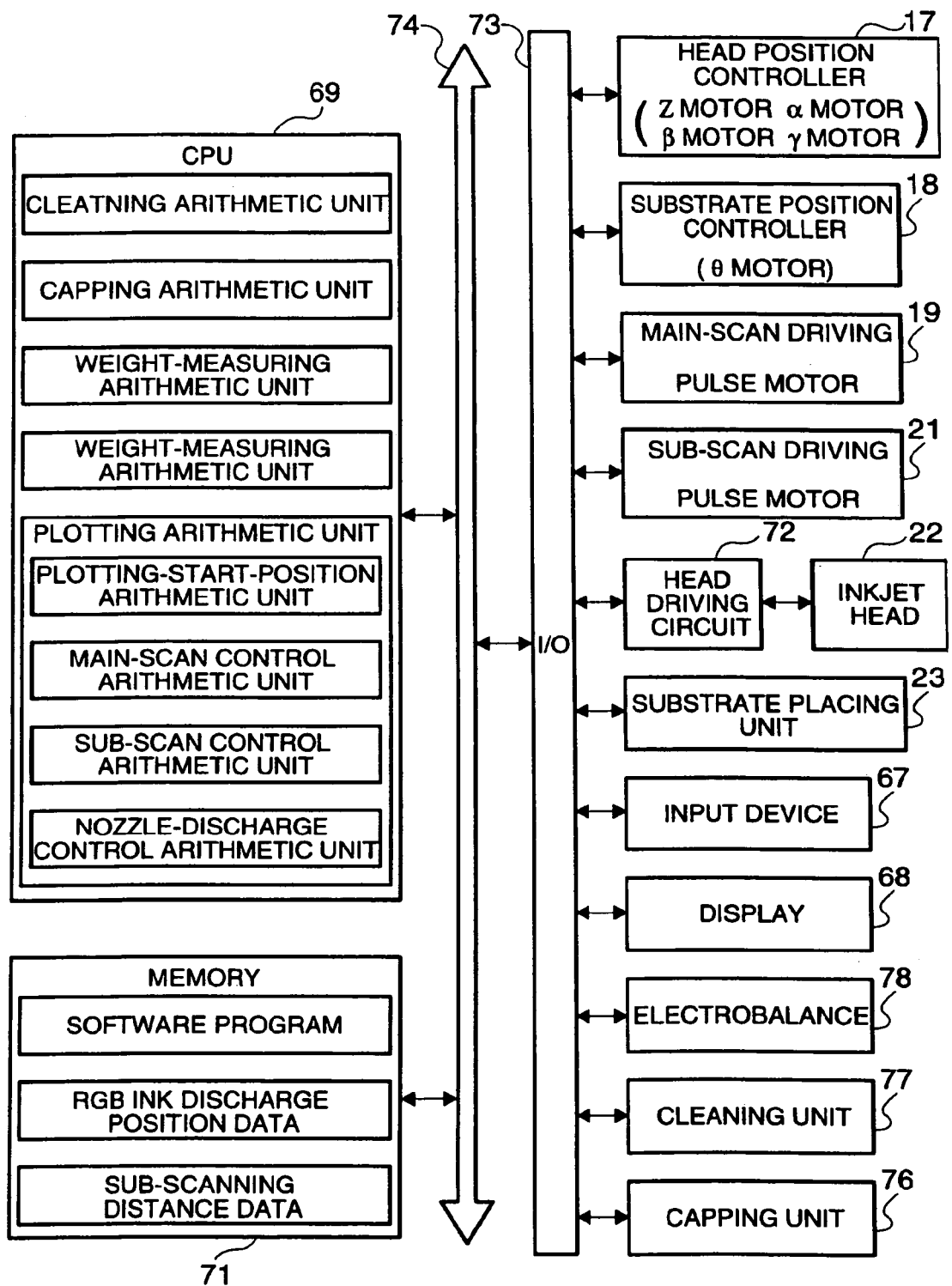
FIG. 14 is a block diagram of an electric control system used in the ink jet head shown in FIG. 8.

The head position controller 17, the substrate position controller 18, the sweeping driver 19, the shifting driver 21, and a head driving circuit 72 for driving the piezoelectric elements 41 (see FIG. 12(b)) in the liquid discharge head 22 are connected to the CPU 69 through an input-output interface 73 and a bus 74, as shown in FIG. 14. The substrate feeding device 23, the input device 67, the display device 68, the capping device 76, the cleaning device 77, and the electronic balance 78 are also connected to the CPU 69 through the input-output interface 73 and the bus 74, as in above.

Memories, such as the information-recording medium 71, generally include semiconductor memories, such as a RAM (random access memory) and a ROM (read only memory), and external storages, such as a hard disk, a CD-ROM reading device, and a disk-shaped recording medium. The information-recording medium 71 has: memory areas for storing software in which procedures for controlling the liquid discharge device 16 are programmed, coordinate data defining positions in the mother substrate 12 to which the liquid discharge head 22 discharges ink, and the distance at which the mother substrate 12 is shifted in the shifting direction Y in FIG. 9; areas for functioning as a working area of the CPU 69, temporary files, and the like; and other various memory areas.

The CPU 69 functions as a control to discharge ink in predetermined positions on the surface of the mother substrate 12, according to the software stored in the memory, or the information recording medium 71. As for portions for embodying concrete functions, the CPU 69 has a cleaning operation part for performing arithmetic computation for cleaning, a capping operation part for performing capping operation, a weighing operation part for performing arithmetic computation for measuring weight with the electronic balance 78, and a drawing operation part for drawing a predetermined pattern by discharging ink droplets onto the surface of the mother substrate 12, as shown in FIG. 14.

The drawing operation part has various controlling operation parts for performing arithmetic computations such as a drawing initial position operating part for locating the liquid discharge head 22 at an initial position, a sweeping control operation part for sweeping the liquid discharge head 22 in the sweeping direction X at a predetermined speed, a shifting operation part for shifting the mother substrate 12 a predetermined distance in the shifting direction Y, and a nozzle discharge control operation part for determining which of the plurality of nozzles 27 of the liquid discharge head 22 discharges ink.

The above-described control functions are embodied by software used with the CPU 69, in the embodiment. However, these functions may be embodied by an electronic circuit, but not CPUs, if such an electronic circuit is applicable.

Figure 15:
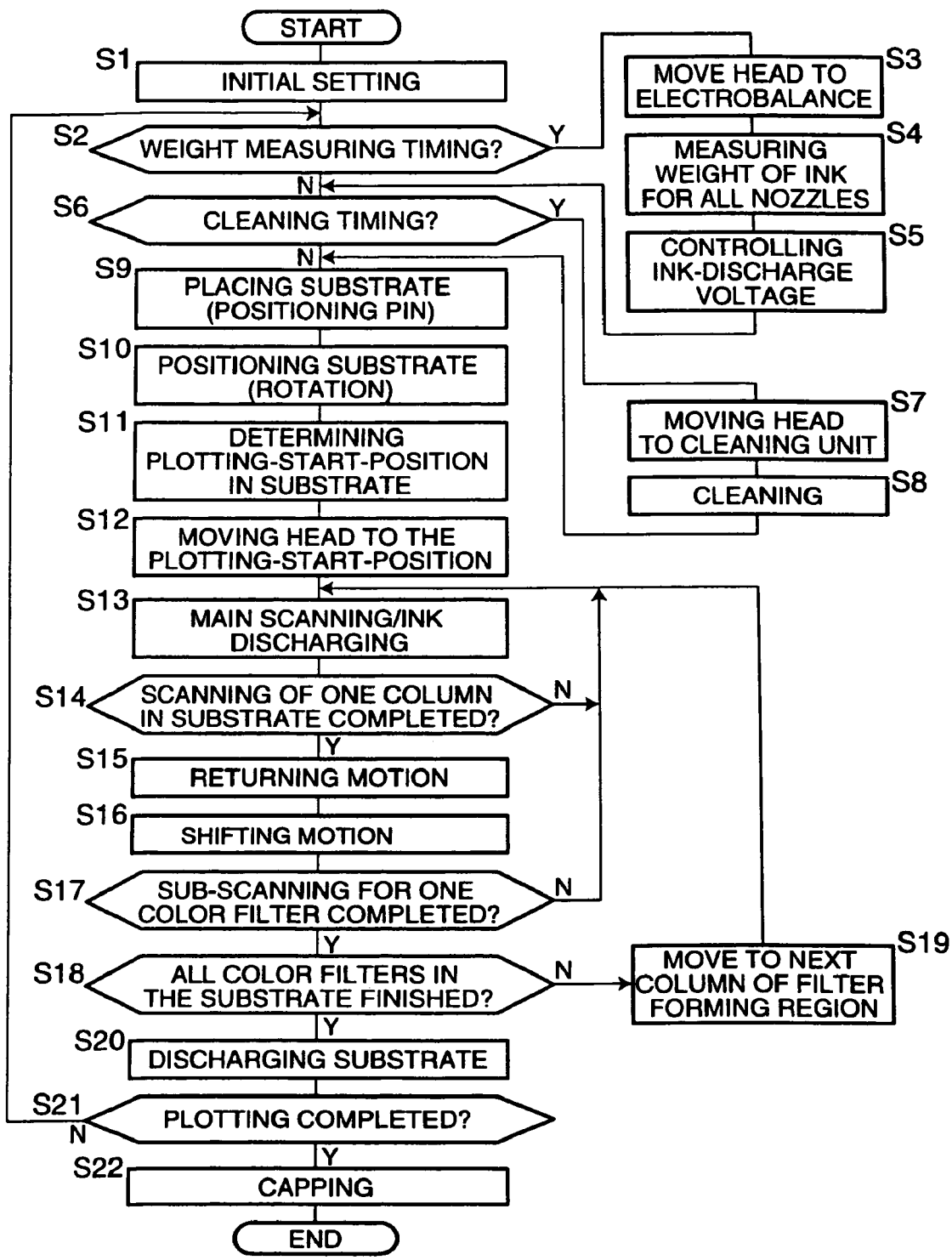
FIG. 15 is a flow chart of control exercised by the control system shown in FIG. 14.

Turning now to the flow chart shown in FIG. 15, the operation of the liquid discharge device 16 structured as described above will be illustrated. When an operator turns on the liquid discharge device 16, initialization is performed in step S1. Specifically, the head unit 26, the substrate feeding device 23, control apparatus 24, and other devices are restored to the initial settings.

When weighing timing comes (step S2), the sweeping driver 19 moves the head unit 26 shown in FIG. 9 to the position of the electronic balance 78 shown in FIG. 8 (step S3). The electronic balance 78 weighs the ink droplet discharged from the nozzles 27 (step S4). Voltage applied to the piezoelectric elements 41 of the nozzles 27 is adjusted according to the ink-discharge performance of the nozzles 27 evaluated by the weigh (step S5).

When cleaning timing comes (step S6), the sweeping driver 19 moves the head unit 26 to the cleaning device 77 (step S7). The cleaning device 77 cleans the liquid discharge head 22 (step S8).

Before weighing timing and cleaning timing come, or after weighing and cleaning are completed, the substrate feeding device 23 shown in FIG. 8 is activated to feed the mother substrate 12 to the table 49 in step S9. Specifically, the sucking pad 64 draws one of the mother substrates 12 in the mother substrate holder 57 to hold it up. The up-and-down shaft 61, the first arm 62, and the second arm 63 are moved to carry the mother substrate 12 to the table 49 and, then, press the mother substrate 12 to the pins 50a and 50b (see FIG. 9) previously provided in proper places on the table 49. In order to prevent displacement of the mother substrate 12, it is preferable to fix the mother substrate 12 to the table 49 by means of air aspiration (vacuum drawing) or the like.

Then, while the imaging devices 91R and 91L, shown in FIG. 9, observe the mother substrate 12, the table 49 is horizontally rotated to position the mother substrate 12 by rotating the output shaft of the θ motor 51 in small angles (step S10). More specifically, the pairs of imaging devices 91R and 91L and 92R and 92L shoot the alignment marks 12*ar* and 12*al* and 12*br* and 12*bl* provided at the sides of the mother substrate 12. The horizontal posture of the mother substrate 12 is calculated from the positions where the alignment marks are shot. The rotation angle θ is adjusted by rotating the table 49 according to the horizontal posture of the mother substrate 12.

Then, while the head camera 81 shown in FIG. 8 observes the mother substrate 12, the position where the liquid discharge head 22 starts drawing is determined by calculation (step S11). The liquid discharge head 22 is shifted to the starting position of drawing by appropriately operating the sweeping driver 19 and the shifting driver 21 (step S12).

Figure 1:
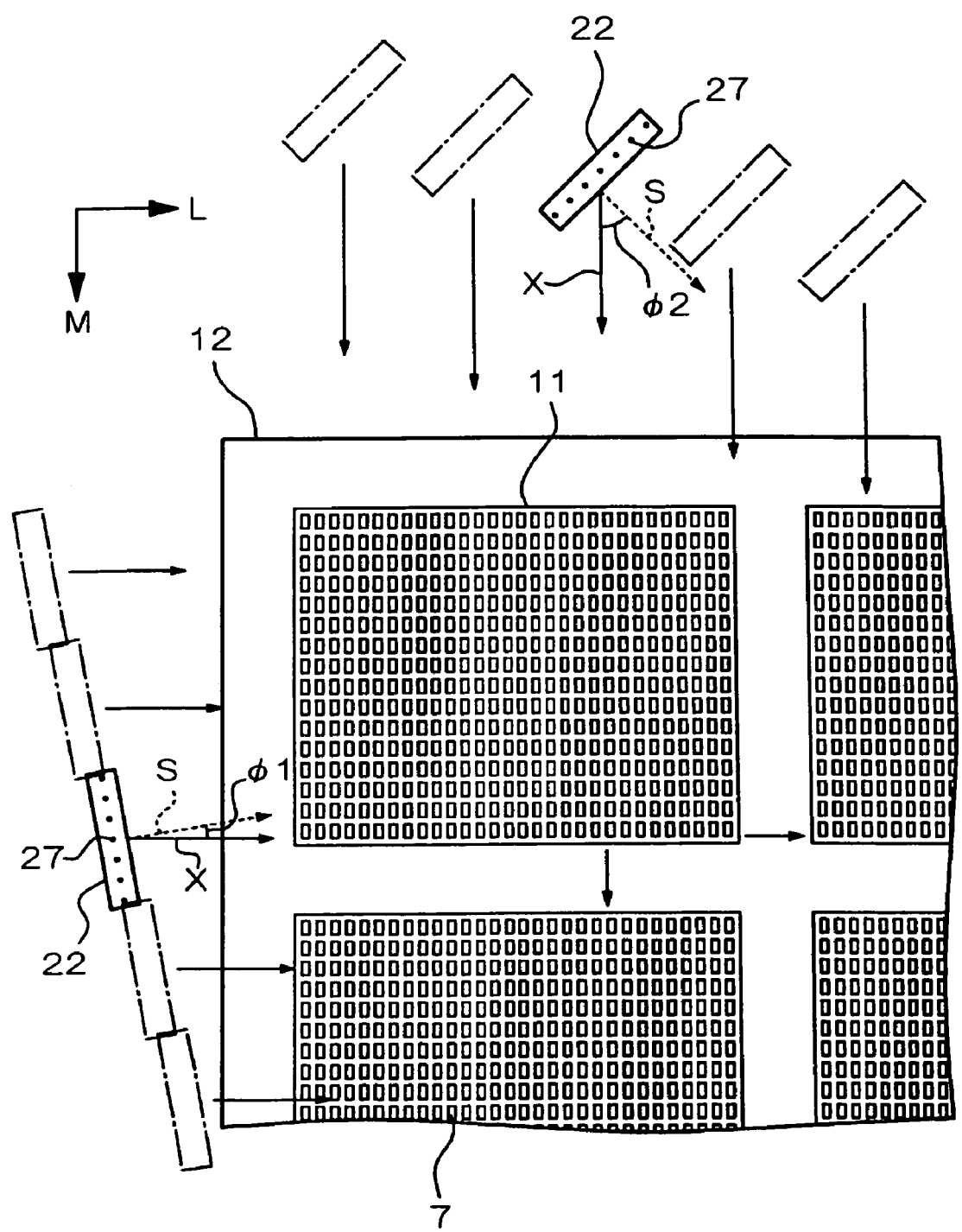
FIG. 1 is a schematic plan view of a major step of a method for manufacturing a color filter according to an embodiment of the present invention.
Figure 2:
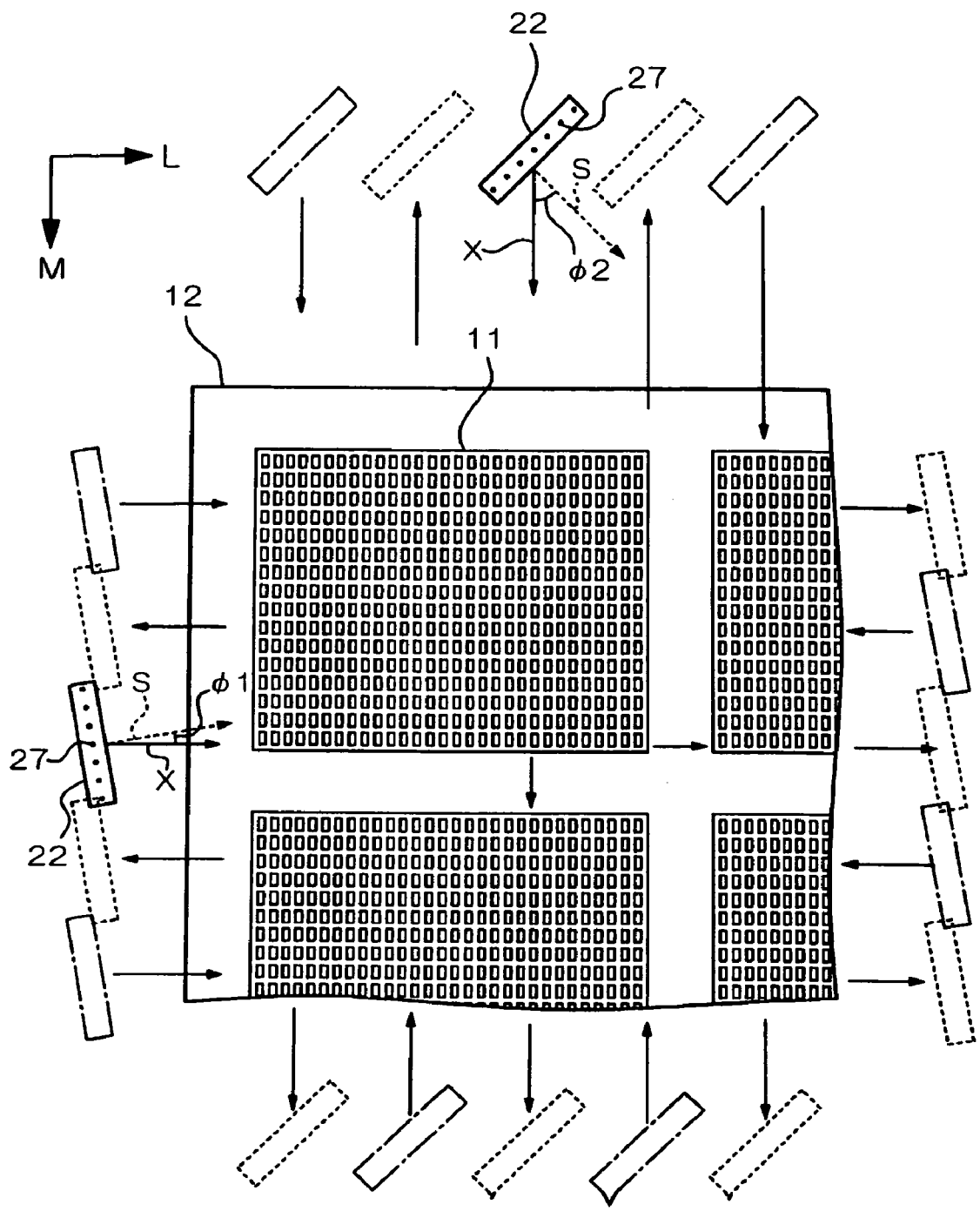
FIG. 2 is a schematic plan view of a major step of a method for manufacturing a color filter according to another embodiment of the present invention.

In this instance, the standard direction S shown in FIG. 10 of the liquid discharge head 22 is not necessarily parallel to the sweeping direction X, and it may form an angle φ1 or φ2 with respect to the sweeping direction X, as shown in FIGS. 1 and 2. These angles φ1 and φ2 are intended to geometrically equalize the pitch of the nozzles 27 arranged in the T direction to the pitch of droplets landing on the mother substrate 12 in the shifting direction Y because the pitch of the ink droplets to be discharged onto the surface of the mother substrate 12 is often different from the pitch of the nozzles 27.

When the liquid discharge head 22 is placed in the starting position of drawing in step S12 shown in FIG. 15, the liquid discharge head 22 is linearly moved to sweep in the sweeping direction X at a constant speed in step S13. The liquid discharge head 22 continuously discharges ink droplets from the nozzles 27 thereof onto the surface of the mother substrate 12 during sweeping.

The amount of an ink droplet may be set such that the entire amount of ink is discharged to an area covered by a series of sweeping operation of the liquid discharge head 22. Alternatively, when the liquid discharge head 22 sweeps several times as described later with reference to FIGS. 3 and 4, the amount of the ink droplet may be set such that a fraction (for example, one fourth) of the entire amount of ink required in one series of sweeping operation is discharged. The sweeping operation is repeated several times (for example, four times) so as to overlap parts of sweeping areas in the shifting direction Y and to cover the entire area where the ink should be discharged.

After the completion of a series of sweeping on the mother substrate 12 (step S14), the liquid discharge head 22 reverses the shifting direction to return to the initial position (step S15), and shifts a predetermined distance (by a shifting distance set in advance) in the shifting direction Y (step S16). The ink is then swept again and discharged in step S13, and the above-described procedure is repeated to sweep over a plurality of lines. After the completion of a series of sweeping, the liquid discharge head 22 may be driven so as to shift a predetermined distance in the shifting direction Y and, then, turn to sweep in the opposite direction, as described later with reference to FIG. 2.

In the case of forming a plurality of color filters in the mother substrate 12, as described later, the liquid discharge head 22 shifts a predetermined distance in the shifting direction Y after the completion of ink discharge to the entirety of a line over the color filter regions on the mother substrate 12 (step S17), and repeats steps S13 to S16. After ink discharge is completed to all lines in the color filter region on the mother substrate 12 (step S18), the substrate feeding device 23 or another transport means carries the treated mother substrate 12 to the outside in step S20. Then, the feed of the mother substrate 12 and the discharge of ink are repeated as in above until an operator give a direction to terminate the procedure.

When the operator directs the CPU 69 to terminate the procedure (step S21), the liquid discharge head 22 is carried to the capping device 76. The capping device 76 caps the liquid discharge head 22 (step S22).

In the liquid discharge device 16 structured as in above, ink can land on the entire surface of the mother substrate 12 by continuously discharging ink droplets while the liquid discharge head 22 sweeps in the sweeping direction X and by shifting the sweeping operation in the shifting direction Y and then repeating the sweeping operation. In the present embodiment, the mother substrate 12 on the table 49 can be positioned using the imaging devices 91R and 91L which shoot the alignment marks 12*ar* and 12*al*, as shown in FIG. 22(*a*). At the same time, the mother substrate 12 put on the table 49 in a different horizontal posture (the posture in which the mother substrate 12 is rotated 90° on the normal thereof) can be positioned using the imaging devices 92R and 92L which shoot the alignment marks 12*br* and 12*bl*, as shown in FIG. 22(*b*). Therefore, two different sweeping directions X (perpendicular to each other) can be set with respect to the mother substrate 12.

It is generally assumed that mother substrates 12 having various ink-landing-position arrangements are fed to the liquid discharge device 16. For example, when a plurality of unit regions 11 are arrayed on the mother substrate 12, as shown in FIG. 22, the size of the unit regions 11 or the dot array pattern may be varied between product models, or the arrangement manner of the unit regions 11 may be varied in order to increase productivity by increasing the number of unit regions 11 as many as possible. Accordingly, in the case of the mother substrate 12 in which the unit regions 11 are arranged as shown in FIG. 22, it is suitable for efficiently treating the mother substrate 12 to allow the longitudinal direction L of the mother substrate 12 to be parallel to the sweeping direction X of the liquid discharge head 22, as shown in FIG. 22(*a*). On the other hand, in the case of another mother substrate 12' in which different types of unit regions 11' are arranged as shown in FIG. 23 or in which the unit regions 11 are arranged in a manner different from the manner shown in FIG. 22, it may be suitable for efficiently treating the mother substrate 12' to allow the longitudinal direction L of the mother substrate 12' to be parallel to the shifting direction Y, as shown in FIG. 23(*a*).

Figure 23A:
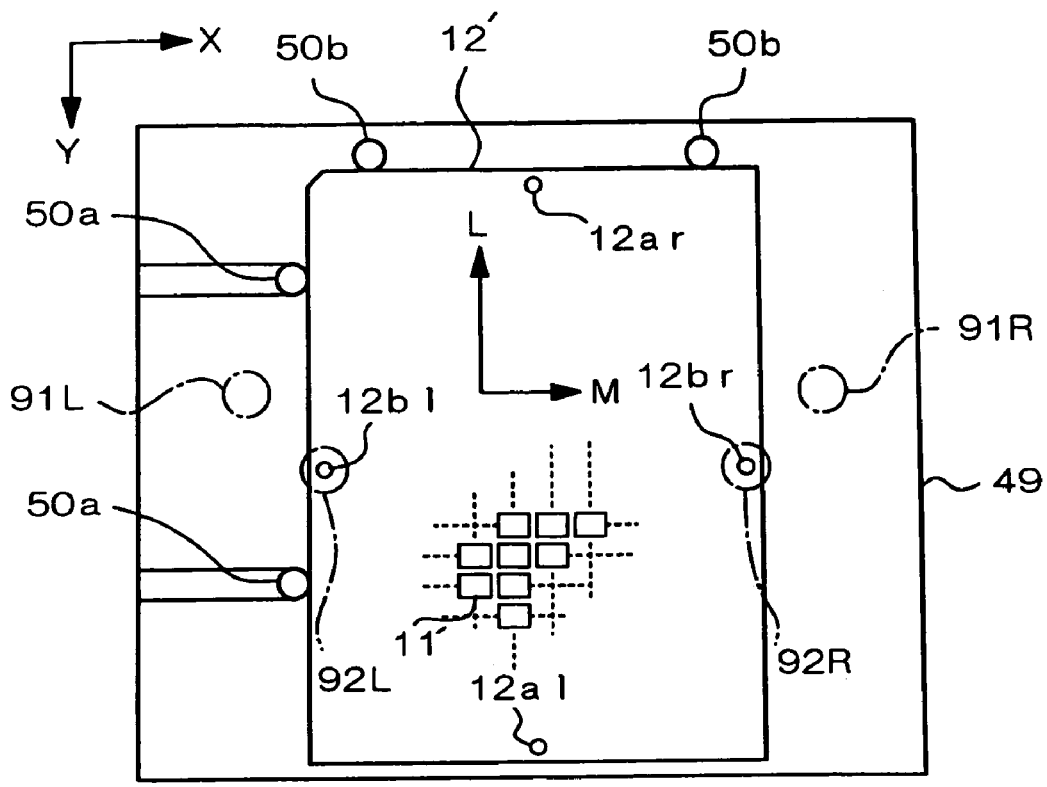
FIG. 23 is plan views (a) and (b) showing other postures of a mother substrate on a table of a liquid discharge device.
Figure 23B:
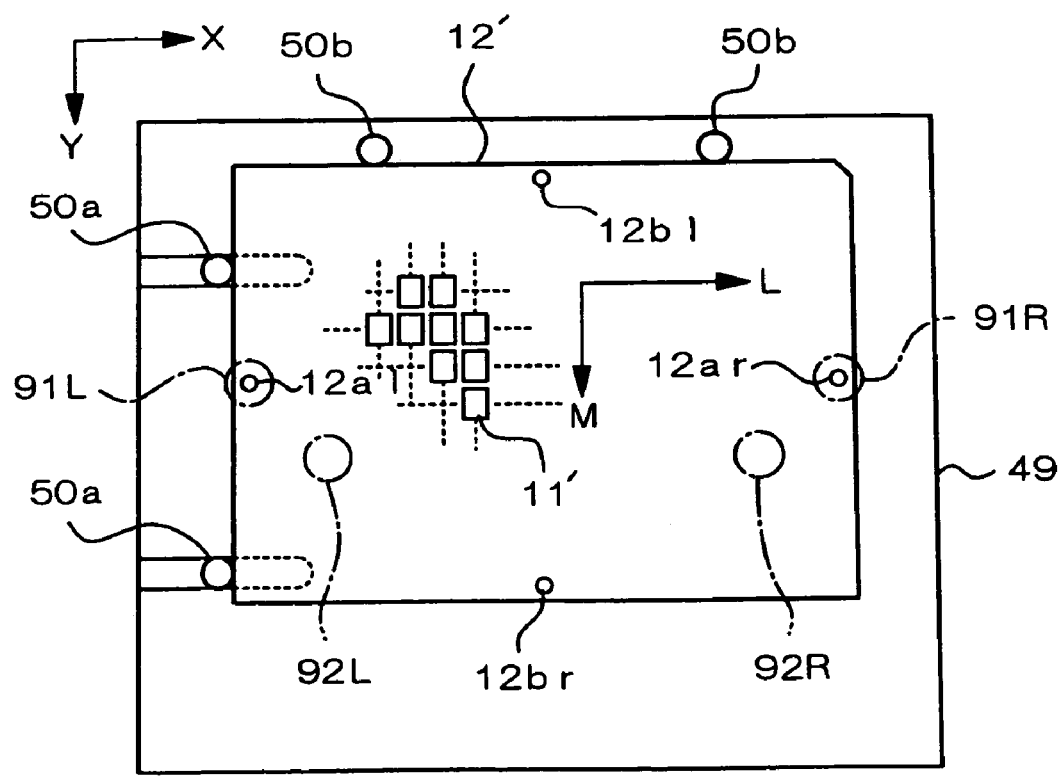

Since the liquid discharge device 16 can treat the mother substrate 12 regardless of the horizontal posture in which the mother substrate 12 is placed in either of the two different directions as shown in FIGS. 22 and 23 (perpendicular to each other in the drawings), the mother substrate 12 can be placed on the table 49 in a horizontal posture according to the ink-landing-position arrangement. As a result, the liquid discharge device 16 can efficiently treat a discharge object, or the mother substrate 12, according to the posture of the object.

In the present embodiment, the substrate feeding device 23 is used for placing the mother substrate 12 on the table 49. In order to place the mother substrate 12 so as to orient in either direction of the two different directions as shown in FIGS. 22 and 23, the feeding posture of the substrate feeding device 23 may be changed. Alternatively, a mechanism for rotating the table 49 may be used to rotate it, for example, 90°, and whether the horizontal orientation of the mother substrate 12 is changed is selected after the mother substrate 12 is placed on the table 49.

Figure 13:
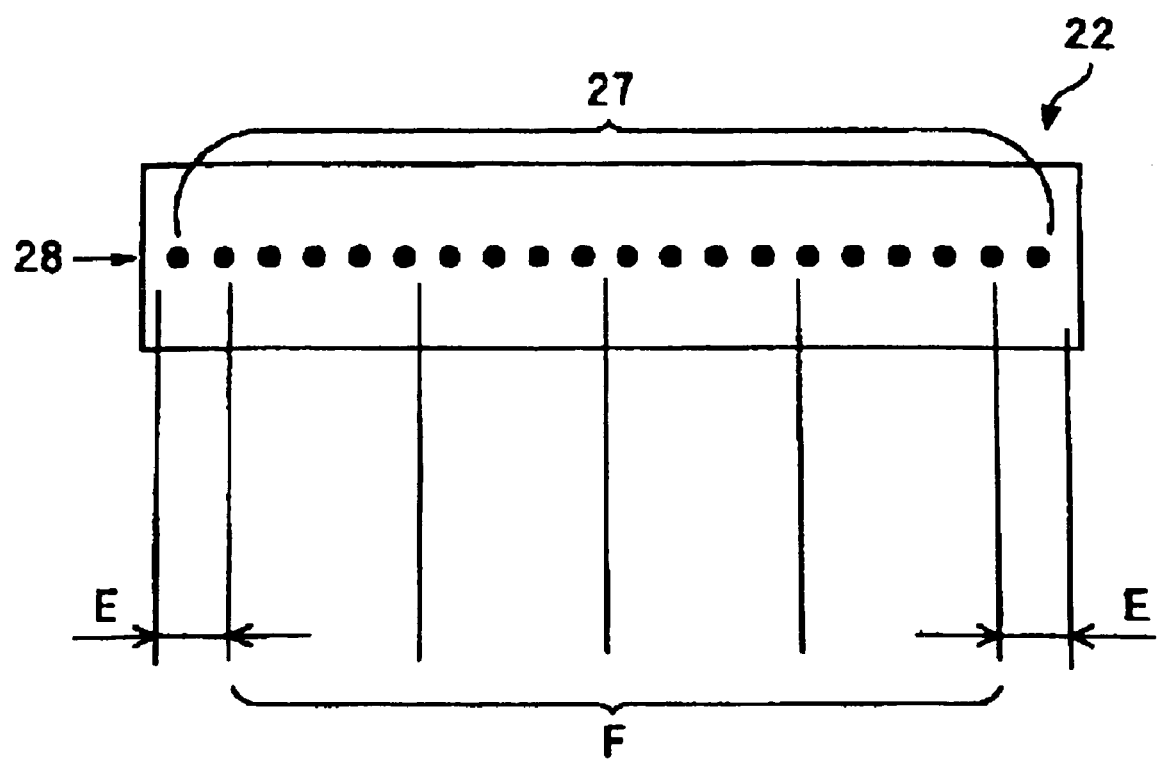
FIG. 13 is a plan view of an ink jet according to a modification.
Figure 56:
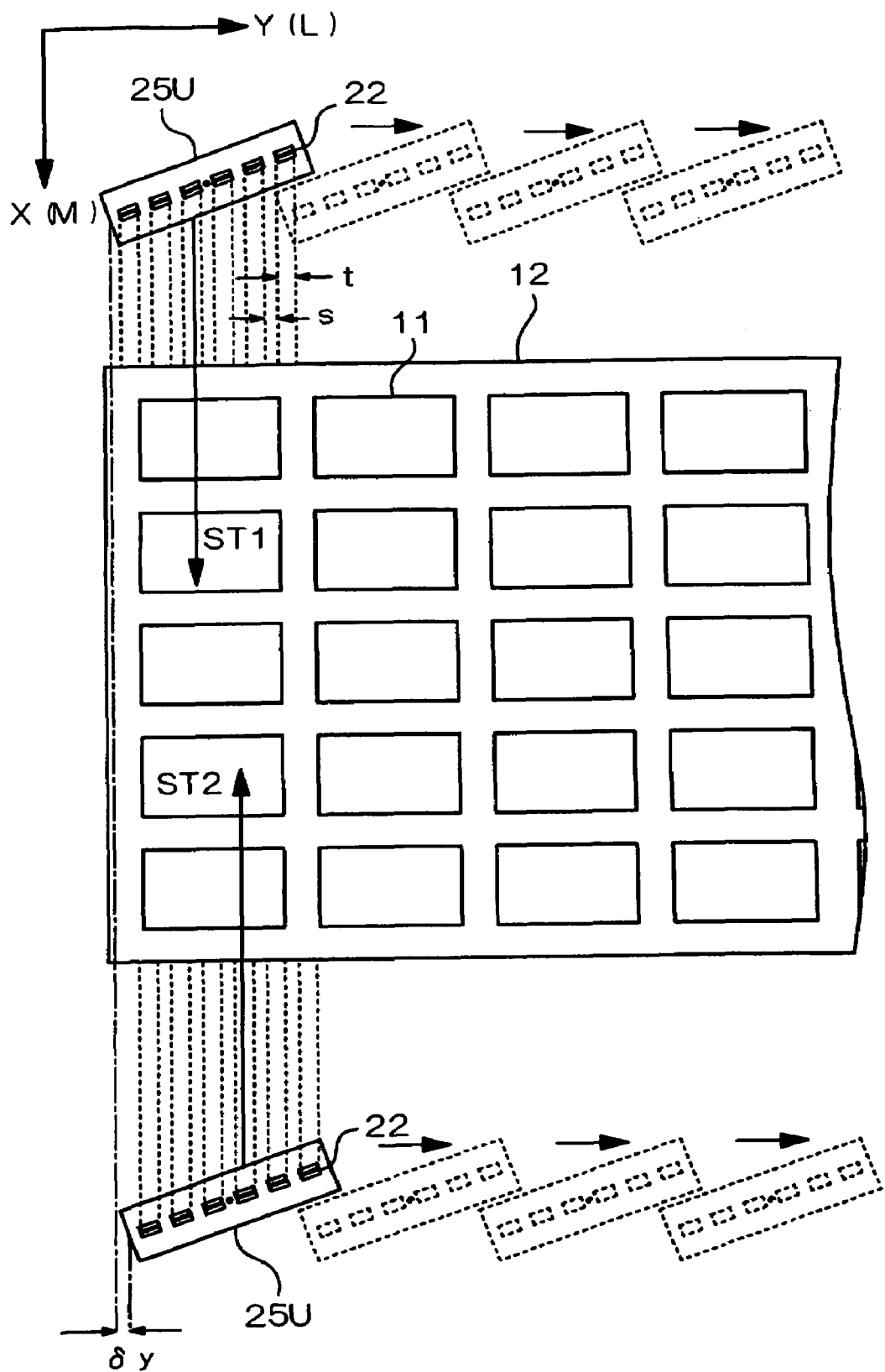
FIG. 56 is a schematic illustration of a technique using a liquid discharge unit.

It has been described in association with FIG. 56 that the amount of ink droplets discharged from the nozzles 27 constituting the nozzle line 28 of the liquid discharge head 22 is liable to vary, and, for example, that some nozzles 27 at both ends of the nozzle line 28 (for example, 10 nozzles at each end) particularly discharge a large amount of ink. It is not preferable to use the nozzles 27 discharging ink in an amount larger than that of the other nozzles 27 because it results in films having nonuniform thicknesses. It is preferable to set some, for example, ten nozzles or so, of the nozzles 27 constituting the nozzle line 28, at both ends E of the nozzle line 28 so as not to discharge ink and to use the other nozzles in the other region F, as shown in FIG. 13.

Also, in order to reduce the nonuniformity of film thickness, each film is formed of a plurality of droplets from the liquid discharge head 22, but not only one droplet, in a predetermined region. Specifically, in the case of depositing films in a plurality of regions, even if with a certain variety in the amount of each of droplets by forming the films of a plurality of droplets, the nonuniformity of the film thickness in each region can be reduced.

Figure 11:
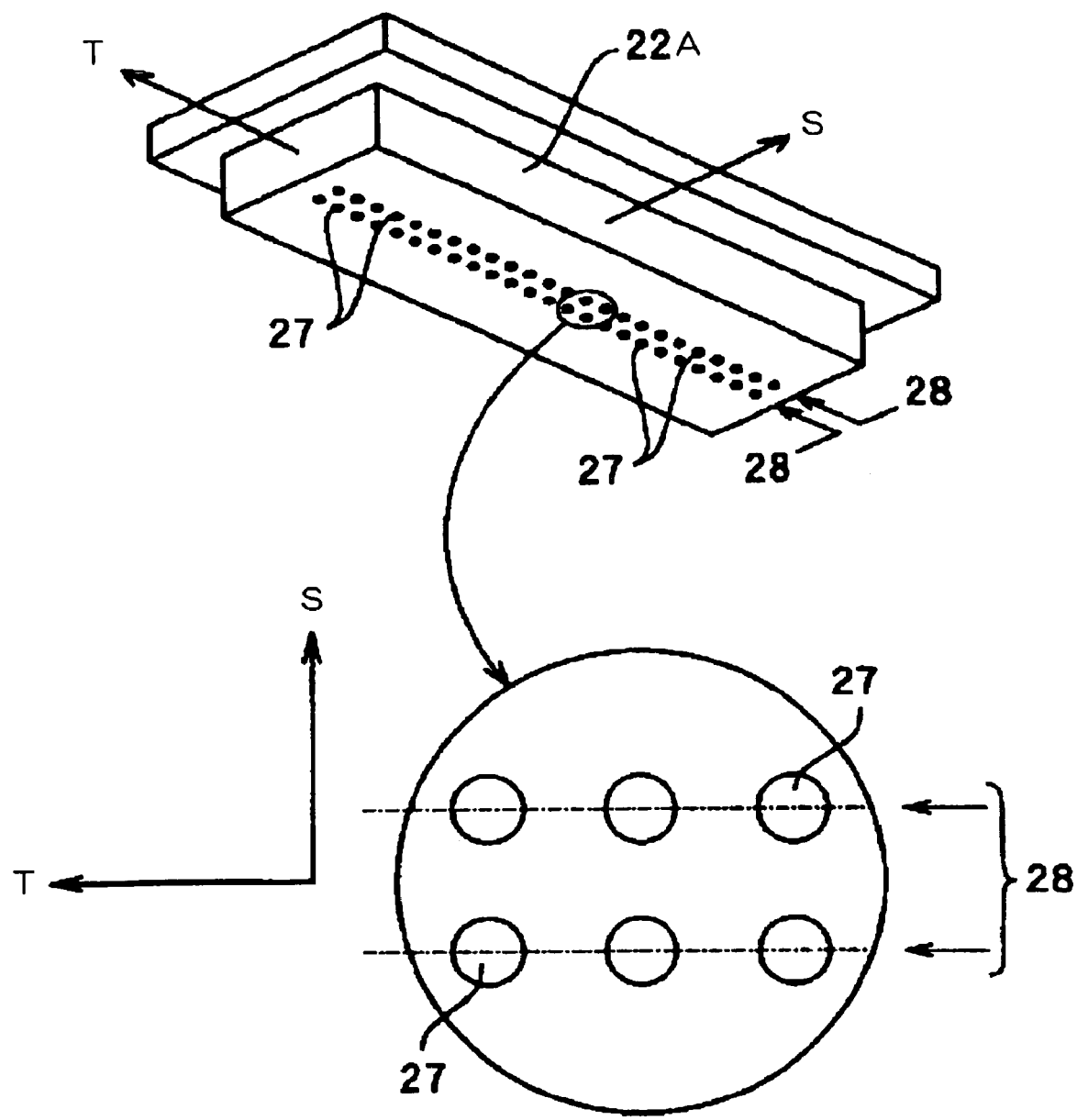
FIG. 11 is a perspective view of an ink jet head according to a modification.
Figure 16:
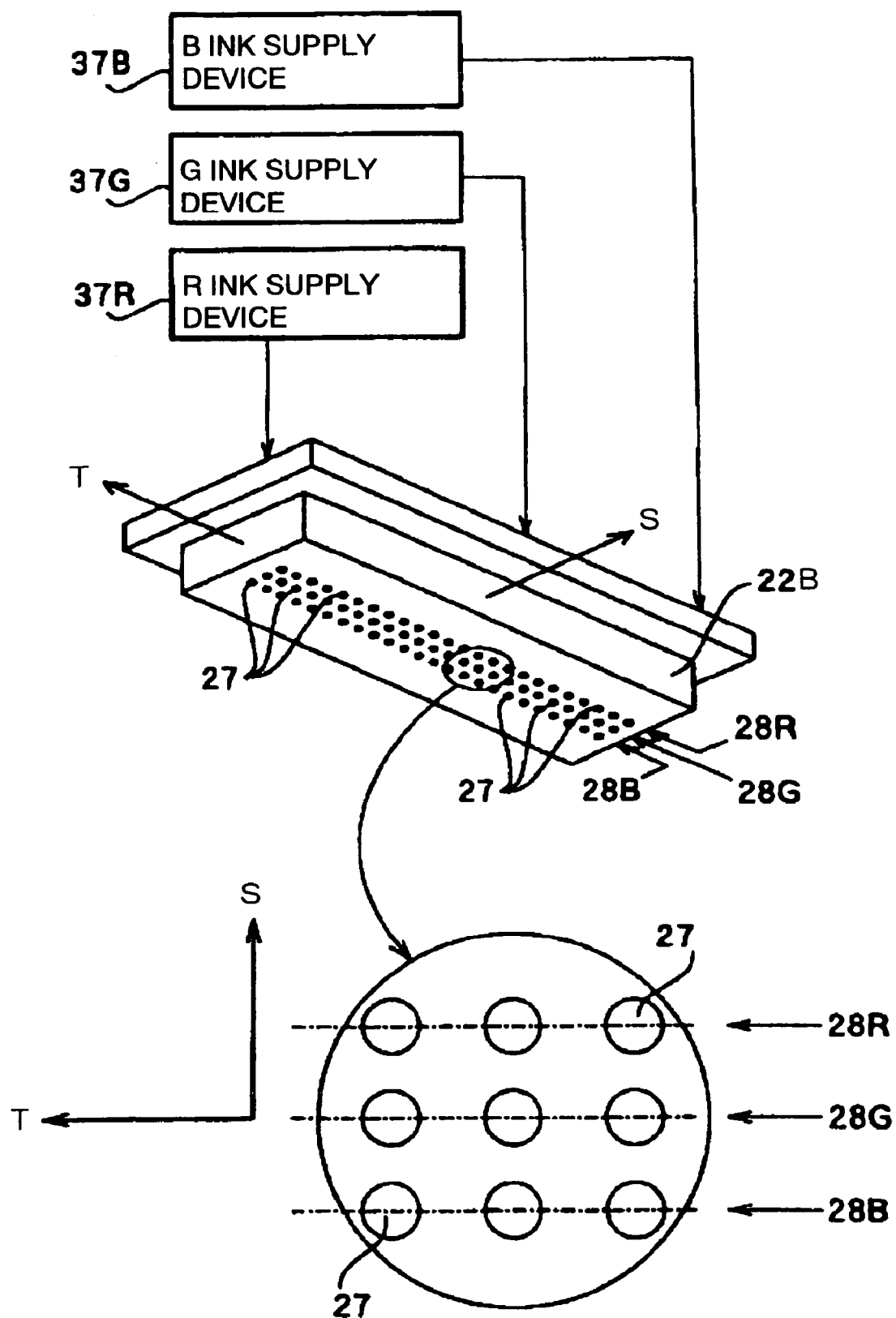
FIG. 16 is a perspective view of an ink jet according to another modification.

The structure of the liquid discharge head 22 is not limited to the one described above, but various structures may be applied. For Example, a liquid discharge head 22A shown in FIG. 11 has two nozzle lines 28 disposed in the standard direction S. Each of these nozzle lines 28 includes a plurality of nozzles 27, as in above. Another liquid discharge head 22B shown in FIG. 16 has three nozzle lines 28R, 28G, and 28B disposed in the standard direction S. In each of the liquid discharge heads 22A and 22B, the liquid material discharged from the nozzles 27 in the nozzle lines 28 may be the same or different between the lines. For example, in the liquid discharge head 22A shown in FIG. 11, the nozzles 27 in both nozzle lines 28 discharge the same ink. In the liquid discharge head 22B shown in FIG. 16, the material of ink discharged from the nozzles 27 is different between the nozzle lines 28R, 28G, and 28B such that, for example, filter element materials 13R, 13G, and 13B are discharged, as described later.

[Color Filter and Method for Manufacturing the Same]

An embodiment of a method for manufacturing a color filter will now be described. This embodiment illustrates a method in which the above-described liquid discharge device 16 is used for forming the color filter, but the method is not limited by the device used.

Figure 5A:
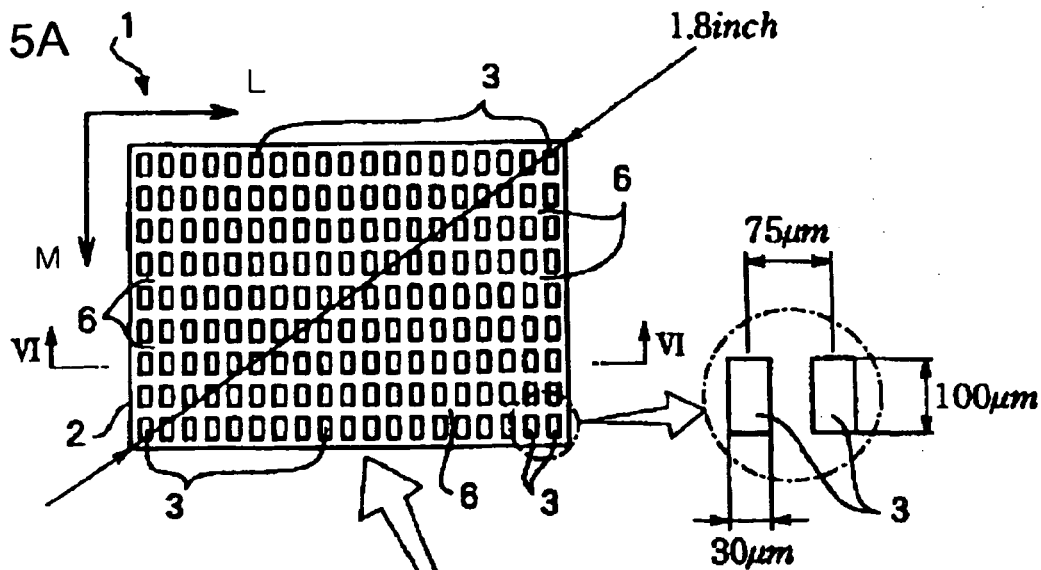
FIG. 5 is a plan view of a color filter and a mother substrate of the color filter according to an embodiment of the present invention.

FIG. 5(a) schematically shows the plan structure of an exemplary color filter. FIG. 6(d) shows the structure in a sectional view taken along line VI-VI of FIG. 5(a).

The color filter 1 of the present embodiment includes a substrate (base material) 2 formed of glass, resin, or the like and a plurality of filter elements 3 deposited on the surface of the substrate 2, in a dot pattern, which may be a dot matrix as shown in the drawing. The color filter 1 also includes a protective layer 4 deposited on the filter elements 3, as shown in FIG. 6(d). FIG. 5(a) shows the color filter 1 without the protective layer 4 in plan view.

Figure 7A:
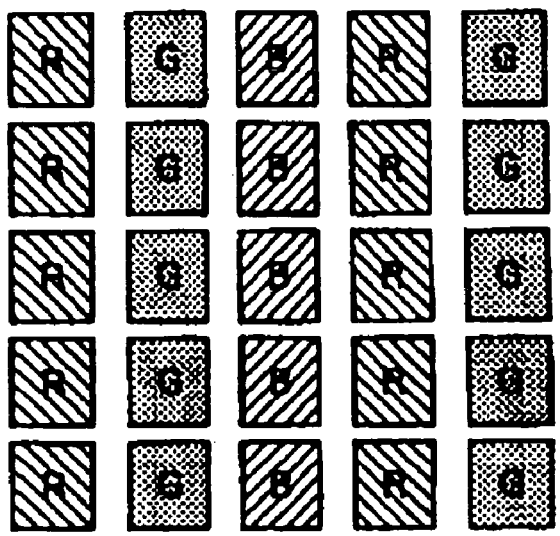
FIG. 7 is an illustration of display dot arrangements of R, G, and B colors.
Figure 7B:
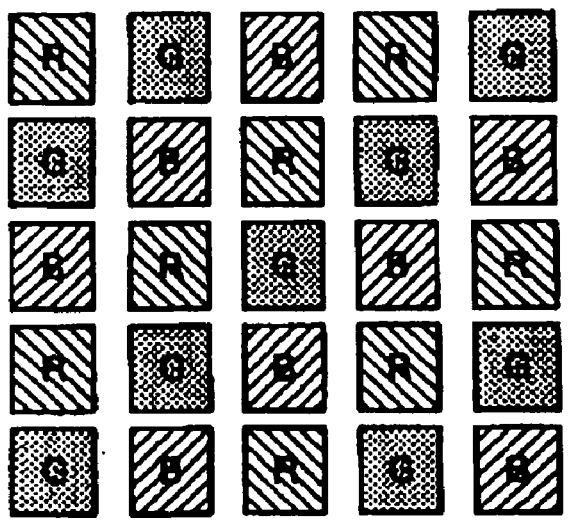
Figure 7C:
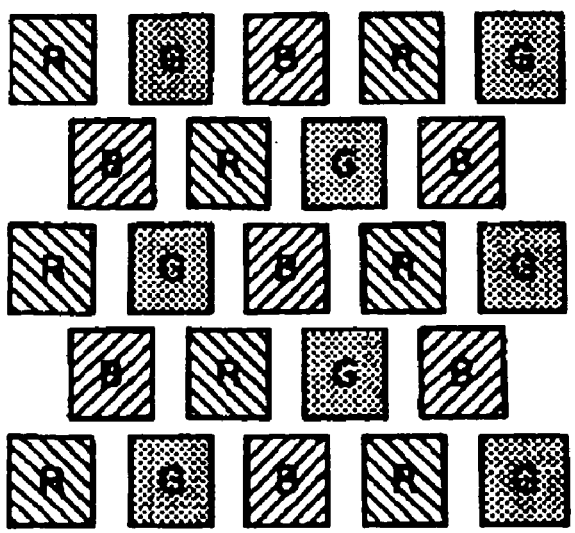

Barrier walls 6 are formed of a light-shielding resin in a grid pattern on the substrate 2. The regions partitioned by the barrier walls 6 are filled with a color material to form filter elements 3. The filter elements 3 are each formed of one of the color materials of R (red), G (green), and B (blue), and the resulting filter elements 3 each having one of the colors are arrayed in a predetermined arrangement. Exemplary arrangements include striped arrangement (in which all the filter elements in a column in the matrix have the same color) shown in FIG. 7(a), mosaic arrangement (in which any series of three filter elements 3 aligned in a column or a row includes R, G, and B colors) shown in FIG. 7(b), and delta arrangement (in which the filter elements 3 are arrayed so as to be staggered one another and any unit consisting of three adjacent filter elements includes R, G, and B colors) shown in FIG. 7(c). The "barrier walls" in the present invention include "banks", referring to protrusions from the substrate, and the side faces thereof may be substantially perpendicular to the substrate or sloped.

The color filter 1 has a size of, for example, about 4.57 cm (1.8 inches). The filter elements 3 each have dimensions of 30 μm×100 μm. The interval between adjacent filter elements 3, that is, the filter element pitch, is, for example, 75 μm.

When the color filter 1 of the present invention is used as an optical element for displaying color images (full color images), three filter elements of R, G, and B colors constitute a unit acting as a pixel. Color images are displayed by selectively passing light through one of the R, G, and B filter elements in a pixel or a combination of the filter elements. In this instance, the barrier walls 6 formed of a light-shielding resin serve as a black matrix.

Figure 5B:
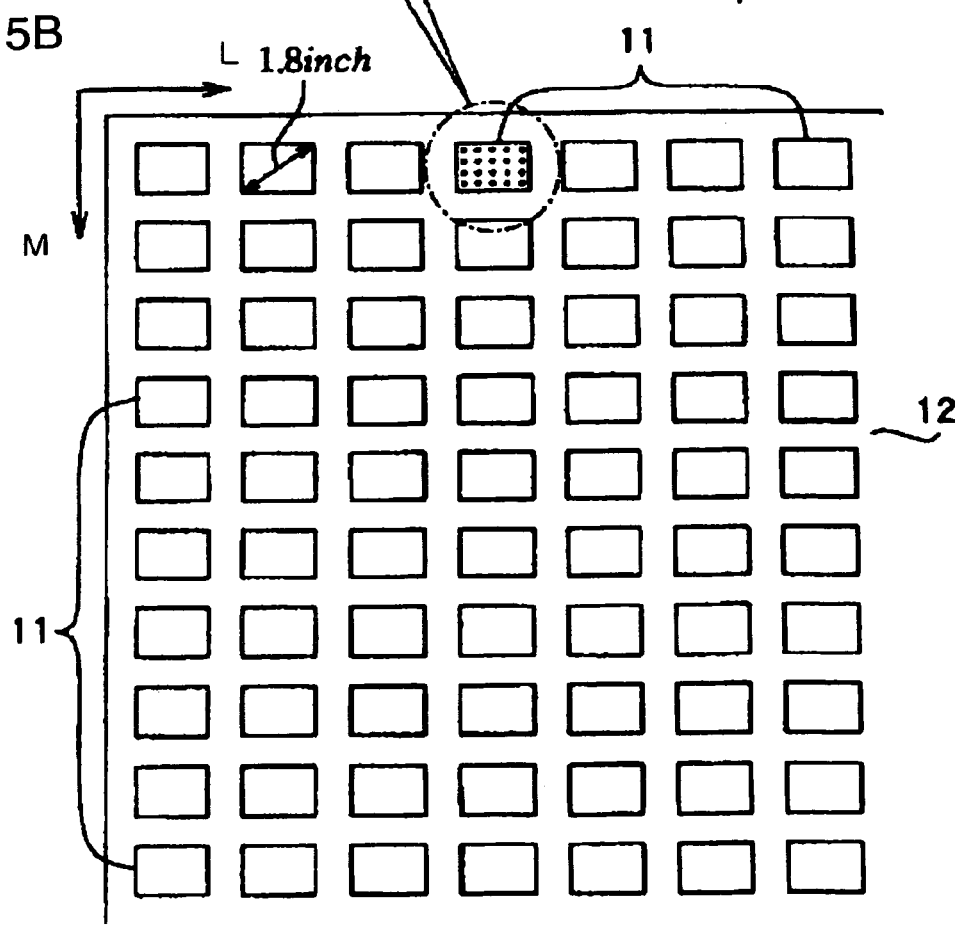

The color filter 1 is cut off from the substrate, that is, the mother substrate 12 having a large area as shown in FIG. 5(b). Specifically, a color filter pattern is formed in each of a plurality of color-filter-forming regions (unit regions) 11 defined in the mother substrate 12. Grooves for cutting into pieces are formed in the surroundings of the color-filter-forming regions 11. The mother substrate 12 is divided (cut) into pieces to form the color filters 1, one of which is shown in FIG. 5(a), by applying a stress to the grooves or other methods.

A method for manufacturing the color filter 1 will now be described in detail. FIG. 6 schematically shows a procedure of manufacturing the color filter 1 step by step. First, the barrier walls 6 are formed of a light-shielding resin in a grid pattern viewed in the direction of arrow B, on the mother substrate 12. The hollows 7 of the grid pattern define regions where the filter elements 3 are formed, that is, filter-element-forming regions. The plan dimension of each filter-element-region 7 separated by the barrier walls 6 is, for example, 30 μm×100 μm, when viewed in the direction of arrow B.

The barrier walls 6 serve to stop the flow of a liquid filter element material 13 and as a black matrix. Also, the barrier walls 6 are formed by an arbitrary patterning technique, such as photolithography, and may further be heated with a heater if necessary.

Figure 6A:
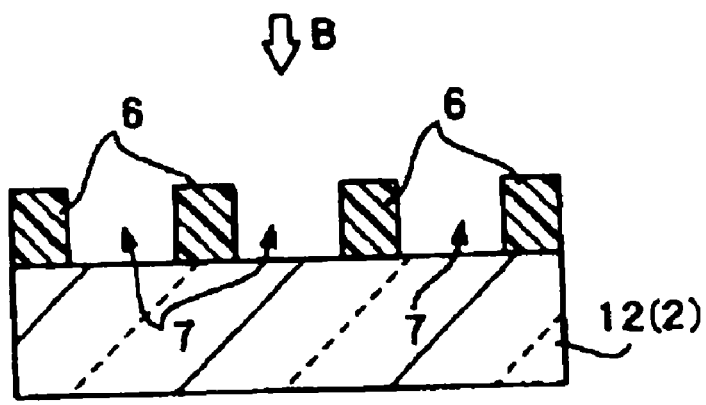
FIG. 6 is a schematic sectional view showing steps of a method for manufacturing the color filter, taken along line VI-VI in FIG. 5(a).
Figure 6B:
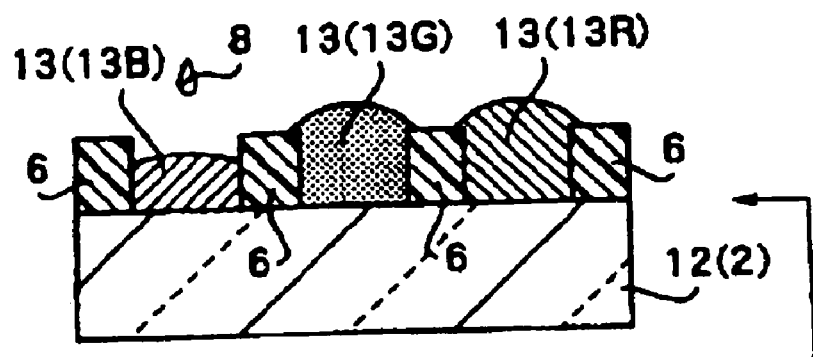

After the formation of the barrier walls 6, the droplets 8 of the filter element material 13 are supplied to the filter-element-forming regions 7 as shown in FIG. 6(b). Thus, the filter-element-regions 7 are filled with the filter element material 13. This process is performed by, for example, discharging the droplets 8 of the ink (filter element material 13) from the liquid discharge head 22 of the above-described liquid discharge device 16 to deposit the droplets 8 in the filter-element-forming regions 7. Reference numerals 13R, 13G, and 13B in FIG. 6(b) represent filter element materials having R (red), G (green), and B (blue) colors, respectively.

Figure 6C:
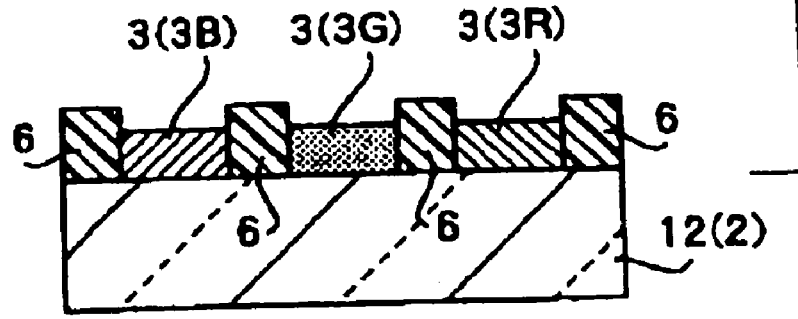
Figure 6D:
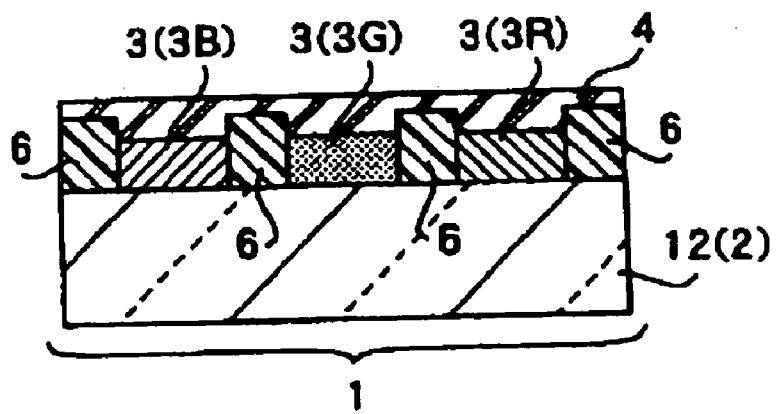

After a predetermined amount of the filter element material 13 fills the filter-element-forming regions 7, the mother substrate 12 is heated to, for example, about 70° C. by a heater to vaporize the solvent of the filter element material 13. This vaporization reduces the volume of the filter element material 13 and, thus, the filter element material 13 become flattened, as shown in FIG. 6(c). If the volume is excessively reduced, the supply of the droplets 8 of the color filter material 13 and the heating of the droplets 8 are repeated until the thickness of filter element material reaches a level satisfactory for the resulting color filter 1. Only the remaining solid constituents of the color filter material 13 result in a film, thus forming the color filter elements 3, each having a desired color.

After the filter elements 3 are formed as above, the color filter elements 3 are subjected to heat treatment at a predetermined temperature for a predetermined time to be completely dried. Then, the protective layer 4 is deposited by a proper method, such as spin coating, roll coating, dipping, or ink jetting. The protective layer 4 is intended to protect the filter elements 3 and flatten the surface of the color filter 1. In the embodiment, the barrier walls 6 are formed of a light-shielding resin to serve to block light (as a black matrix). Alternatively, instead of using a light-transmissive resin, barrier walls 6 may be covered with a light-shielding layer formed of a metal, such as Cr, having a size larger than that of the barrier walls thereunder.

In the present embodiment, as shown in FIG. 6(*b*), the filter element material 13 is used as ink discharged from the above-described liquid discharge device 16, and the droplets 8 of the ink are deposited in the filter-element-forming regions 7 to from the filter element 3. In this instance, if the three types of filter element material 13R, 13G, and 13*b* are discharged together while the liquid discharge head 22 is swept in an identical sweeping direction X with respect to the mother substrate 12, unevenness occurs in a striped manner in the sweeping direction X due to the variation of the discharge rate between the nozzles 27 of the liquid discharge head 22, as described above, and changes of the discharge rate of the nozzles 27 with time.

In the present embodiment, accordingly, any one of the three types of filter element material 13R, 13G, and 13B is discharged while the liquid discharge head 22 is swept in a different direction from that for the other types of filter element materials. For example, two of the above-described three color materials (for example, 13R and 13G) are discharged while the liquid discharge head 22 is swept in a sweeping direction X parallel to the longitudinal direction L of the mother substrate 12, as shown in FIG. 22(*a*); and the other color material (for example, 13B) is discharged while the liquid discharge head 22 is swept in a different sweeping direction X perpendicular to the longitudinal direction L of the mother substrate 12 (that is, the shifting direction Y is parallel to the longitudinal direction L of the mother substrate 12), as shown in FIG. 22(*b*). Alternatively, two of the above-described three color materials (for example, 13R and 13G) may be discharged while the liquid discharge head 22 is swept in a sweeping direction X perpendicular to the longitudinal direction L of the mother substrate 12, (that is, the shifting direction Y is parallel to the longitudinal direction L of the mother substrate 12) as shown in FIG. 23(*a*); and the other color material (for example, 13B) is discharged while the liquid discharge head 22 is swept in a different sweeping direction X parallel to the longitudinal direction L of the mother substrate 12, as shown in FIG. 23(*b*).

Thus, the sweeping direction for discharge of one of the three types of filter element material 13R, 13G, and 13B differs from (and becomes perpendicular to) the sweeping direction for the others, with respect to the mother substrate 12. As a result, the striped color shading of one color material occurs in a direction different from that of the other color materials and, thus, the color shading of the color filter 1 becomes inconspicuous on the whole, effectively decreasing.

FIGS. 1 to 4 are schematic illustrations showing procedures for discharging the above-described filter element materials 13R, 13G, and 13B onto the mother substrate 12 from the nozzles 27 of the liquid discharge head 22. FIG. 24 is a schematic illustration of the structure of a manufacturing apparatus for performing the procedures.

(Variation 1)

The apparatus for manufacturing color filters shown in FIG. 24 includes first, second, and third sections 16R, 16G, and 16B, each including substantially the same liquid discharge device 16. Only the first section 16R includes a substrate holder 57 but the second and third sections 16G and 16B do not. Preliminary dryers 96 each having a hot plate are disposed for preliminarily drying inks (filter element materials) discharged and deposited on the mother substrate 12, between the first and second sections 16R and 16G, between the second and third sections 16G and 16B, and downstream of the third section 16B. Also, a substrate carrier 58 for carrying the mother substrate 12 to the corresponding section and another substrate carrier 95 for carrying the mother substrate from the upstream liquid discharge device to the following preliminary dryer 96 are disposed corresponding to each of the sections. Furthermore, a substrate exporter 97 is disposed for carrying the mother substrate 12 from the preliminary dryer 96 located downstream of the third section 16B to another substrate holder 98.

In this manufacturing apparatus, the first section 16R discharges the R (red) filter element material 13R onto the mother substrate 12, and subsequently the corresponding preliminary dryer 96 dries the filter element material 13R. Then, the second section 16G discharges the G (green) filter element material 13G onto the mother substrate 12, and the corresponding preliminary dryer 96 dries the filter element material 13G. Furthermore, the third section 16B discharges the B (blue) filter element material 13B onto the mother substrate 12, and the corresponding preliminary dryer 96 dries the filter element material 13B. The resulting filter elements 3R, 3G, and 3B are finally stored in the substrate holder 98.

(Details of Variation 1)

FIG. 1 shows a concrete example of the manufacturing process performed to the mother substrate 12 by the above-described sections 16R, 16G, and 16B of the manufacturing apparatus. In FIG. 1, the position of the liquid discharge head 22 is illustrated as if displaced in the sweeping direction when the liquid discharge head 22 is shifted in the shifting direction, for the sake of illustration convenience. However, this does not necessarily mean that the starting point of sweeping is changed from one series of sweeping to another.

The filter-element-forming regions 7 are arranged in a dot matrix manner in each color-filter-forming region (unit region) 11 of the mother substrate 12. The longitudinal direction L and width direction M of the mother substrate are set as shown in FIG. 12. One or two color materials (for example, 13R or 13R and 13G) of the filter element materials 13R, 13G, and 13B are continuously discharged to serve as ink from the liquid discharge head 22 which is simultaneously swept in the longitudinal direction L from the external position (initial position) of one end of the mother substrate 12 in the longitudinal direction L (the left end in the drawing), so that the droplets of the ink land in the filter-element-forming regions aligning in the longitudinal direction L. When the liquid discharge head 22 reaches the other end (the right end, but not shown, in the drawing) of the mother substrate 12, it is shifted a predetermined distance in the width direction M, and subsequently returns to the external position of the former end. The liquid discharge head 22 again discharges droplets while being swept in the longitudinal direction L.

On the other hand, the other two or one color material (for example, 13G and 13B or 13B) of the filter element materials 13R, 13G, and 13B is discharged onto the mother substrate 12 while the liquid discharge head 22 is swept in the width direction M from the external position of at one end of the mother substrate 12 as the initial position of the liquid discharge head 22 in the width direction M. When one series of sweeping of the liquid discharge head 22 is completed, the liquid discharge head 22 is shifted a predetermined distance in the longitudinal direction L, and is subsequently moved in the opposite direction to return to the external position at the end in the width direction M of the mother substrate 12. This operation is repeated. Thus, at least one color material of the three filter element materials 13R, 13G, and 13B is discharged in a sweeping direction different from (perpendicular to) the sweeping direction for the other color materials.

(Modification of Variation 1)

FIG. 2 shows another manufacturing process performed by the sections 16R, 16G, and 16B of the manufacturing apparatus, according to a modification of Variation 1. As in above, one or two color materials of the filter element materials 13R, 13G, and 13B are discharged in a scanning direction of the liquid discharge head 22 parallel to the above-described longitudinal direction L, and the other color material(s) is discharged in a different sweeping direction of the liquid discharge head 22 parallel to the above-described width direction M.

This example is, however, different from the method shown in FIG. 1 in that after one series of the sweeping in which the liquid discharge head 22 sweeps in the longitudinal direction L or the width direction M from the external position at one end of the mother substrate 12 to the other end is completed, and the shifting operation is made at the external position of the other end of the mother substrate 12, the liquid discharge head 22 reverses the sweeping direction (the longitudinal direction L or width direction M) at the external position of the other end of the mother substrate 12, thus discharging droplets. By repeating this operation, the liquid discharge head 22 can sweep on the mother substrate 12 in two directions opposite to each other, consequently not needing returning operation. Thus, more efficient manufacturing can be performed.

In general, the pitches of the filter-element-forming regions (unit regions) 11 of the mother substrate 12 in the longitudinal direction L and the width direction L may be different from each other, in the embodiment shown FIGS. 1 and 2. In such a case, the angles φ1 and φ2 between the standard direction S and scanning direction X (parallel to the longitudinal direction L or width direction M in the drawings) of the liquid discharge head 22 may be changed between the sweeping operation with the same liquid discharge head 22 in the longitudinal direction L and the width direction M, as shown in FIGS. 1 and 2.

(Modification of Variation 1)

Figure 3:
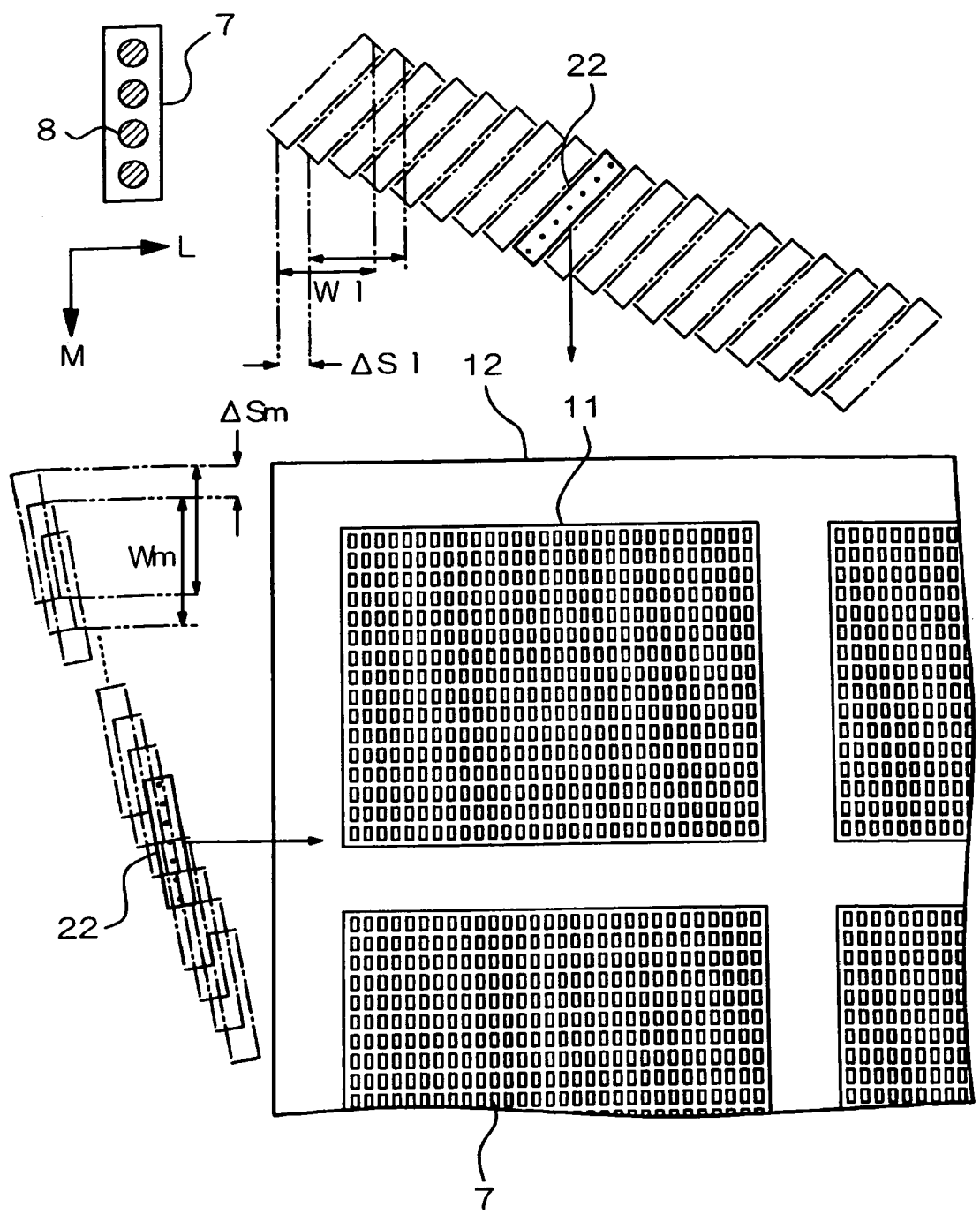
FIG. 3 is a schematic plan view of a major step of a method for manufacturing a color filter according to still another embodiment of the present invention.

FIG. 3 is a schematic illustration showing a sweeping manner of the liquid discharge head 22 different from that described above. In FIG. 3, the position of the liquid discharge head 22 is illustrated as if displaced in the sweeping direction when the liquid discharge head 22 is shifted in the shifting direction, for the sake of illustration convenience. However, this does not necessarily mean that the starting point of sweeping is changed from one series of sweeping to another. In this example, the liquid discharge head 22 discharges droplets 8 of ink (filter element material) such that N droplets 8 (4 drops in the drawing) land in each filter-element-forming region 7 to form the corresponding filter element 3. The amount of a droplet 8 discharged from the liquid discharge head 22 and the volume of the filter elements 3 are set in advance.

In this instance, when the sweeping direction X of the liquid discharge head 22 is parallel to the width direction M, the distance $\Delta S1$ at which the liquid discharge head 22 is shifted during the interval between the series of sweeping is set to be $\Delta S1 = W1/N$ (W1/4 in the drawing), with respect to the width W1 of the nozzle line 28 of the liquid discharge head 22. On the other hand, when the sweeping direction X of the liquid discharge head 22 is parallel to the longitudinal direction L, the distance $\Delta Sm$ at which the liquid discharge head 22 is shifted during the interval between the series of sweeping is set to be $\Delta Sm = Wm/N$ (Wm/4 in the drawing), with respect to the width Wm of the nozzle line 28 of the liquid discharge head 22. Thus, the amount of the filter element material discharged in each filter-element-forming region 7 is 1/N (1/4 in the drawing) of the entirety of a desired quantity during a series of sweeping. However, the droplet 8 is discharged N times (4 times in the drawing) in the filter-element-forming region 7 and, thus, the entire quantity of the filter element material fills the filter-element-forming region 7.

In this modification, the liquid discharge head 22 may be swept over the mother substrate 12 to discharge droplets 8 in both directions even in a reciprocating manner as in the case shown in FIG. 2.

(Variation 2)

In the Variation 1 described above, as shown in FIG. 24, the plurality of liquid discharge heads 16R, 16G, and 16B are used for the plurality of filter element materials 13R, 13G, and 13B, respectively, and the sweeping direction of at least one liquid discharge head (ink jet head) 22 is set different from that of the other heads by changing the posture of the mother substrate 12 fed. However, the method of the present invention is not limited to the method above, but a plurality of filter element materials may be discharged one by one from only one liquid discharge device. Specifically, the relative orientation between the mother substrate 12 and the sweeping direction of the liquid discharge head 22 is changed in one liquid discharge device, during the discharging process. The sweeping direction of the liquid discharge head may be changed during the discharging process to change the relative orientation. In this case, for example, the liquid discharge head (ink jet head) 22 can sweep not only the sweeping direction X shown in FIG. 9 but also in the shifting direction Y. Alternatively, the horizontal orientation of the mother substrate 12 may be changed during the discharging process to change the relative orientation. Both techniques may be applied in the present invention, and the latter will now be illustrated in detail with reference to FIG. 25.

FIG. 25 shows a state in which the mother substrate 12 is placed on the table 49 of the liquid discharge device 16 shown in FIGS. 8 and 9. In this embodiment, the orientations of the mother substrate 12 in which the longitudinal direction L of the mother substrate 12 is parallel to the sweeping direction X (shown in (a) and (b) of FIG. 25) and in which the width direction M of the mother substrate 12 is parallel to the sweeping direction X (shown in (c) of FIG. 25) are switched by rotating the table 49. Thus, the sweeping direction X of the liquid discharge head 22 is relatively rotated 90° with respect to the mother substrate 12.

Figure 25A:
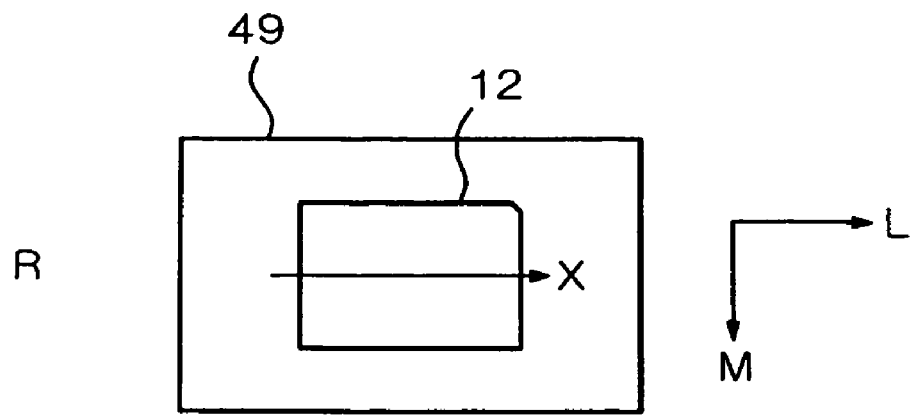
FIG. 25 is schematic plan views (a) to (c) showing a manner of changing orientations of a mother substrate during operation of a liquid discharge device.

For example, the substrate feeding device 23 shown in FIG. 8 feeds the mother substrate 12 onto the table 49, first. In this instance, the mother substrate 12 is placed on the table 49 such that the longitudinal direction L of the mother substrate 12 becomes parallel to the sweeping direction X of the liquid discharge head 22, as shown in FIG. 25(a). Then, while being swept in the sweeping direction X, the liquid discharge head 22 discharges the filter element material 13R from the nozzles 27 thereof. By repeating the sweeping operation and the shifting operation, as in above, all the necessary filter-element-forming regions 7 are filled with the filter element material 13R to form the filter elements 3R.

Figure 25B:
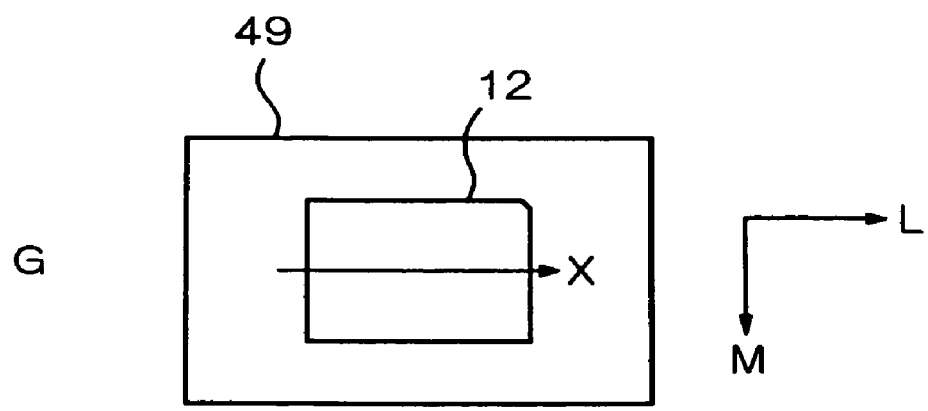

Next, the liquid discharge head 22 discharges another filter element material 13G in the same posture, in the same manner as above, as shown in FIG. 25(b). By repeating the sweeping operation and the shifting operation, as in above, all the necessary filter-element-forming regions 7 are filled with the filter element material 13G to form the filter elements 3G.

Figure 25C:
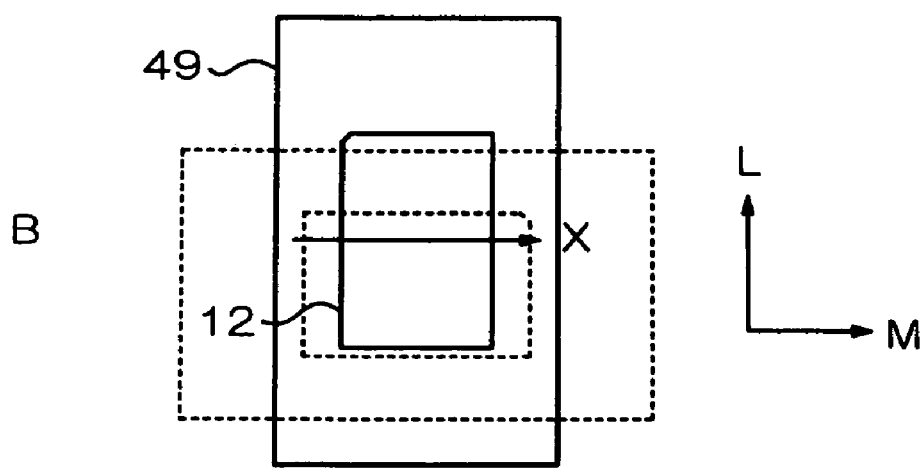

Then, the table 49 is rotated 90°, as shown in FIG. 25(c). Thus, the mother substrate 12 on the table 49 is held in a horizontal orientation in which the width direction M thereof is parallel to the sweeping direction X of the liquid discharge head 22. Subsequently, the liquid discharge head 22 discharges the other filter element material 13B as in above. By repeating the sweeping operation and the shifting operation, as in above, all the necessary filter-element-forming regions 7 are filled with the filter element material 3B to form the filter elements 3B.

If a liquid discharge head discharging a single type of filter element material, as in the above-described liquid discharge head 22, is used, three liquid discharge heads may be used, one by one, for discharging the above-described three types of filter element material 13R, 13G, and 13B, to perform the steps shown in (a) to (c) of FIG. 25. On the other hand, the liquid discharge head 22B shown in FIG. 16 can discharge the filter element materials 13R, 13G, and 13B supplied from three ink supply devices 37R, 37G, and 37B respectively, from the nozzles 27 of the three respective nozzle lines 28R, 28G, and 28B. The single liquid discharge head 22B can, therefore, perform the above-described three steps.

Any technique described in Variation 1 with reference to FIGS. 1 to 3 may also be applied to Variation 2.

(Variation 3)

In the technique illustrated with reference to FIG. 3, a plurality of droplets are discharged in each filter-element-forming region 7. In this instance, when at least one of the filter element materials 13R, 13G, and 13B is discharged, some of the plurality of droplets for one filter-element-forming region 7 may be discharged in a sweeping direction, with respect to the mother substrate 12, different from the sweeping direction for the other droplets. Thus, the variation of the quantity of ink filling each filter-element-forming region 7 resulting from discharging a plurality of ink droplets can be reduced. In addition, color shading resulting from the sweeping direction can be reduced.

Figure 26A:
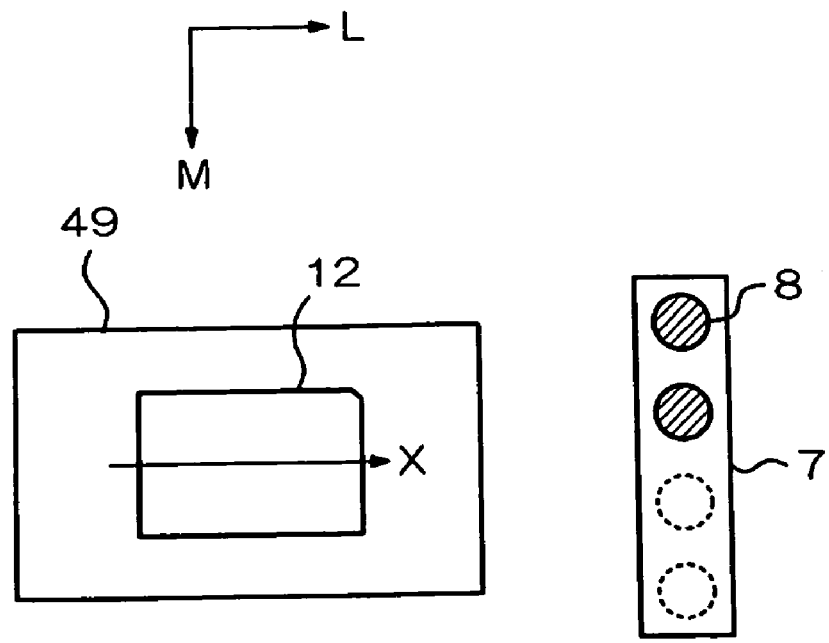
FIG. 26 is schematic plan views (a) and (b) showing another manner of changing orientations of a mother substrate during operation of a liquid discharge device.
Figure 26B:
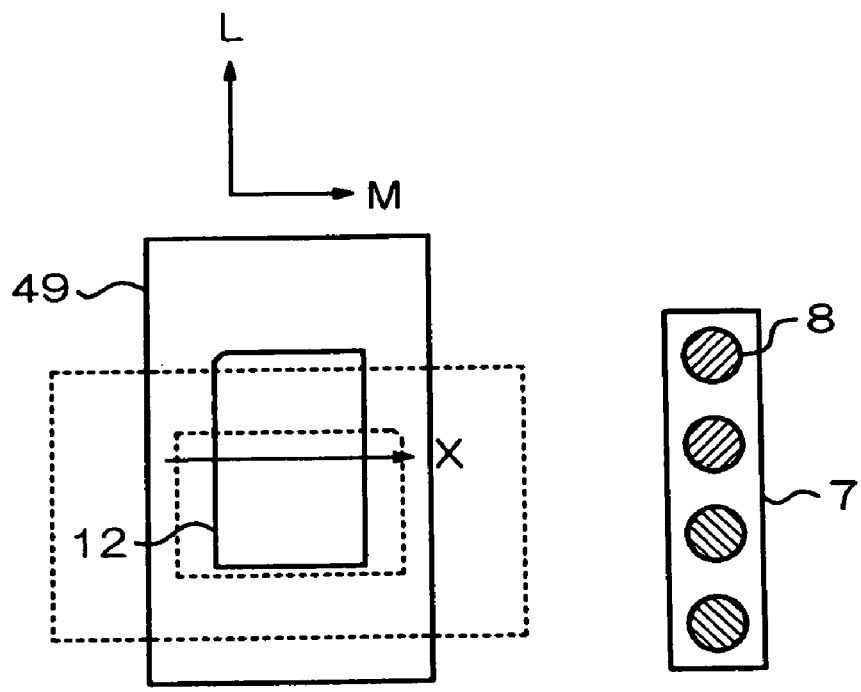

FIG. 26 shows an exemplary process of discharging a plurality of droplets of an identical type of filter element material in each filter-element-forming region 7, as in above. For example, some (two drops in the drawing) of N droplets 8 (4 drops in the drawing) which should be discharged in the filter-element-forming region 7 are discharged while the ink jet head is sweeping over the mother substrate 12 in a horizontal posture in which the longitudinal direction L thereof is parallel to the sweeping direction X, as shown in FIG. 26(a). On the other hand, the other droplets 8 (two drops in the drawing) are discharged while the ink jet head is sweeping over the mother substrate 12 in another horizontal posture in which the width direction M thereof is parallel to the sweeping direction X, as shown in FIG. 26(b).

Thus, some of the droplets 8 which should be placed in each filter-element-forming region 7 are discharged while the liquid discharge head is swept in a sweeping direction different from the sweeping direction for the other droplets. As a result, nonuniformity of the material resulting from the sweeping direction can be reduced, and color shading of the filter elements 3 occurring in a striped manner can also be reduced.

(Details of Variation 3)

Figure 4:
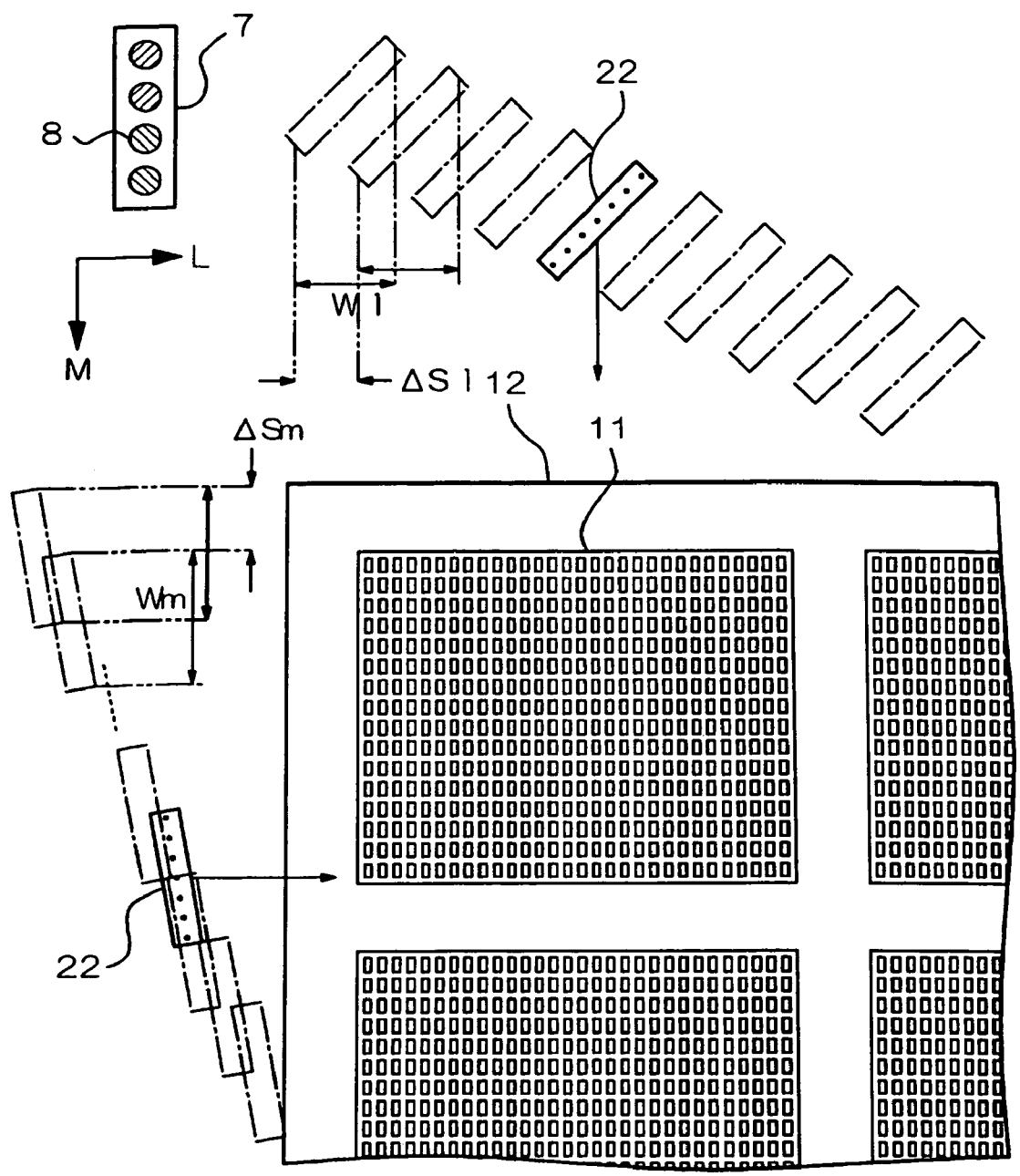
FIG. 4 is a schematic plan view of a major step of a method for manufacturing a color filter according to a further embodiment of the present invention.

A concrete example of Variation 3 will now be illustrated with reference to FIG. 4. In FIG. 4, the position of the liquid discharge head 22 is illustrated as if displaced in the sweeping direction when the liquid discharge head 22 is shifted in the shifting direction, for the sake of illustration convenience. However, this does not necessarily mean that the starting point of sweeping is changed from one series of sweeping to another. In FIG. 26(a), the distance $\Delta Sm$ at which the liquid discharge head 22 is shifted is set to be $\Delta Sm=Wm/I$ (Wm/2 in the drawing), with respect to the width component Wm of the liquid discharge head 22 in the width direction M. Then, the sweeping operation in the sweeping direction X (=the longitudinal direction L) and the shifting operation in the shifting direction Y (=the width direction M) are repeated to discharge droplets 8. On the other hand, in FIG. 26(b), the distance $\Delta S1$ at which the liquid discharge head 22 is shifted is set to be $\Delta S1=W1/K$ (W1/2 in the drawing), with respect to the width component W1 of the liquid discharge head 22 in the longitudinal direction L. Then, the sweeping operation in the same sweeping direction X as in above (=the width direction M) and the shifting operation in the shifting direction Y (=the longitudinal direction L) are repeated to discharge droplets 8. In this instance, the number of droplets 8 which should be discharged in each filter-element-forming region 7 is N (4 in the drawing) and is expressed by the equation N=I+K.

In the above-described method for manufacturing a color filter, preferably, only a color phase of a plurality of color phases constituting the color filter, exhibiting the most inconspicuous striped color shading resulting from the sweeping direction is formed while sweeping is performed in a direction different from the sweeping direction for the other color phases. As a result, the resulting color shading is mixed with the other color shadings to reduce the degree of striped color shading on the whole. For example, in the case of using the above-described three colors R, G, and B, the blue filter elements 3B most strongly exhibit striped color shading resulting from the sweeping direction. Therefore, when the blue filter elements 3B are formed, the sweeping direction of the liquid discharge head is preferably set in a direction different from (perpendicular to) the sweeping direction when the other, R (red) and G (green), filter elements 3R and 3G are formed.

The Variations described above are not limited to the manufacturing of a color filter, but they may be applied to the manufacturing of an EL device. In addition, they may be applied to various methods for film deposition and structures of a film forming devoice. In the above-described Variations, the liquid discharge head 22 is repeatedly swept while being shifted in distances equivalent to the discharge width of the liquid discharge head 22. Alternatively, the error variance method may be employed in which the liquid discharge head 22 is repeatedly swept while being shifted in distances smaller than the above-described discharge width, in order to reduce the unevenness of film deposition resulting from the variation of the discharge quantity between the plurality of nozzles of the liquid discharge head 22. Thus, the unevenness of film deposition can further be reduced.

[Display Device (Electro-optic Device) Including a Color Filter and Method for Manufacturing the Same]

Figure 17:
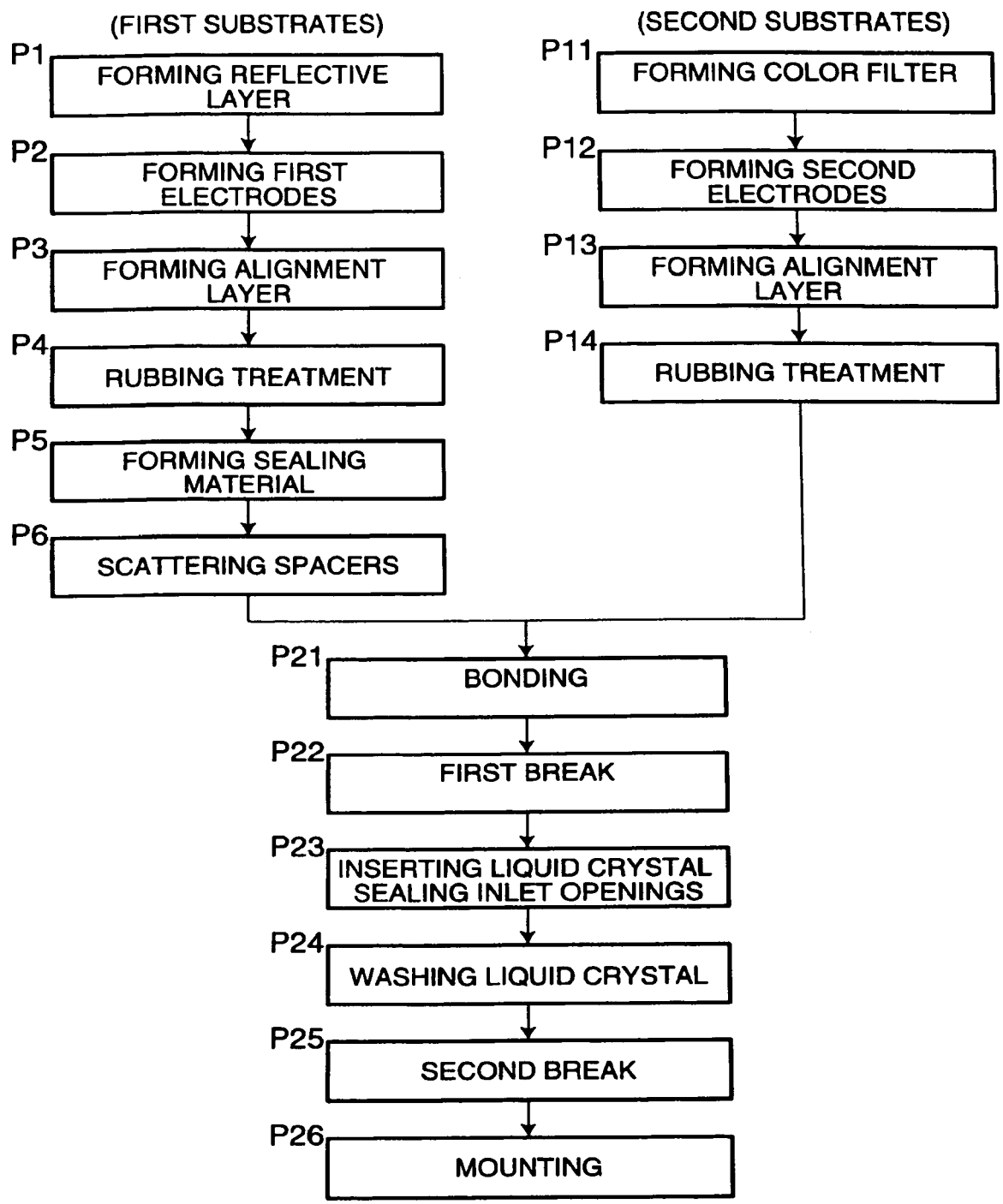
FIG. 17 is a process chart of a method for manufacturing a liquid crystal device according to an embodiment of the present invention.
Figure 18:
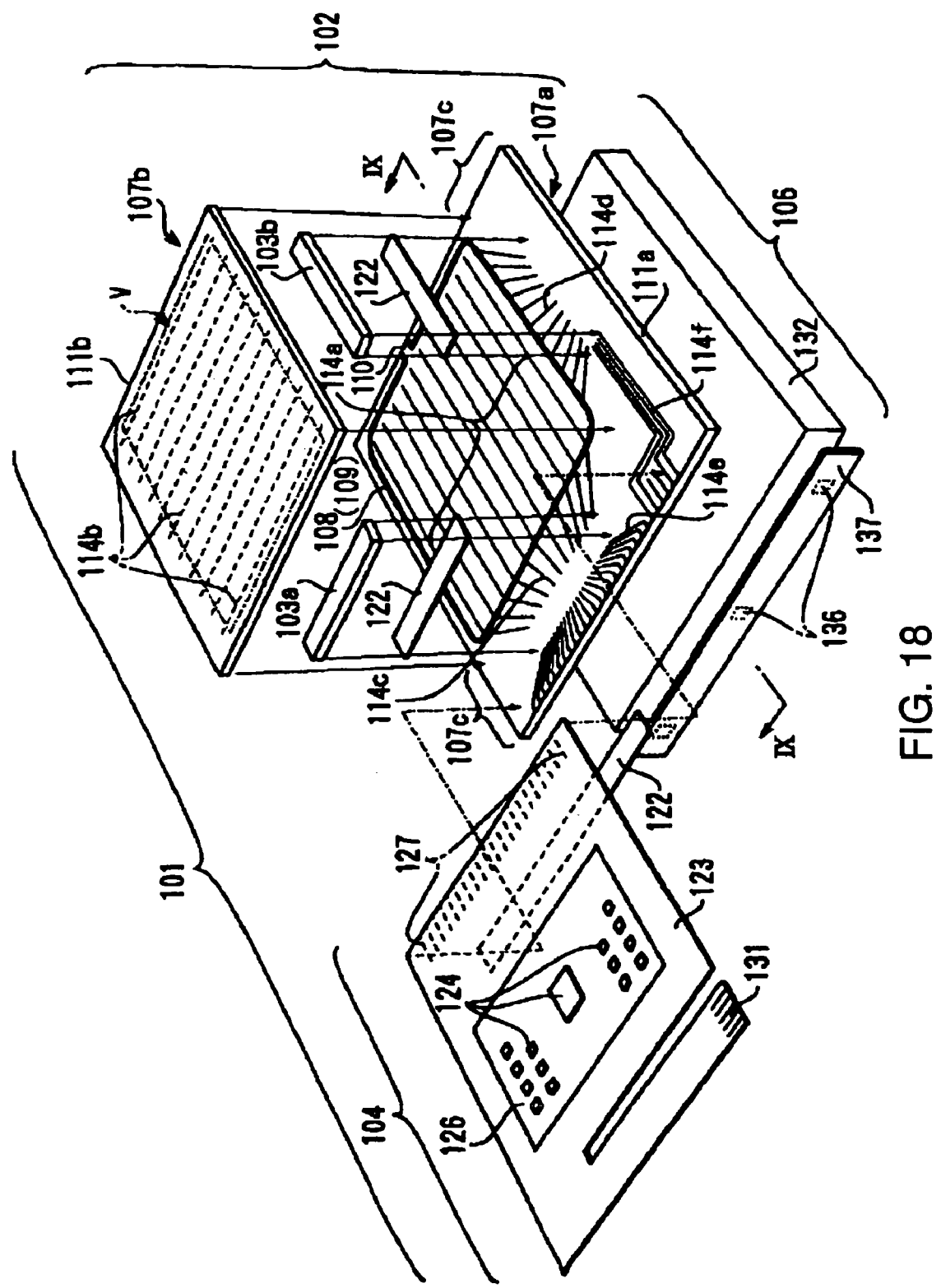
FIG. 18 is an exploded perspective view of a liquid crystal device manufactured according to a method of the present invention for manufacturing a liquid crystal device.
Figure 19:
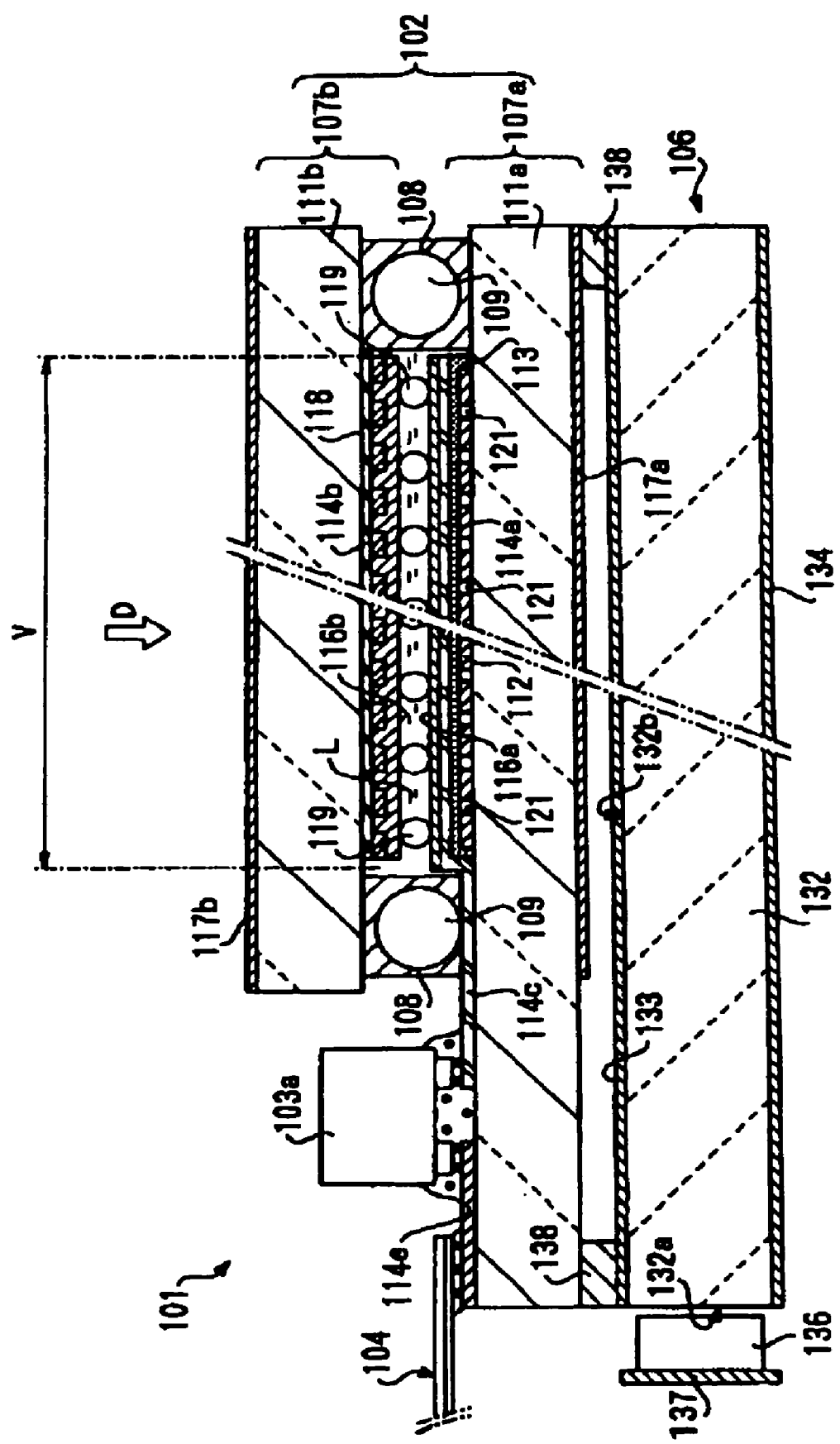
FIG. 19 is a sectional view of the liquid crystal device taken along line IX-IX in FIG. 18.

FIG. 17 shows a method for manufacturing a liquid crystal device according to an embodiment of a method for manufacturing a display device (electro-optic device) of the present invention. Also, FIG. 18 shows a liquid crystal device, by way of example of a display device (electro-optic device) manufactured by the method. Furthermore, FIG. 19 is a cross sectional view of the liquid crystal device taken along line IX-IX in FIG. 18. First, the exemplary structure of the liquid crystal device will be described with reference to FIGS. 18 and 19. The liquid crystal device here is a simple matrix-type transflective liquid crystal device displaying full color images.

As shown in FIG. 18, the liquid crystal device 101 has a liquid crystal panel 102 containing liquid crystal driving ICs 103a and 103b formed in a semiconductor chip and an FPC (flexible printing circuit) 104 connected to the liquid crystal panel 102. The liquid crystal device 101 also has an illumination device 106, acting as a backlight, at the rear surface side of the liquid crystal panel 102.

The liquid crystal panel 102 includes a first substrate 107a and a second substrate 107b bonded to each other with a sealant 108. The sealant 108 is formed by, for example, screen-printing an epoxy resin in a loop (circular manner) on the inner surface of the first substrate 107a or the second substrate 107b. Also, the sealant 108 contains spherical or cylindrical conductors 109 formed of a conductive material and dispersed therein, as shown in FIG. 19.

The first substrate 107a has a transparent plate-like base 111a formed of glass, resin, or the like, as shown in FIG. 19. The base 111a is provided with a reflecting layer 112 on the inner surface (upper surface in FIG. 19) thereof. An insulating layer 113 is deposited on the reflecting layer 112, and first electrodes 114a are formed on the insulating layer 113 in a striped manner (see FIG. 18) when viewed in the direction indicated by arrow D. Furthermore, an alignment layer 116a overlies the electrodes. Also, a polarizer 117a is provided on the outer surface (lower surface in FIG. 19) of the base 111a by adhesion.

The distances between the first electrodes 114a shown in FIG. 18 are illustrated considerably larger than the actual distances, for the sake of ease of understanding the arrangement. Hence, the number of the first electrodes 114a overlying the base 111 is, in practice, larger than the number of the first electrodes 114a shown in the drawing.

The second substrate 107b has a transparent plate-like substrate 111b formed of glass, resin, or the like, as shown in FIG. 19. A color filter 118 is disposed on the inner surface (lower surface in FIG. 19) of the base 111b, and second electrodes 114 are formed on the color filter 118 in a striped manner (see FIG. 18) in a direction perpendicular to the first electrodes 114a. Furthermore, an alignment layer 116B overlies the electrodes. Also, a polarizer 117b is provided on the outer surface (upper surface in FIG. 19) of the base 111b by adhesion.

The distances between the second electrodes 114b shown in FIG. 18 are illustrated larger than the actual distances, as in the first electrodes, for the sake of ease of understanding the arrangement. Hence, the number of the second electrodes 114b overlying the base 111 is, in practice, larger than the number of the first electrodes 114b shown in the drawing.

As shown in FIG. 19, a so-called cell gap, which is the space enclosed with the first substrate 107a, the second substrate 107b, and the sealant 108, is filled with a liquid crystal L, such as STN (super twisted nematic) liquid crystal. A large number of small spherical spacers 119 are dispersed on the inner surfaces of the first substrate 107a and the second substrate 107b so as to be present in the cell gap, thus maintaining the cell gap uniform.

The first electrodes 114a and the second electrodes 114b extend so as to intersect each other. Their intersections in plan view are arrayed in a dot matrix when viewed in the direction indicated by arrow D in FIG. 19. The intersections each form a display dot. The color filter 118 has R (red), G (green), and B (blue) elements (filter elements) arranged in a predetermined pattern, such as a striped arrangement, a delta arrangement, or a mosaic arrangement. Each display dot corresponds to one element of R, G, and B filter elements. Three display dots of R, G, and B define a pixel.

Images, such as letters and numbers, are displayed on the external surface of the second substrate 107b of the liquid crystal panel 102 by selectively activating the display dots arrayed in a matrix. The region displaying images as above is a viewing area and is designated by arrow V in FIGS. 18 and 19.

The reflecting layer 112 is formed of a light-reflecting material, such as an APC alloy or aluminum, as in FIG. 19. The reflecting layer 112 has apertures 121 in the positions corresponding to the display dots, that is, the intersections of the first electrodes 114a and the second electrodes 114b. The apertures 121 are therefore arrayed in the same matrix as in the display dots when viewed in the direction indicated by arrow D in FIG. 19.

The first electrodes 114a and the second electrodes 114b are formed of, for example, transparent conductive ITO (indium tin oxide). The alignment layers 116a and 116b are formed by bonding a polyimide resin in a film form having a uniform thickness. The alignment layers 116a and 116b are subjected to rubbing to determine the initial orientation of the liquid crystal on the surfaces of the first substrate 107a and the second substrate 107b.

As shown in FIG. 18, the first substrate 107a has an area larger than that of the second substrate 107b. Thus, the first substrate 107a bonded to the second substrate 107b with the sealant 108 has a protrusion 107c from the second substrate 107b. The protrusion 107c is provided with lead wires 114c extending from the first electrodes 114a, lead wires 114d conducting to the second electrodes 114b of the second substrate 107b through the conductors 109 (see FIG. 19) in the sealant 108, a metal wire 114e connected to an input terminal, or input bump, of the liquid crystal driving IC 103a, another metal wire 114f connected to an input bump of the liquid crystal driving IC 103b, and other wires, in a predetermined pattern thereon.

In this instance, the lead wires 114c extending from the first electrodes 114a and the lead wires 114d electrically connected to the second electrodes 114b are formed of ITO, which is the same material as the constituent of these electrodes. The metal wires 114e and 114f serving as input wires of the respective liquid crystal driving ICs 103a and 103b are formed of a metal having a low resistance, such as an APC alloy. The APC alloy mainly contains Ag and further contains Pd and Cu, having a composition constituted of, for example, 98% by weight of Ag, 1% by weight of Pd, and 1% by weight of Cu.

The liquid crystal driving ICs 103a and 103b are adhered on the surface of the protrusion 107c with an ACF (anisotropic conductive film) 122. In other words, the liquid crystal panel of this embodiment contains semiconductor chips directly mounted on the substrate to form a COG (chip on glass) structure. In this COG mounting structure, conducting particles contained in the ACF 122 electrically connect the input bumps of the liquid crystal driving ICs 103a and 103b to the metal wires 114e and 114f respectively, and the output bumps of the liquid crystal driving ICs 103a and 103b to the lead wires 114c and 114d respectively.

The FPC 104, shown in FIG. 18, has a flexible resin film 123, a circuit 126 including chip components 124, and metal wire terminals 127. The circuit 126 is directly mounted on the surface of the resin film 123 by soldering or other techniques. The metal wire terminals 127 are formed of a conductive material, such as an APC alloy, Cr, or Cu. The region of the FPC 104 having the metal wire terminals 127 are connected, with the ACF 122, to the region of the first substrate 107a having the metal wires 114e and 114f. The metal wires 114e and 114f are electrically connected to the metal wire terminals 127 of the FPC 104 by the conducting particles in the ACF 122.

External terminals 131 connected to an external circuit not shown in the drawing are formed at the end of the opposite side of the FPC 104. The liquid crystal driving ICs 103a and 103b are driven according to signals transmitted from the external circuit. Thus, a scanning signal is supplied to either the first electrodes 114a or the second electrodes 114b and data is supplied to the other. Thus, the display dots arrayed in the viewing area V are each voltage-controlled, and consequently the orientation of the liquid crystal L is controlled from one dot to another.

The illumination device 106 shown in FIG. 18 has a light-transmitter 132 formed of an acrylic resin or the like, a diffusion sheet 133 disposed on a light-emitting face 132b of the light-transmitter 132, a reflection sheet 134 disposed on the face opposite the light-emitting face 132b, and an LED (light-emitting diode) 136 serving as a light source, as shown in FIG. 19.

The LED 136 is supported by a LED substrate 137 which may be incorporated in a supporting portion (not shown in the drawing) integrated with the light-transmitter 132. By providing the LED substrate 137 in a predetermined position of the supporting portion, the LED 136 is located at a position opposing a light-admitting face 132a, which is a side face of the light-transmitter 132. Reference numeral 138 represents a shock absorbing member for absorbing shocks applied to the liquid crystal panel 102.

Light emitted from the LED 136 enters the light-transmitter 132 through the light-admission face 132a, and is transmitted while being reflected at the reflection sheet 134 and the side faces of the light-transmitter 132. Thus the light is emitted to the outside from the light-emitting face 132b through the light-diffusion sheet 133.

In the liquid crystal device 101 described above, when external light, such as sun light or room light, is sufficiently bright, the external light enters the inside of the liquid crystal panel 102 from the second substrate 107b side. The light is transmitted through the liquid crystal L, and is then reflected at the reflecting layer 112 to return to the liquid crystal L. The orientation of the liquid crystal L is controlled by the electrodes 114a and 114b from one display dot of R, G, or B to another. The light supplied to the liquid crystal L is therefore modulated from one display dot to another. According to the modulation, light capable of passing through the polarizer 117b and light incapable of passing through it form images, such as characters or numerals, to be displayed outside of the liquid crystal panel 102. Thus the images are reflectively displayed.

In contrast, when the external light is not sufficiently bright, the LED 136 emits flat light to the light-transmitter 132 through the light-emitting face 132b, and the light passes through the apertures 121 in the reflecting layer 112 to be supplied to the liquid crystal L. The supplied light is modulated from one display dot to another by the liquid crystal L subjected to orientation control. Thus, images are transmissively displayed outside.

The liquid crystal device 101 having the above-described structure is manufactured by, for example, a method shown in FIG. 17. In this manufacturing method, a series of steps P1 to P6 is for forming the first substrate 107a, and a series of steps P11 to P14 is for forming the second substrate 107b. The processes of forming the first and second substrates are normally independent of each other.

In the process of forming the first substrate, first, a reflecting layer 112 for a plurality of liquid crystal panels 102 is formed by photolithography or the like on the surface of a transparent starting mother substrate formed of a light-transmissive glass, resin, or the like having a large area. An insulating layer 113 is deposited on the reflecting layer 112 by a known deposition technique (step P1). Next, first electrodes 114a, lead wires 114c and 114d, and metal wires 114e and 1114f are formed by the photolithography or the like (step P2).

Then, an alignment layer 116a is formed by coating, printing, or the like (step P3). The alignment layer 116a is subjected to rubbing to determine the initial orientation of the liquid crystal (step P4). Next, a sealant 108 is formed in a loop by, for example, screen-printing or the like (step P5), and spherical spacers 119 are dispersed on the sealant 108 (step P6). Thus, a first mother substrate having a large area is completed which has a plurality of panel patterns disposed on the first substrate 107a of the liquid crystal panel 102.

In addition to the first substrate forming process, a process of forming the second substrate (steps 11 to 14 in FIG. 17) is performed. First, color filters 118 for the plurality of liquid crystal panel 102 are formed on the surface of another wide starting mother substrate formed of a light-transmissive glass, resin, or the like (step P11). The step of forming the color filters 118 is performed by the manufacturing method shown in FIG. 6 in which R, G, and B filter elements are formed with the liquid discharge device 16 shown in FIG. 8, with the liquid discharge head 22 controlled according to the method shown in FIGS. 1 to 4. The color filter manufacturing method and the liquid discharge head 22 controlling method are the same as the method described above and the description is omitted.

After the color filters 1, or the color filters 118, are formed on the mother substrate 12, or the starting mother substrate, as shown in FIG. 6(d), the second electrodes 114b are formed (step P12) by photolithography. Then, the alignment layer 116b are deposited by coating, printing, or the like (step P13). Next, the alignment layer 116b is subjected to rubbing to determine the initial orientation of the liquid crystal (step P14). Thus, a second mother substrate having a large area is completed which has a plurality of panel patterns disposed on the second substrate 107b of the liquid crystal panel 102.

After being completed as above, the wide first and second mother substrates are aligned and bonded to each other with the sealant 108 therebetween (step P21). Thus, an empty panel structure is completed which includes panel portions for the plurality of liquid crystal panels and which is not filled with the liquid crystal.

Then, scribed grooves for cutting into pieces are formed in predetermined positions of the panel structure, and the panel structure is broken to be cut into sections by stress or heat application or light exposure to scribed grooves of the panel structure (step P22). Thus, a rectangular empty panel structure is formed with liquid crystal inlets 110 (see FIG. 18) of the sealants 108 of the liquid crystal panel portions exposed.

Then, The liquid crystal L is injected into the inside of each liquid crystal panel portion through the corresponding exposed liquid crystal inlet 110, and the liquid crystal inlet 110 is sealed with resin or the like (step P23). In general, the injection of the liquid crystal is performed by reducing the internal pressure of the liquid crystal panel portion to make use of differential pressure. For example, a vessel in which a liquid crystal is reserved and the rectangular empty panel are placed in a chamber. The chamber is evacuated to produce a vacuum, and the rectangular empty panel is immersed in the liquid crystal in the evacuated chamber. When the chamber is subsequently opened to atmospheric pressure, the liquid crystal is introduced into the panel through the liquid crystal inlet by the atmospheric pressure which pressurizes the liquid crystal due to the evacuated inside of the panel. After the liquid crystal injection, the rectangular panel is cleaned in step P24 because of liquid crystal trapped around the liquid crystal panel structure.

Then, scribed grooves are formed again in predetermined positions of the rectangular panel after the liquid crystal injection and the cleaning. The rectangular panel is cut into pieces along the scribed grooves. Thus, a plurality of liquid crystal panels 102 are separated (step P25). Each liquid crystal panel 102 formed as above is incorporated with the liquid crystal driving ICs 103a and 103b and the illumination device 106 serving as a backlight, and further connected to the FPC 104. Thus, a desired liquid crystal device 101 is completed (step P26).

The color filter included in the liquid crystal device is manufactured by any one of the plurality of techniques described in the above-described embodiment for the color filter and the method for manufacturing the color filter. Therefore, when the color filter 118 shown in FIG. 19 is manufactured as in the color filter 1 shown in FIG. 5(a), the filter element materials are discharged in a plurality of (two, in the embodiment) sweeping directions different from one another, thus forming filter elements. As a result, color shading resulting from the sweeping direction is reduced and, therefore, the quality of displayed images can be improved.

When the color filter is manufactured by the method shown in FIGS. 3 and 4, each of the filter elements 3 are formed by repeating the sweeping of the liquid discharge head 22 N times (for example, 4 times), but not once, to deposit ink a plurality of times so that the resulting filter element 3 has a predetermined thickness. As a result, thickness variation between the filter elements 3 can be prevented, even if there is a variation of the ink discharge rate between the plurality of nozzles 27, and the above-described striped color shading is further reduced. Thus, the light-transmission characteristics of the color filter can become horizontally uniform.

Also, in the liquid crystal device and the method for manufacturing the same of the present embodiment, the filter elements 3 are formed by discharging ink from the liquid discharge head 22 of the liquid discharge device 16 shown in FIG. 8. Therefore, it is not necessary to apply a complicated process as in a method using photolithography, and waste of materials can be eliminated.

The present embodiment illustrates a liquid crystal device, serving as a display device, having a liquid crystal panel. However, the display device may be an electro-optic device other than the liquid crystal device and which includes, for example, EL elements or a plasma display panel having the above-described color filter. For example, by layering the color filter including filter elements corresponding to a plurality of dots capable of emitting electroluminescent light, the same effects as in the above-described embodiment are produced.

[Display Device (Electro-optic Device) Including EL Elements and Method for Manufacturing the Same]

Figure 20:
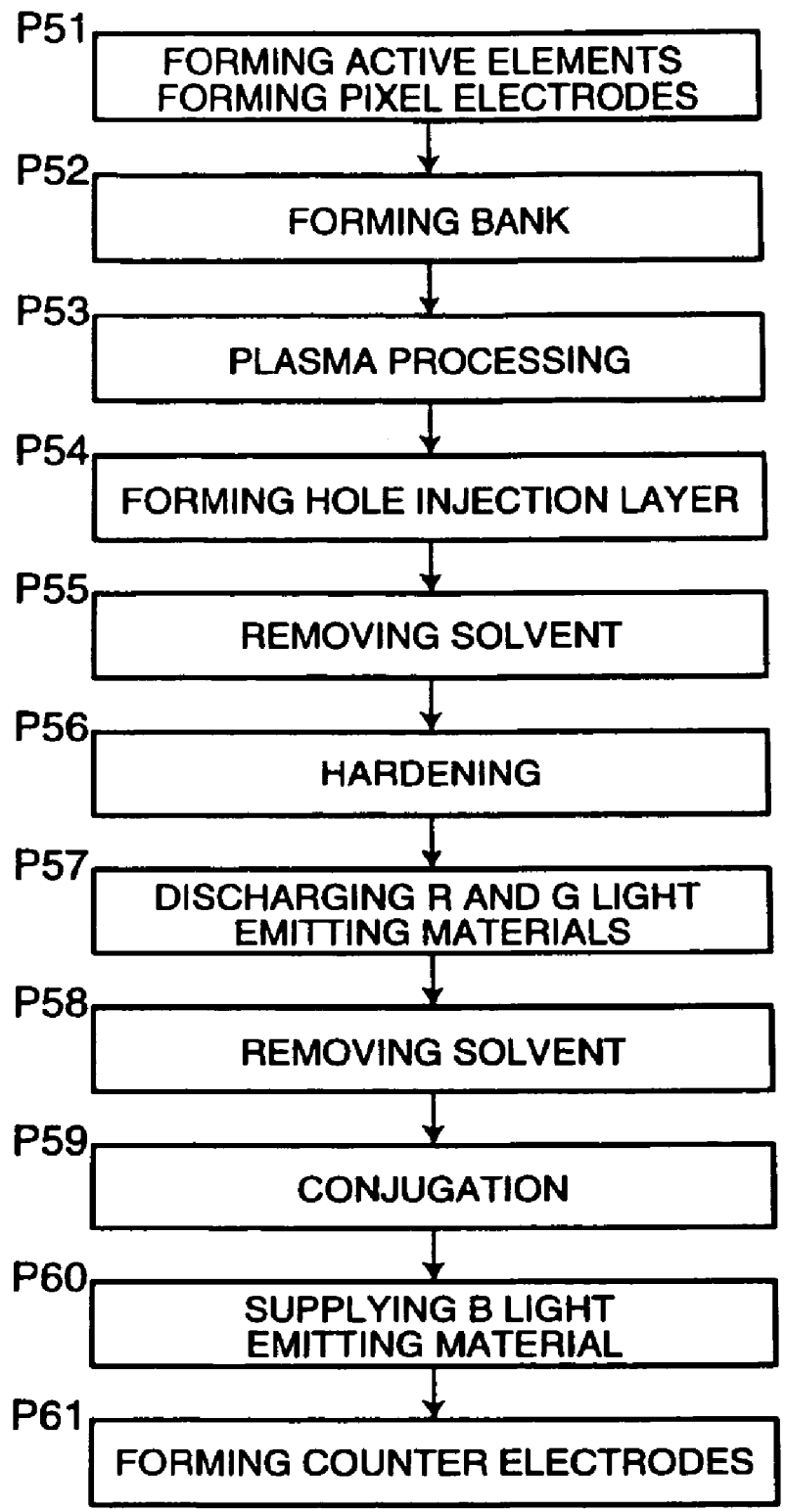
FIG. 20 is a process chart of a method for manufacturing an EL device according to an embodiment of the present invention.

FIG. 20 shows a method for manufacturing an EL device according to an embodiment of a method for manufacturing a display device (electro-optic device) of the present invention. FIG. 21 shows sectional views of major steps of manufacturing an EL device and the final structure of the resulting EL device. As shown in FIG. 21(d), the EL device 201 includes pixel electrodes 202 on a transparent substrate 204 and banks 205 between the pixel electrodes 202 in a grid manner when viewed in the direction indicated by arrow G. A hole injection film 220 is deposited in each recess in the grid, and one of luminescent films of R, G, and B colors 203R, 203G, and 203B is deposited in each recess of the grid so as to be arrayed in a predetermined arrangement, such as a striped arrangement when viewed in the direction indicated by arrow G. In addition, an opposing electrode 213 is formed on the luminescent films and, thus, the EL device 201 is completed.

When the pixel electrodes 202 are driven by two-terminal active elements, such as TFDs (thin-film diodes), the opposing electrode 213 is formed in a striped manner when viewed in the direction indicated by arrow G. When the pixel electrodes 202 are driven by three-terminal active elements, such as TFTs (thin-film transistors), the opposing electrode 213 is formed in a single face.

Each of the regions between the pixel electrodes 202 and the opposing electrodes 213 defines a display dot, and three dots of R, G, and B colors define a unit serving as a pixel. By controlling current flowing in each display dot, a desired dot of the plurality of display dots is selectively allowed to emit light and, thus, a desired full color image can be displayed in the direction indicated by arrow H.

The EL device 201 is manufactured by, for example, a method shown in FIG. 20. Specifically, as shown in step P51 and FIG. 21(a), active elements, such as TFD elements and TFT elements, are formed on the surface of the transparent substrate 204 and, further, the pixel electrodes 202 are formed. These are formed by photolithography, vacuum deposition, sputtering, pyrosol deposition, or the like. The pixel electrodes 202 are formed of ITO, tin oxide, a complex oxide of indium oxide and zinc oxide, or the like.

Figure 21A:
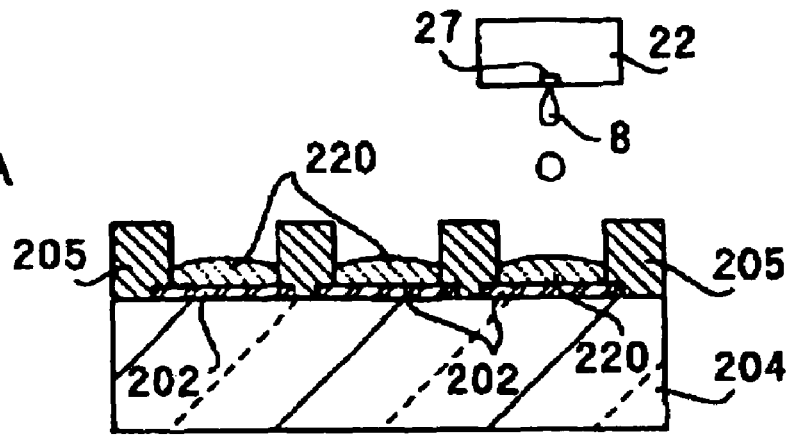
FIG. 21 is a sectional view of an EL device corresponding to the process chart shown in FIG. 20.

Next, as shown in step P52 and FIG. 21(a), the banks 205, serving as barrier walls, are formed by a known patterning technique, such as photolithography, so as to fill the gaps between the transparent pixel electrodes 202. Thus, the banks increase contrast and prevent color mixture of the luminescent materials and leakage of light from the gaps between the pixels. The material of the banks 205 is not particularly limited, as long as it has resistance against solvents of the EL luminescent materials. Preferably, it is capable of being subjected to tetrafluoroethylenation by fluorocarbon plasma polymerization, and may be an organic material, such as an acrylic resin, an epoxy resin, or photosensitive polyimide.

Next, the transparent substrate 204 is subjected to successive plasma polymerization using oxygen gas and fluorocarbon plasma (step P53) before an ink for the hole injection films, acting as a functional liquid material, is applied. This treatment allows the surface of polyimide to have water-repellency and the surface of ITO to have hydrophilicity, thus controlling the wettability of the surface at the substrate side where droplets of the ink are deposited to form a pattern. A plasma generator may generate plasma in a vacuum or in the atmosphere.

Next, as shown in step P54 and FIG. 21(a), the ink for hole injection films is discharged from the liquid discharge head 22 of the liquid discharge device 16 shown in FIG. 8 to form a pattern on the pixel electrodes 202. Specifically, the liquid discharge head 22 is controlled by any one of the methods shown in FIGS. 1, 2, 3, and 4. Subsequently, the solvent is removed for 20 minutes in a vacuum (1 Torr) at room temperature (step P55). Then, the substrate is subjected to heat treatment at 20° C. (on a hot plate) for 10 minutes to complete hole injection films 220 not compatible with the ink for luminescent films (step P56). The resulting luminescent films had a thickness of 40 nm, in practice, under the above-described conditions.

Figure 21B:
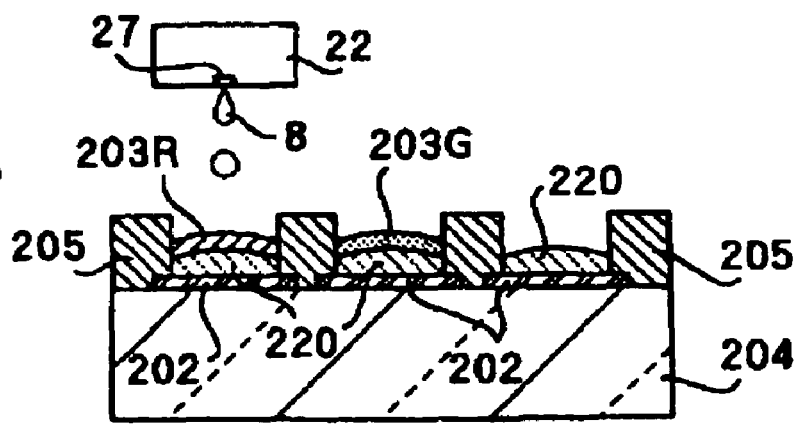

Turning to step P57 and FIG. 21(b), inks for R luminescent films and G luminescent films, which are functional liquid EL materials, are discharged onto the hole injection films 220 in filter-element-forming regions 7. These inks for the luminescent films are also discharged from the liquid discharge head 22 of the liquid discharge device 16 shown in FIG. 8. The liquid discharge head 22 is controlled by any one of the methods shown in FIGS. 1 to 4. In this instance, the color phases of the color filter are replaced with the luminescent colors of the EL materials. Ink jetting allows fine patterning for a short time. Also, by varying the solid content in the ink composition and the discharge quantity, the resulting thickness can be varied.

After the application of the inks for luminescent films, the solvent is removed, for example, for 20 minutes in a vacuum (1 Torr) at room temperature (step P58). Subsequently, conjugation is performed by heating at 150° C. in an atmosphere of nitrogen for 4 hours to complete the R color luminescent films 203R and the G color luminescent films 203G (step P59). The resulting films had thickness of 50 nm, in practice, under the above-described conditions. The resulting luminescent films, which are conjugated by heating, are not dissolved in solvents.

The hole injection films 220 may be subjected to successive plasma polymerization using oxygen gas and fluorocarbon gas plasma before the formation of the luminescent films. Thus, the hole injection films 220 have a fluoride layer which increases the ionization potential and, consequently, increases the hole injection efficiency. Thus, an organic EL device having a high luminous efficiency can be achieved.

Figure 21C:
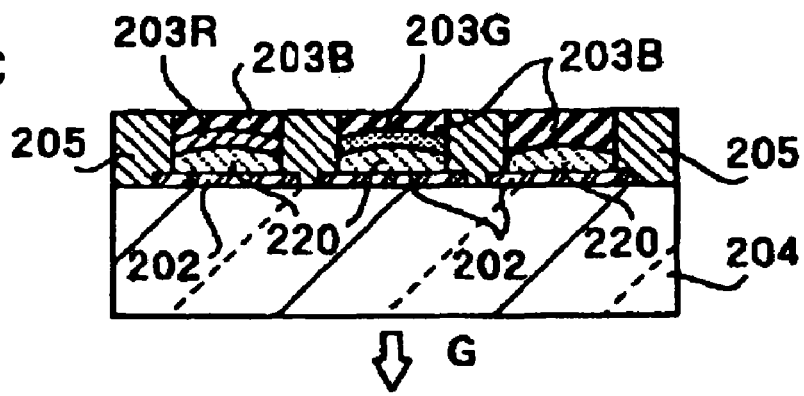
Figure 21D:
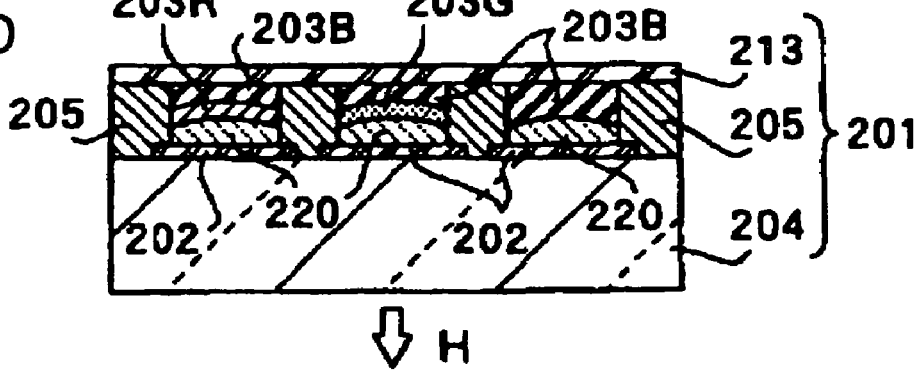

Turning to step P60 and FIG. 21(c), B-color luminescent films 203B, which are formed of a functional liquid EL material, are layered on the R-color luminescent films 203R and G-color luminescent films 203G and the hole injection films 220, in the display dots. Thus, not only are the three primary colors, R, G, and B formed, but also step heights from the R- and G-color luminescent films 203R and 203G to the banks 205 are eliminated to be flattened. As a result, a short circuit can surely be prevented between the upper and lower electrodes. By controlling the thickness of the B-color luminescent films 203B, B-color luminescent films layered on the R-color luminescent films 203R or the G-color luminescent films 203G are formed which serve as electron injection transport layers and does not emit B color.

In order to form the B-color luminescent films 203B as above, spin coating may be applied, which is generally known as a wet technique, or ink jetting as in the formation of the R- and G-color luminescent films 203R, 203G, may be applied.

Then, as shown in step P61 and FIG. 21(d), the opposing electrode 213 is formed and, thus, a desired EL device 201 is completed. When the opposing electrode 213 is in a plane, it is formed of Mg, Mg, Al, Li, or the like by a film deposition, such as vapor deposition or sputtering. When the opposing electrode 213 is in a striped manner, an electrode layer is deposited and is subsequently subjected to patterning such as a photolithography.

Since the above-described EL device 201 and its manufacturing method employ any one of the ink jet head controlling techniques shown in FIGS. 1 to 4, striped color shading resulting from the sweeping direction can be reduced, as in above. The hole injection films 220 and the R, G, and B luminescent films 203R, 203G and 203B in the display dots, shown FIG. 21 are each formed by repeating the sweeping of the ink jet head (see FIG. 1) N times (for example, 4 times), but not once, to deposit ink a plurality of times, and thus, the resulting hole injection films and luminescent films 3 have predetermined thicknesses. As a result, thickness variation between the display dots can be prevented, even if there is a variation of the ink discharge quantity between the plurality of nozzles 27, and the above-described striped color shading is further reduced. Thus, the EL device 201 can have a horizontally uniform distribution of light emission of the light-emitting surface.

Also, in the EL device and the EL device manufacturing method of the present embodiment, the R, G, and B display dots are formed by discharging ink from the liquid discharge head 22 of the liquid discharge device 16 shown in FIG. 8. Therefore, it is not necessary to apply a complicated process as in a method using photolithography, and waste of materials can be eliminated.

[Method and Device for Manufacturing a Color Filter]

Figure 38A:
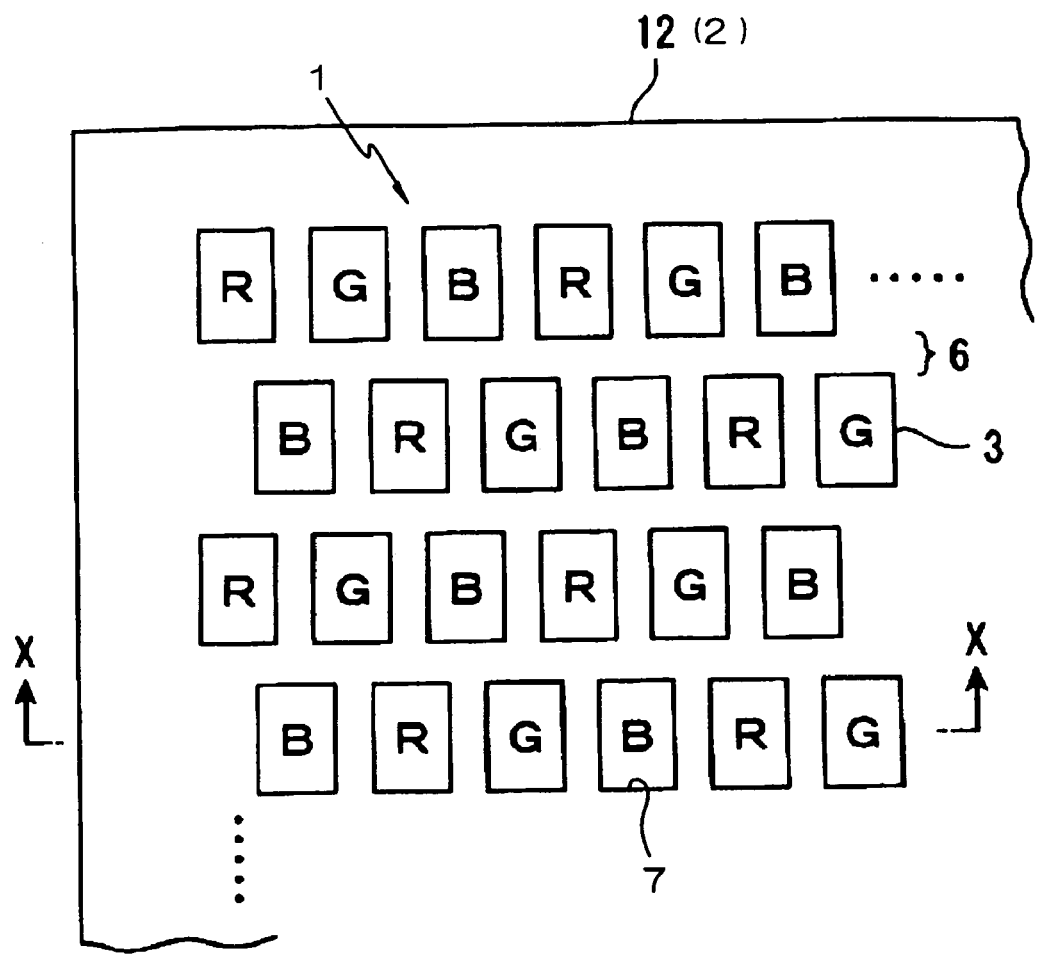
FIG. 38 is a schematic illustration of a color filter manufactured by the color filter manufacturing device, and (A) is a plan view of the color filter and (B) is a sectional view taken along line X-X in (A).
Figure 38B:
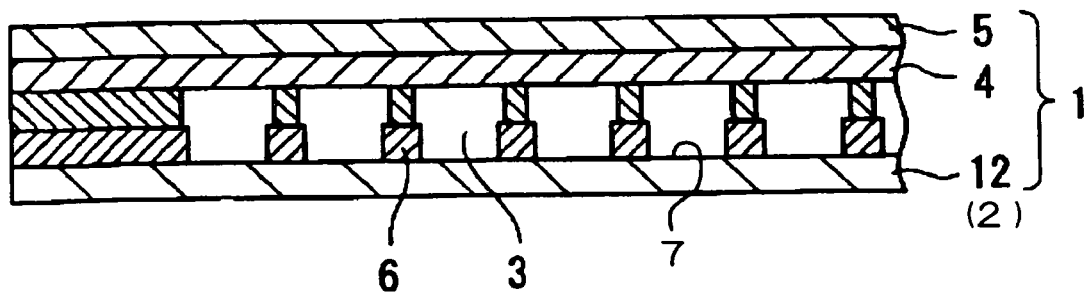

An embodiment of a method and a device for manufacturing a color filter will now be described with reference to drawings. First, the color filter to be manufactured will be illustrated before a description of the device for manufacturing the color filter. FIG. 38 is a fragmentary enlarged view of a color filter. FIG. 38(A) is a plan view of the color filter and FIG. 38(B) is a sectional view taken along line X-X in FIG. 38(A). The same parts of the color filter shown in FIG. 38 as in the color filter 1 of the foregoing embodiment shown in FIG. 5 are designated by the same reference numerals.

(Structure of the Color Filter)

The color filter 1 shown in FIG. 38(A) has a plurality of filter elements 3 arrayed in a matrix manner. The boundaries between the filter elements 3 are defined by the barrier walls 6. Each filter element 3 is filled with one of liquid color filter materials, or filter element materials 13, serving as inks for red (R), green (G), and blue (B). In the color filter shown in FIG. 38, red, green, and blue colors are arrayed in a so-called mosaic arrangement, but they may be in a striped arrangement or a delta arrangement, as described above.

As shown in FIG. 38(B), the color filter 1 includes a light-transmissive substrate 2 and light-transmissive barrier walls 6. The regions not having the barrier walls 6, from which the barrier walls are removed, are filter-elementforming regions 7 where the filter elements 3 are disposed. A protective film 4 and an electrode layer 5 are layered on the upper surfaces of the barrier walls 6 and the filter elements 3.

(Structure of the Color Filter Manufacturing Device)

Figure 27:
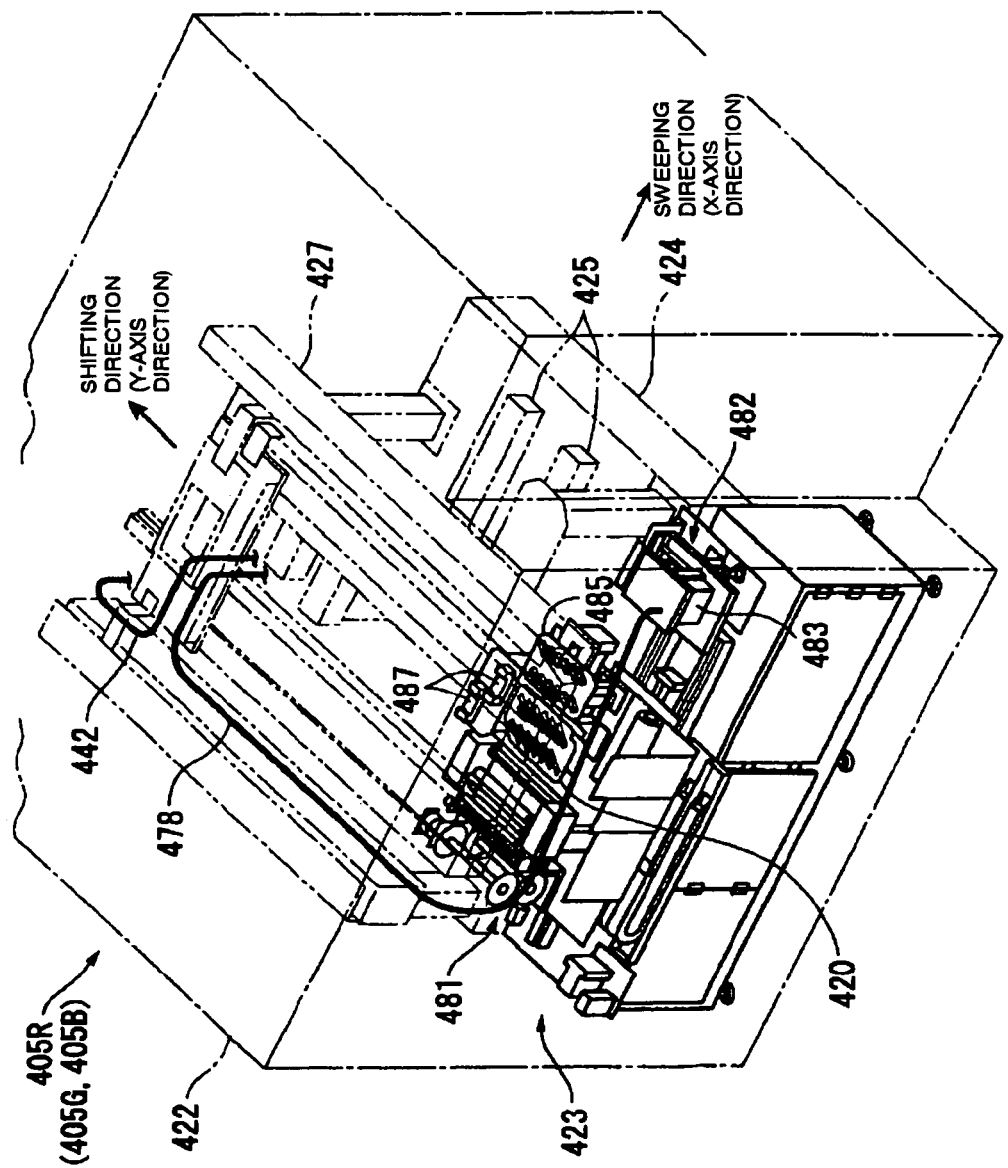
FIG. 27 is a fragmentary perspective view of a liquid discharge device included in a color filter manufacturing device of the present invention.

The structure of a device for manufacturing a color filter will now be described with reference to drawings. FIG. 27 is a perspective view, part of which is omitted, of a liquid discharge device included in a color filter manufacturing device of the present invention. The color filter manufacturing device is intended to manufacture the color filter 1 included in a color liquid crystal panel acting as an electro-optic device. The color filter manufacturing device includes a liquid discharge device having basically the same structure as that of the liquid discharge device 16 described above.

(Structure of the Liquid Discharge Device)

This manufacturing device has three liquid discharge devices 405R, 405G, and 405B, as shown in FIG. 27. These liquid discharge devices 405R, 405G, and 405B discharge three colors, R, G, and B of the filter element materials 13, which are liquid ink color filter materials, respectively. The liquid discharge devices 405R, 405G, and 405B are arranged substantially in series, in the manufacturing device. The liquid discharge devices 405R, 405G, and 405B each have an integrated control device, not shown in the drawing, for controlling the operations of their components.

Also, the liquid discharge devices 405R, 405G, and 405B are each connected to a carrier robot, not shown in the drawing, for carrying the mother substrate 12, one by one, to and from the corresponding liquid discharge device 405R, 405G, or 405B. Each of the liquid discharge devices 405R, 405G, and 405B can contain, for example, six mother substrates 12, and is joined to a multi-step baking oven, not shown in the drawing, for heating the mother substrates 12 for example, to 120° C. for 5 minutes and, subsequently, for drying discharged filter element materials 13.

The liquid discharge devices 405R, 405G, and 405B each have a thermal clean chamber 422 which is a hollow body case, as shown in FIG. 27. The inside of the thermal clean chamber 422 can be controlled to a temperature of, for example, 20±0.5° C. and does not allow dust to enter from the outside, in order to ensure that stable, preferred drawings can be performed by ink jetting therein. The thermal clean chamber 422 contains a liquid discharging body 423.

The liquid discharging body 423 has an X-axis air slide table 424, as shown in FIG. 27. A sweeping driver 425 including a linear motor, not shown in the drawing, is disposed on the X-axis air slide table 424. The sweeping driver 425 has a pedestal, not shown in the drawing, for fixing the mother substrate 12 by, for example, aspiration. The pedestal is moved in the sweeping direction X, with respect to the mother substrate 12.

The liquid discharging body 423 also has a shifting driver 427 serving as a Y-axis table above the X-axis air slide table 424, as shown in FIG. 27. The shifting driver 427 shifts a head unit 420 for discharging the filter element material 13 in, for example, the vertical direction, in the Y-axis direction, or the shifting direction, with respect to the mother substrate 12. For the sake of description of the orientation relationship, FIG. 27 illustrate the head unit 420 in solid line, as if it were suspended in the air.

The liquid discharging body 423 also includes an imaging device such as a camera, not shown in the drawing, for recognizing the locations of the ink jet head 421 and the mother substrate 12 to control the locations. The positions of the head unit 420 and the pedestal can be controlled by a position controlling technique using a pulse motor, feedback using a servomotor, or any other controlling technique. The components of the above-described liquid discharge device, including the imaging device have basically the same structure as in the liquid discharge device shown in FIGS. 8 and 9.

The liquid discharging body 423 has a wiping unit 481 for wiping a face of the head unit 420 for discharging the filter element material 13, as shown in FIG. 27. The wiping unit 481 has a wiping member, not shown in the drawing, including, for example, a cloth member and a rubber sheet which are layered together, wherein the wiping member is appropriately rolled from one end thereof and an appearing new face thereof wipes the face discharging the filter element material 13 one after another. Thus, the filter element material 13 trapped on the discharging face is removed and, thus, nozzles 466 described later are prevented from clogging.

In addition, the liquid discharging body 423 includes an ink system 482. The ink system 482 has an ink tank 483 for reserving the filter element material 13, a supply pipe 478 capable of distributing the filter element material 13, and a pump, not shown in the drawing, for supplying the filter element material 13 from the ink tank 483 to the head unit 420 through the supply pipe 478. The supply pipe 478 is schematically illustrated in FIG. 27, and is wired from the ink tank 483 to the shifting driver 427 without affecting the movement of the head unit 420 so as to supply the filter element material 13 to the unit head 420 from the upper region of the shifting driver 427 for sweeping the head unit 420.

The liquid discharging body 423 further has a weighing unit 485 for measuring the quantity of the filter element material 13 discharged from the head unit 420.

Furthermore, the liquid discharging body 423 has a pair of missing-dot detectors 487 including an optical sensor or the like, for detecting the state of the filter element material 13 discharged from the head unit 420. The missing-dot detectors 487 are disposed in a direction, for example, the X-axis direction, perpendicular to the direction in which droplets are discharged from the head unit 420 such that the light source and photoreceptor of the optical sensor, not shown in the drawing, oppose each other and are separated by a space through which droplets 8 discharged from the head unit 420 pass. The missing-dot detectors 487 are also disposed at the Y-axis direction side, or shifting direction side, of the head unit 420 so that missing dots are detected by observing the state of discharge every time when the head unit 420 is shifted to discharge the filter element material 13.

In the head unit 420, head devices 433 are arranged in two lines for discharging the filter element material 13, but the details will be described below. Accordingly, the pair of missing-dot defectors 487 are disposed to observe the state of discharge from the respective head device lines.

(Structure of the Head Unit)

Figure 28:
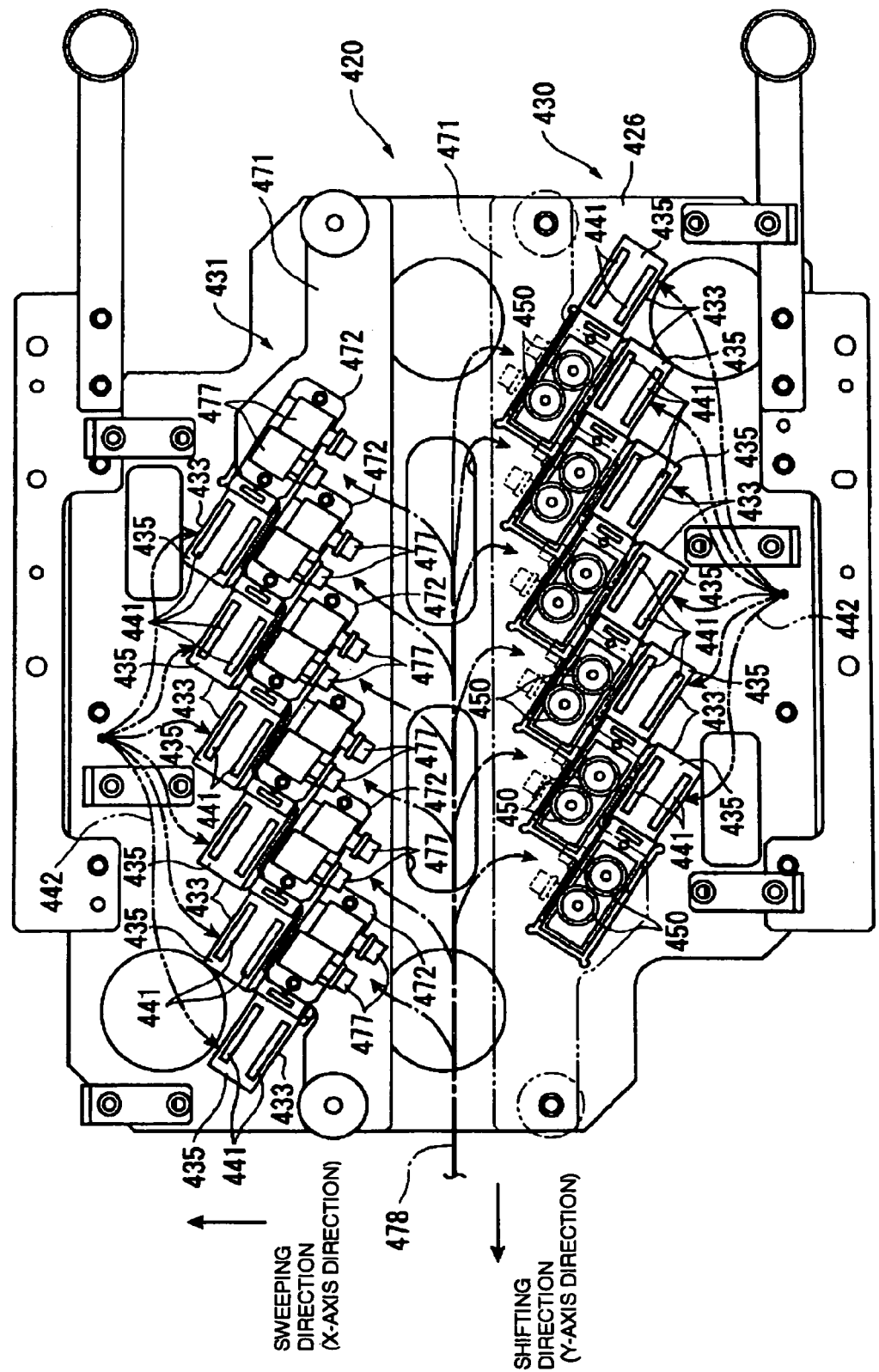
FIG. 28 is a plan view of a head unit of the liquid discharge device.
Figure 29:
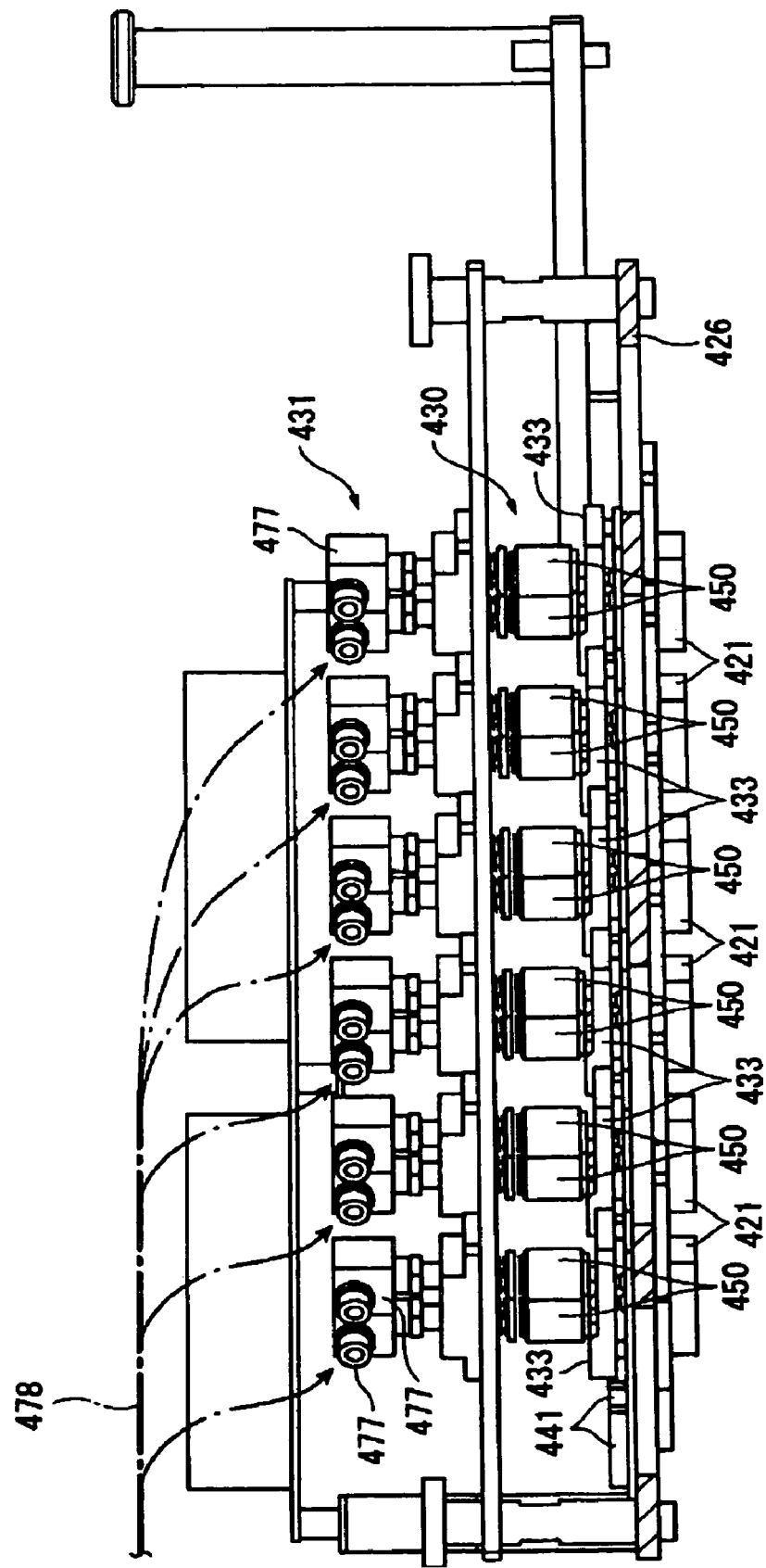
FIG. 29 is a side view of the liquid discharge device.
Figure 30:
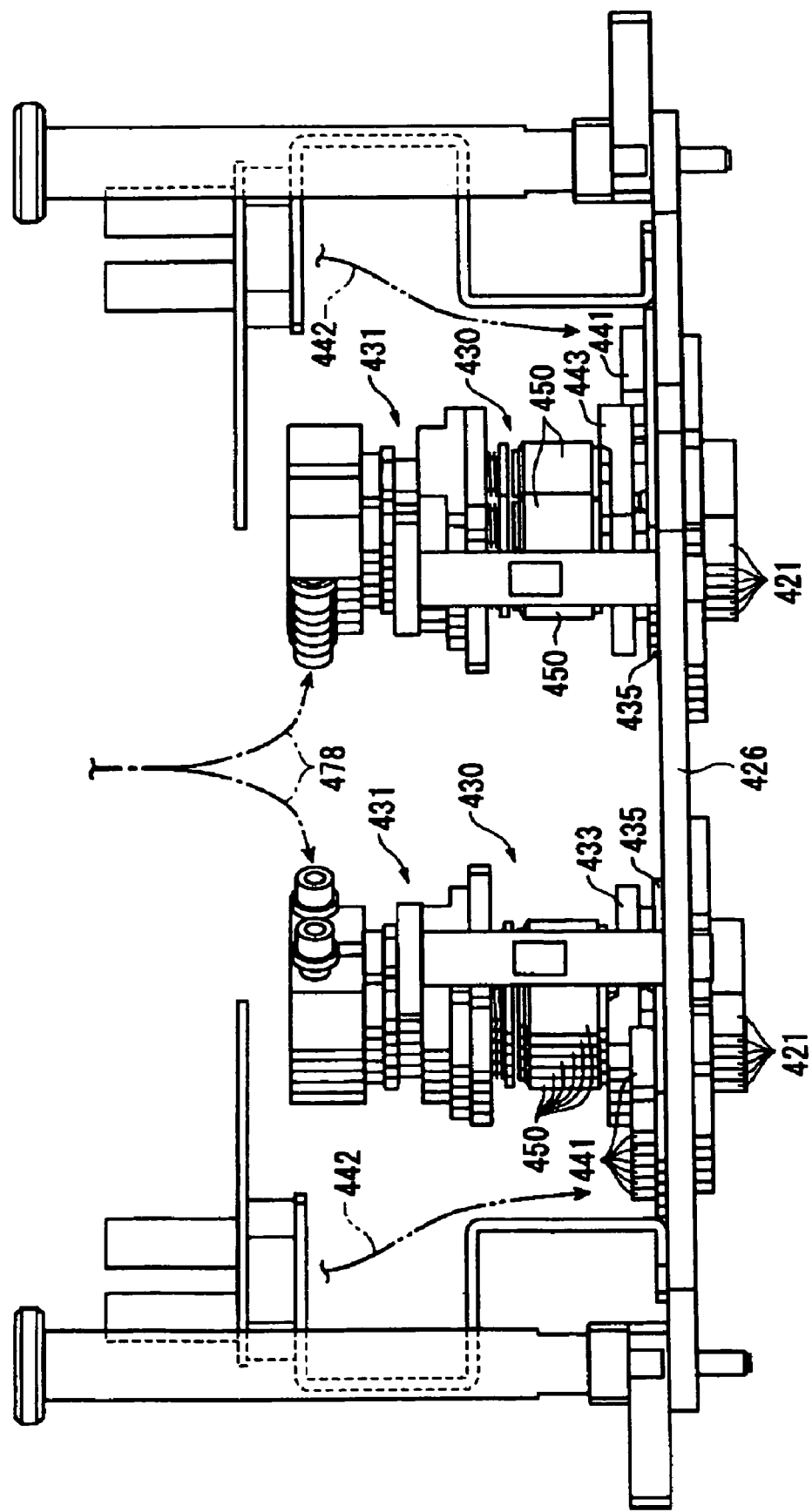
FIG. 30 is a front view of the liquid discharge device.
Figure 31:
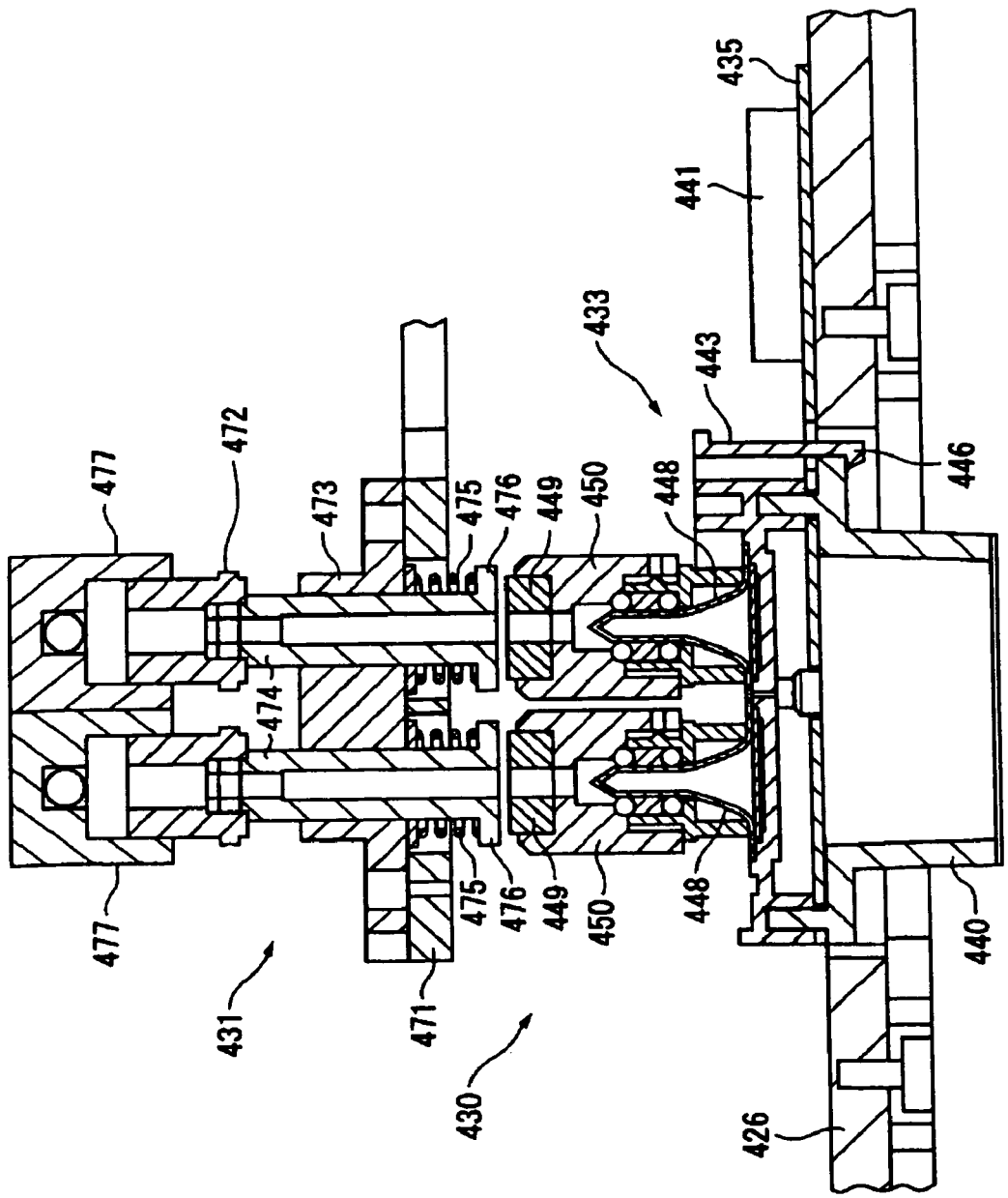
FIG. 31 is a sectional view of the liquid discharge device.

The structure of the head unit 420 will now be described. FIG. 28 is a plan view of the head unit included in the liquid discharge device. FIG. 29 is a side view of the head unit. FIG. 30 is a front view of the head unit. FIG. 31 is a sectional view of the head unit.

The head unit 420 has head bodies 430 and an ink supply portion 431, as shown in FIGS. 28 to 31. Each head body 430 has a flat-shaped carriage 426 and a plurality of head devices 433 having substantially the same shape, mounted on the carriage 426.

Figure 32:
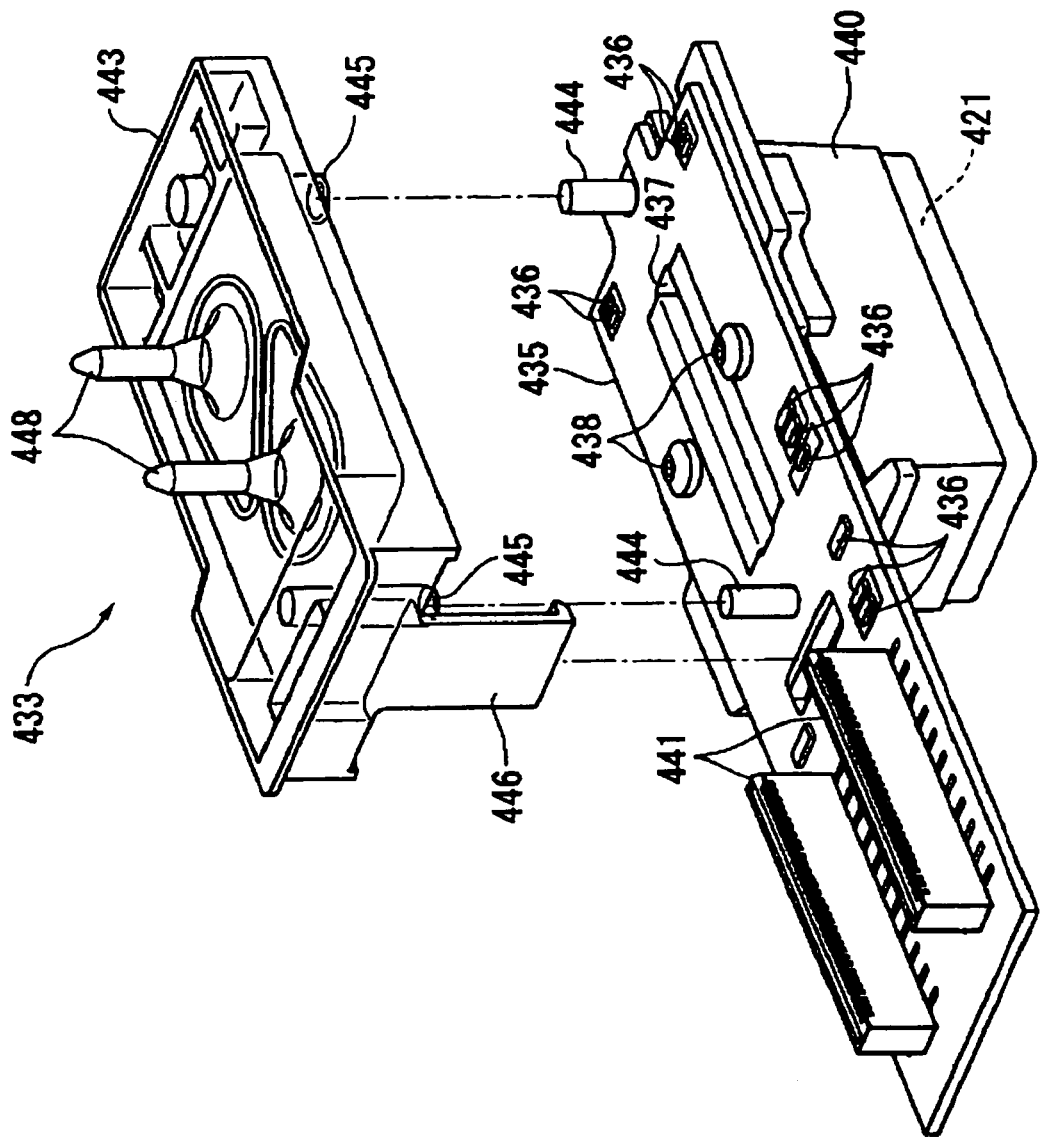
FIG. 32 is an exploded perspective view of a head device of the liquid discharge device.

FIG. 32 is an exploded perspective view of the head device included in the head unit. The head device 433 has a rectangular print board 435, as shown in FIG. 32. The print board 435 is provided with various electric parts 436 and electrical wires therein. The print board 435 has a window 437 therethrough in one side in the longitudinal direction (middle and right in FIG. 32). The print board 435 also has passages 438 for delivering the filter element material 13 serving as the ink at both sides of the window 437.

An ink jet head 421 is fixed to one surface (middle and lower side in the FIG. 32) of the print board 435 with a fixing member 440, located substantially at one side of the print board in the longitudinal direction (middle and right side in FIG. 32). The ink jet head 421 is rectangular and is fixed such that the longitudinal direction thereof is parallel to the longitudinal direction of the print board 435. The ink jet heads included in the respective head devices 433 have substantially the same shape, and, for example, satisfy predetermined specifications and, hence, screened to predetermined quality. Specifically, it is preferable that the ink jet head 421 have the same number of nozzles formed at the same position, from the viewpoint of the efficiency and precision in the assembly of the ink jet heads on the carriage. Furthermore, use of products manufactured through the same manufacturing and assembling processes eliminates the need for preparing a specific product, thus reducing costs.

Connectors 441 electrically connected to the ink jet head 421 with electric wires are fixed to the other surface (middle and upper side in the FIG. 32) of the print board 435, located substantially at substantially the other side of the print board in the longitudinal direction (middle and left side in FIG. 32). An electric wire (including a power cable and a signal cable) 442 connected to the shifting driver 427 is connected to connectors 441 without affecting the movement of the head unit 420, as schematically shown in FIG. 27. The electric wire 442 is intended to connect a control device, not shown in the drawing, and the head unit 420. Specifically, the electric wire 442 runs from the shifting driver 427 to each connector 441 through outer sides of the head unit 420 at both sides with respect to two lines of the arrangement of the head devices 433, as schematically indicated by two-dot chain lines in FIGS. 28 to 30, thus preventing the generation of electric noise.

An ink introducer 443 is attached to the other surface (middle and upper side in the FIG. 32) of the print board 435, located substantially at substantially one side of the print board in the longitudinal direction (middle and right side in FIG. 32), corresponding to the ink jet head 421. The ink introducer 443 has substantially cylindrical positioning tubes 445 combining positioning pins 444 of the fixing member 440 disposed through the print board 435; and an engaging claw 446 for engaging to the print board 435.

The ink introducer 443 has a pair of substantially cylindrical, tapered couplers 448. The couplers 448 each have an opening, not shown in the drawing, substantially fluid-tightly communicating with the passages 438 at the basal portion thereof on the print board 435 side thereof and a hole, not shown in the drawing, in the end thereof for passing the filter element material 13.

The coupler 448 is joined to a sealing coupler 450 at the end thereof as shown in FIGS. 29 to 31. The sealing coupler 450 is formed in a substantially cylindrical form to plug the coupler 448 thereinto substantially fluid-tightly, and has a sealing member 449 in the end thereof.

Figure 33:
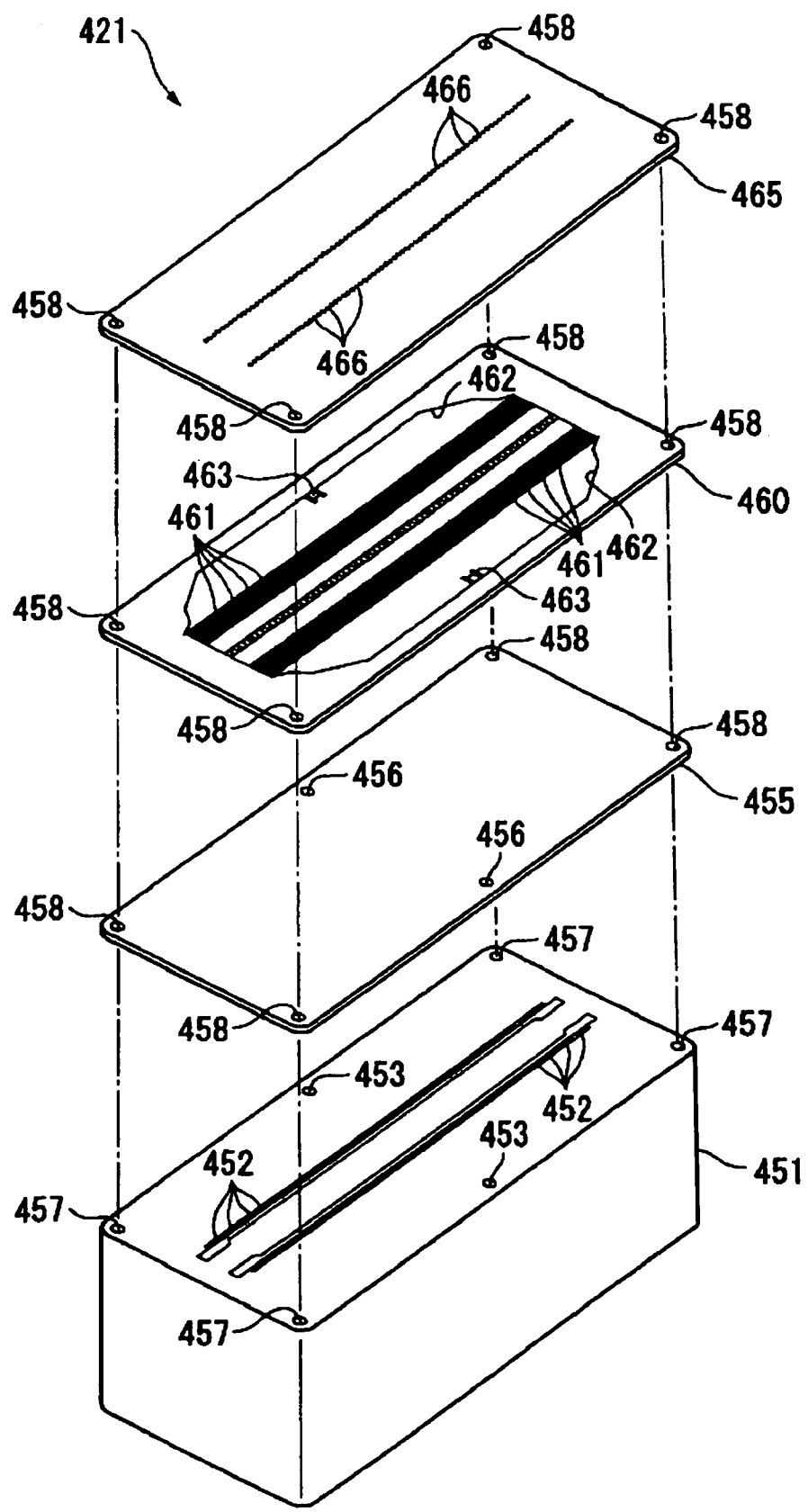
FIG. 33 is an exploded perspective view of an ink jet head of the liquid discharge device.
Figure 34C:
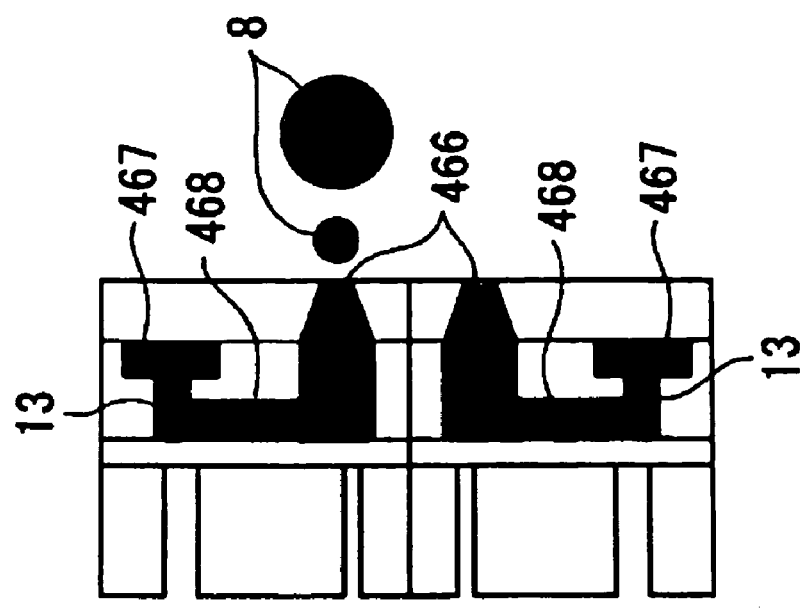
FIG. 34 is a schematic illustration of discharge of a filter element material from the ink jet head.
Figure 34B:
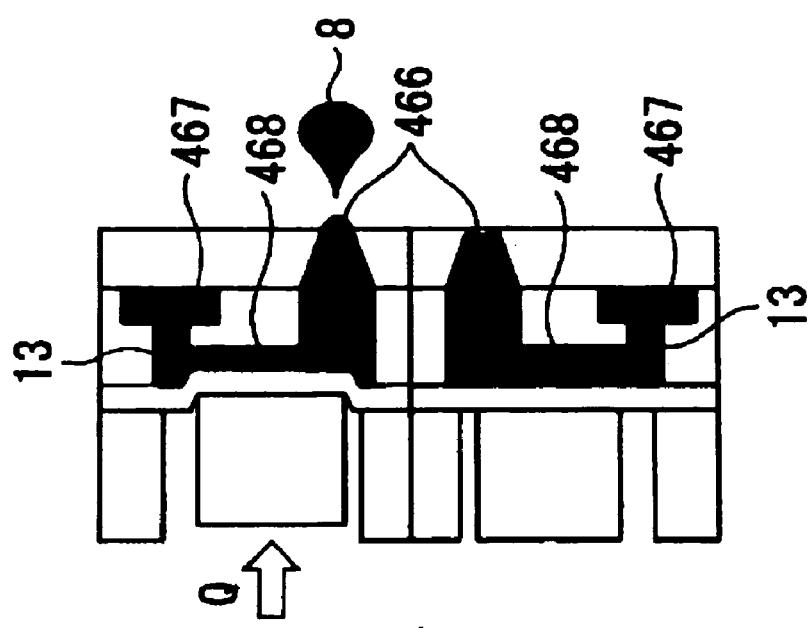
Figure 34A:
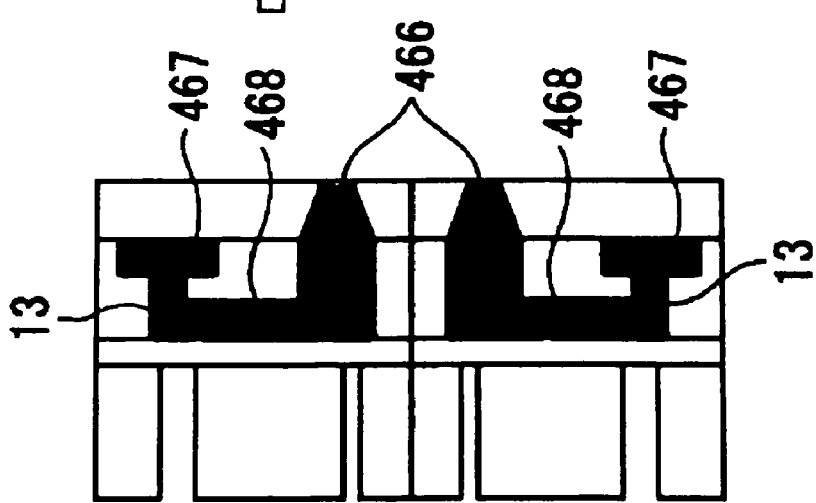
Figure 35:
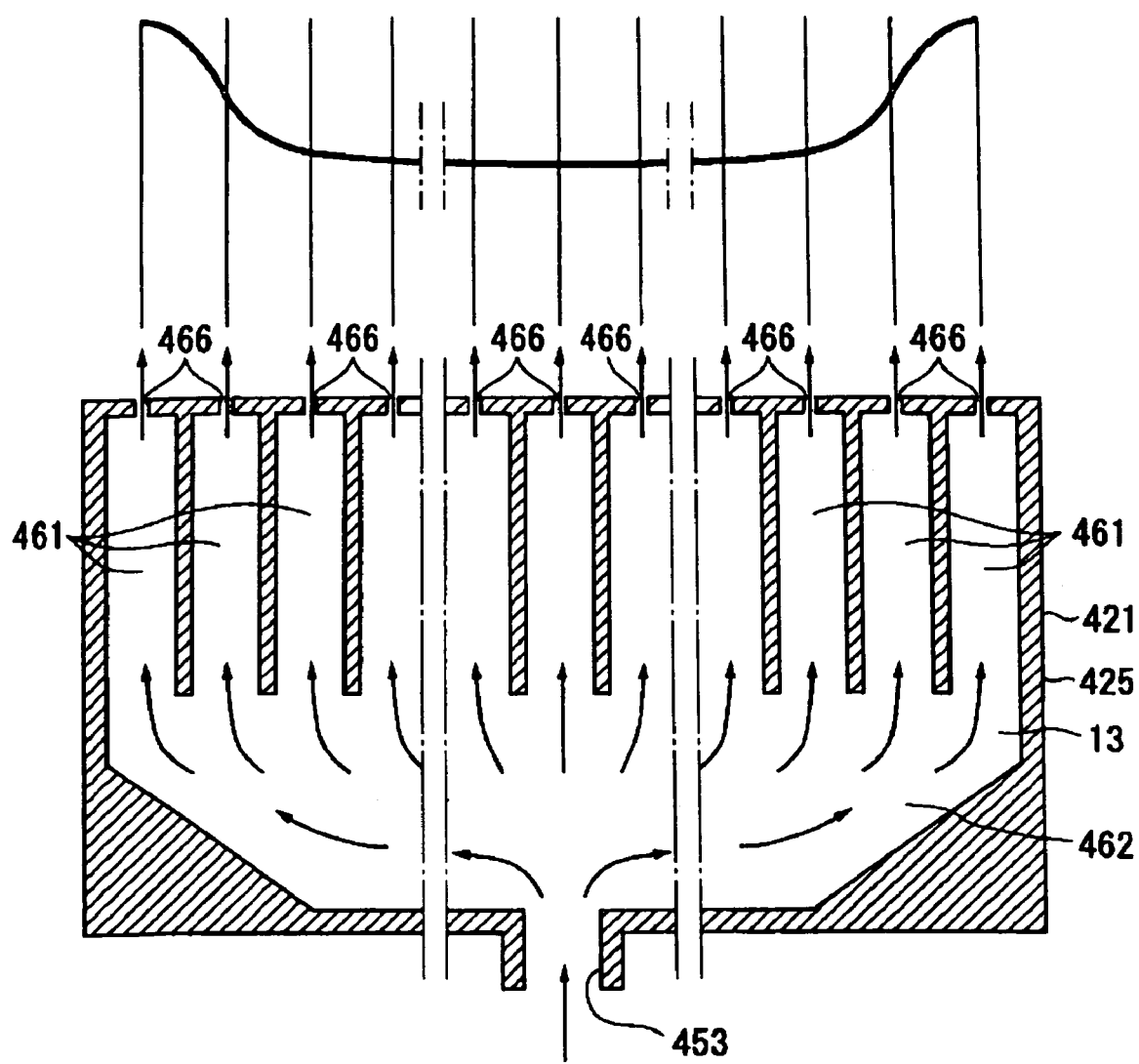
FIG. 35 is a schematic illustration of the discharge quantity of a filter element material from the ink jet head.
Figure 36:
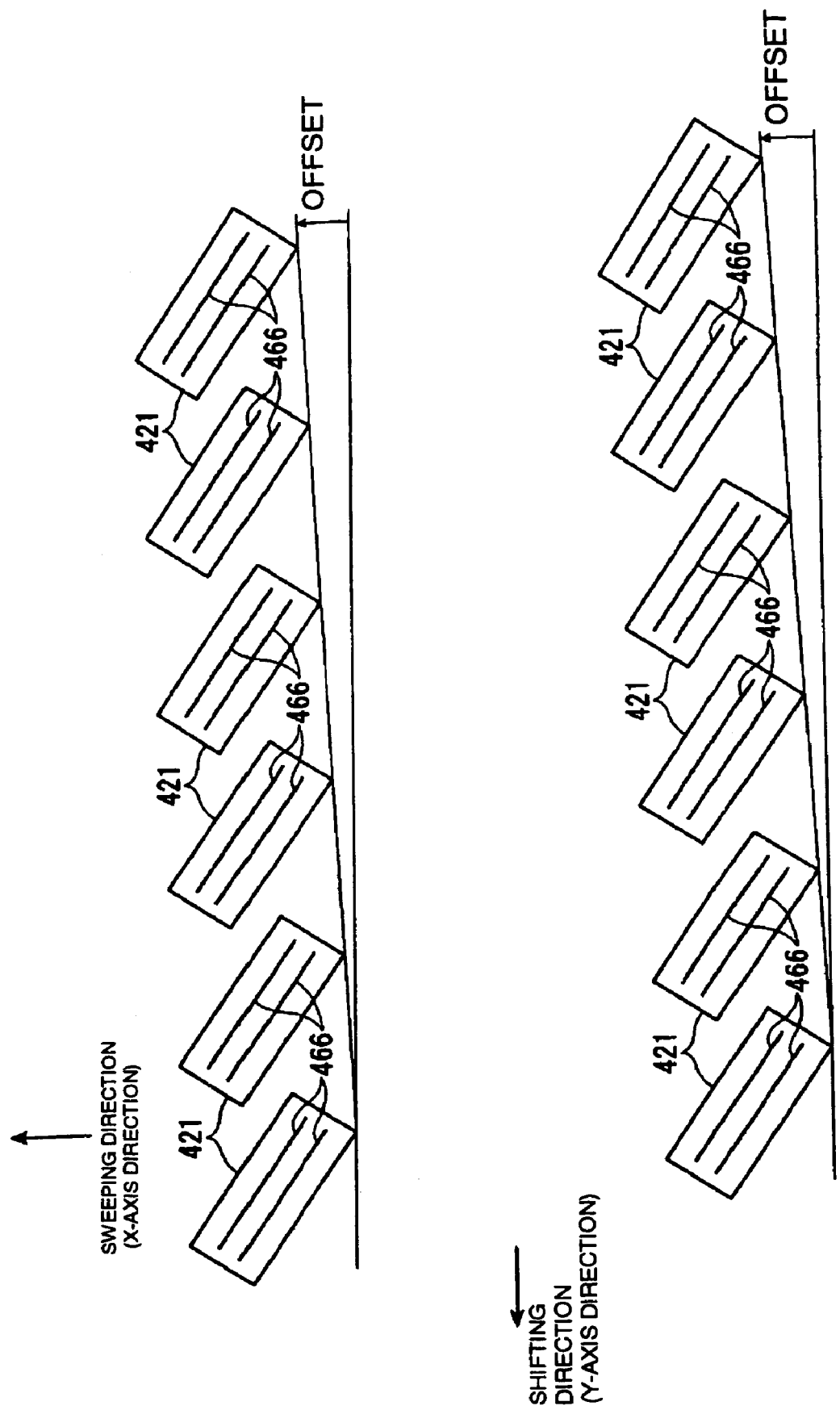
FIG. 36 is a schematic illustration of an arrangement of the ink jet heads.
Figure 37:
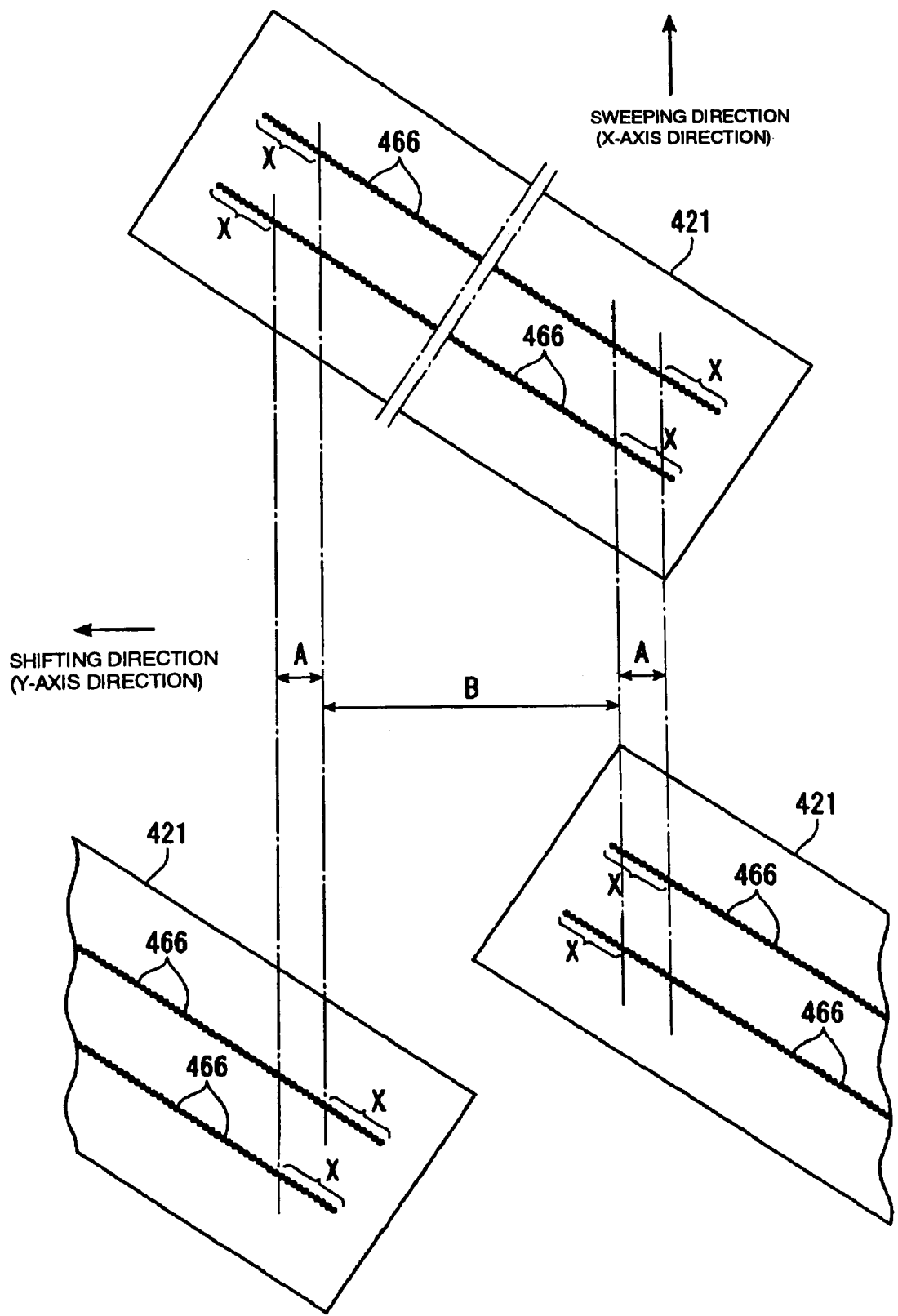
FIG. 37 is a fragmentary enlarged schematic illustration of an arrangement of the ink jet heads.

FIG. 33 is an exploded perspective view of the ink jet head. FIG. 34 is a schematic illustration of the section of the ink jet head discharging the filter element material. FIG. 34(A) shows the state before discharging the filter element material; FIG. 34(B) shows the state of discharging the filter element material by contraction of a piezoelectric vibrator; and FIG. 34(C) shows the state immediately after discharging the filter element material. FIG. 35 is a schematic illustration of the discharge quantity of the filter element material from the ink jet head. FIG. 36 is a schematic illustration of the arrangement of the ink jet heads. FIG. 37 is a fragmentary enlarged view of FIG. 36.

The ink jet head 421 has a substantial rectangular holder 451, as shown in FIG. 33. The holder 451 has piezoelectric vibrators in two lines, which may be 180 piezoelectric elements, in the longitudinal direction thereof. The holder 451 also has through holes 453 communicating with the passages 438 at the center of the longer sides thereof for passing the filter element material 13 acting as ink.

A synthetic resin elastic sheet 455 is integrally attached onto the upper surface of the holder 451, where the piezoelectric vibrators 452 are disposed, as shown in FIG. 33. The elastic sheet 455 has communicating holes 456 communicating with the through holes 453. The elastic sheet 455 also has engaging holes 458 to engage with positioning claws provided at substantially four corners on the upper surface of the holder 451, thus being positioned and integrally fixed onto the upper surface of the holder 451.

A passage-forming plate 460 is disposed on the upper surface of the elastic sheet 455. The passage-forming plate 460 has two lines of 180 nozzle slots 461 extending in the longitudinal direction such that the nozzle slots 461 corresponds to the respective piezoelectric vibrators 452 arranged in such a manner that the longitudinal direction thereof is parallel to the width direction of the holder 451: openings 462 spreading in the longitudinal direction of the holder 451 at one side of each line of the nozzle slots 461; and passing holes 463 continuously communicating with the communicating holes 456 of the elastic sheet 455. The passage-forming plate 460 also has engaging holes 458 to engage with positioning claws provided at substantially four corners on the upper surface of the holder 451, thus being positioned and fixed onto the upper surface of the holder 451 together with the elastic sheet 455.

Also, a substantially plane nozzle plate 465 is disposed on the surface of the passage-forming plate 460. The nozzle plate 465 has two lines of 180 substantially circular nozzles 466 extending in the longitudinal direction of the holder 451, having a length within 25.4 mm (1 inch) such that the nozzles 466 correspond to the respective nozzle slots 461. The nozzle plate 465 also has engaging holes 458 to engage with positioning claws 457 provided at substantially four corners on the upper surface of the holder 451, thus being positioned and integrally fixed to the upper surface of the holder 451 together with the elastic sheet 455 and the passage-forming plate 460.

The layers of the elastic sheet 455, the passage-forming plate 460, and the nozzle plate 465 define partitioned liquid reservoirs 467 in the openings 462 of the passage-forming plate 460, as shown in FIG. 34. The liquid reservoirs 467 communicated with the respective nozzle slots 461 through supply passes 468. Thus, ink jet head 421 discharges the filter element material 13 in an amount in the range of 2 to 13 pL, for example, 10 pL, at a rate of 7±2 m/s, from the nozzles by the operation of the piezoelectric vibrators 452 which pressurizes the inside of the nozzle slots 461. Specifically, by applying a predetermined pulsed voltage Vh to the piezoelectric vibrator 452 to expand and contract in the direction indicated by arrow Q, as sequentially shown in (A)

to (C) of FIG. 34, filter element material 13 is compressed and a predetermined amount of droplet 8 is discharged from the corresponding nozzle 466.

As described in the forgoing embodiment, the discharge quantity of the ink jet head 421 varies, and it becomes larger at both ends of the nozzle line, as shown in FIG. 35. Accordingly, it may be controlled such that some nozzles 466 having a discharge quantity variation of 5% or less, that is, 10 nozzles 466 at each end of the nozzle line, do not discharge the filter element material 13.

The head body 430 of the head unit 420 includes a plurality of head devices 433 each having the ink jet head 421, in an arrangement, as shown in FIGS. 27 to 31. The head devices 433 are arranged on the carriage 426 such that the alignments thereof are tilted in the sweeping direction, or X-axis direction, with respect to the shifting direction, or Y-axis direction, perpendicular to the sweeping direction, as shown in FIG. 36. For example, the head devices are arrayed in two lines, each constituted of six head devices 433 aligned to form a line slightly tilted with respect to the Y-axis direction. This is because, while the intervals between the ink jet heads 421 can not be reduced because of the narrow side length of the head devices 433 larger than that of the ink jet heads 421, the lines of the nozzles 466 need to be continuously arranged in the Y-axis direction.

In addition, the head devices 433 of the head body 430 are arranged such that, while the longitudinal direction of the ink jet heads 421 is tilted with respect to the X-axis direction, the connectors 441 of the head devices in one alignment are located at the opposite side with respect to the connectors 441 in the other alignment, in a substantially symmetrical manner with respect to a point. The tilt of each head device 433 is such that each line of the nozzles 466 extending in the longitudinal direction of the ink jet head 421 forms an angle of, for example, 57.1° with the X-axis direction.

Also, the head devices 433 are in a substantially staggered arrangement. In other words, the head devices 433 are arranged so as not to be in parallel with the aligning direction. Specifically, as shown in FIGS. 28 to 31 and 36, the ink jet heads 421 are arranged in two staggered alignments in the Y axis direction so that the lines of nozzles 466 of twelve ink jet heads 421 are continuously aligned in the Y-axis direction.

Details will be illustrated with reference to FIGS. 36 and 37. The lines of the nozzles 466 extending in the longitudinal direction of the ink jet head 421 are tilted with respect to the X-axis direction. The two lines of the nozzles 466 in one ink jet head 421 have regions A (A in FIG. 37) in which nozzles 466 within the tenth from the end of one nozzle line, which do not discharge the filter element material 13, are located between two lines extending in the X-axis direction from the eleventh nozzles 466 in both nozzle lines which discharge the filter element material 13. Hence, one ink jet head 421 has regions A which does not have two nozzles 466 on a line extending in the X-axis direction.

Therefore, in region B (B in FIG. 37) which have two nozzles 466 on a line extending in the X-axis direction, the head devices 433 are not arranged in parallel with each other in the X-axis direction as shown in FIGS. 36 and 37. In addition, region A in one alignment of the head devices 433, which has only one nozzle on a line extending in the X-axis direction, and region A in the other alignment of the head devices 433, which has only one nozzle on a line extending in the X-axis direction, are aligned in parallel with each other in the X-axis direction, and a combination of two ink jet heads 421 between two alignments ensures two nozzles 466 on a line extending in the X-axis direction. Hence, the ink jet heads 421 are arranged in a staggered manner such that, in the region having the ink jet heads 421, any position always has two nozzles 466 on a line extending in the X-axis direction. The nozzles in region x where the nozzles 466 do not discharge the filter element material 13 are not counted for two nozzles 466 on a line in the X-axis direction. Thus, two of the nozzles 466 swept in the X-axis direction to discharge ink are always on a line in that direction, and these two nozzles 466 discharge the ink to one position, as described later. If only one nozzle 466 discharges ink to form one element, the variation of the discharge quantity between the nozzles 466 may affect the variation of characteristics of the resulting elements and degrades the yield of the elements. By performing discharge from different nozzles 466 to form one element, the variation of discharge quantity between the nozzles 466 can be dispersed and, thus, the characteristics can be uniform between the elements and the yield can be increased.

The ink supply portion 431 has a pair of flat mounting plates 471 disposed corresponding to the two lines of the head bodies 430 and a plurality of supply bodies 472 mounted on the mounting plates 471, as shown in FIGS. 28 to 31. Each supply body 472 has a substantially long thin cylindrical piston 474. The piston 474 is installed with a fixture 473 so as to extend through the mounting plate 471 and to be movable in the axis direction. The piston 474 of the supply body 472 is urged in the direction from the mounting plate 471 to the head device 433 by a coil spring 475 or the like. FIG. 28 shows only one of the two alignments of ink supplies 431 corresponding to the alignments of the head devices 433 and the other is omitted for description convenience.

The piston 474 has a flange 476 at the end thereof at the head device 433 side. The flange 476 protrudes from the periphery of the piston 474 in a brim-like manner, and the end surface of the flange 476 is pressed to the sealing member 449 of the ink introducer 443 of the head device 433, opposing the urge of the coil spring 475. Also, a joint 477 is provided at the other end of the piston opposite the end having the flange 476 of the piston 474. One end of the supply pipe 478 through which the filter element material 13 flows is connected to the joint 477, as schematically shown in FIG. 27.

As described above, the supply pipe 478 are connected to the shifting driver 427 so as not to affect the movement of the head unit 420, as schematically shown in FIG. 27. It runs from the shifting driver 427 to the substantially middle position between the two alignments of the ink supply upside of the head unit 420 and is then divided in a radial manner to reach the joints 477 of the ink supply portions 431, as schematically indicated by dotted chain lines in FIGS. 28 to 30.

Then, each ink supply portion 431 supplies the filter element material 13 to the ink introducer 443 of the corresponding head device 433 through the supply pipe 478. The filter element material 13 supplied to the ink introducer 443 is further sent to the ink jet head 421, and appropriately discharged in a droplet 8 form from the nozzles 466 of the electrically controlled ink jet head 421.

(Operation During Color Filter Manufacturing)

Figure 39:
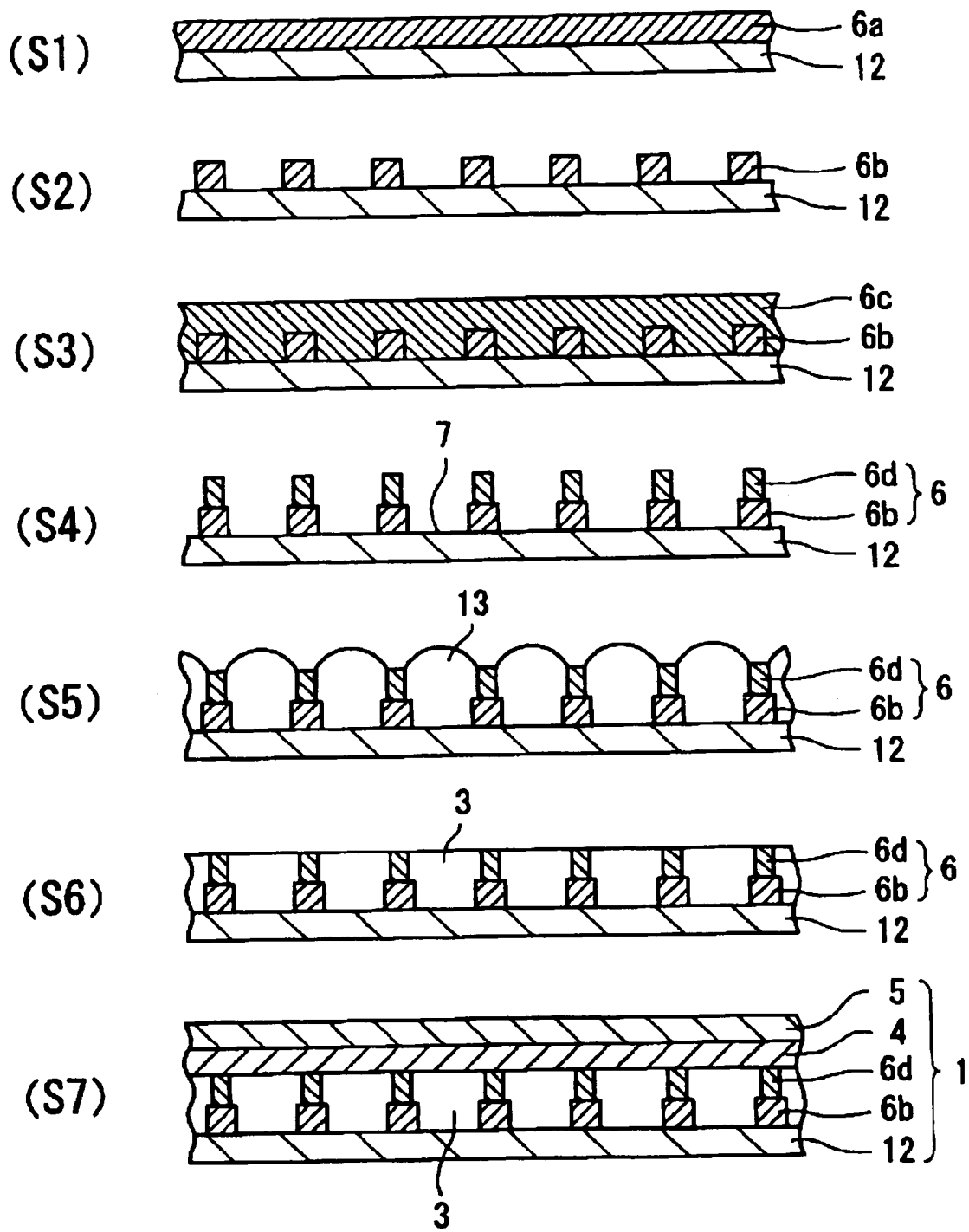
FIG. 39 is a sectional view showing steps of manufacturing the color filter.

The operation when the color filter 1 is manufactured using the color filter manufacturing device according to the embodiment will now be illustrated with reference to drawings. FIG. 39 is a sectional view showing the steps of manufacturing the color filter 1 using the above-described color filter manufacturing device.

First, the surface of the mother substrate 12, which may be a transparent non-alkaline glass substrate having a thickness of 0.7 mm, a length of 38 cm, and a width of 30 cm, is washed with a cleaning fluid which is hot concentrated sulfuric acid containing 1% by mass of aqueous hydrogen peroxide. After cleaning, the mother substrate 12 is rinsed with pure water and dried in the air to prepare a clean surface of the substrate. On the surface of the mother substrate 12, for example, a chromium film is deposited at an average thickness of 0.2 μm by sputtering to form a metal layer 6a (Step S1 in FIG. 39).

After the mother substrate 12 is dried at 80° C. for 5 minutes on a hot plate, a photoresist layer, not shown in the drawing, is deposited on the surface of the metal layer 6a by, for example, spin-coating. A mask film, not shown in the drawing, in which a desired matrix pattern is drawn is brought into tight contact with the surface of the mother substrate 12 and is then exposed to ultraviolet light. The exposed mother substrate 12 is immersed in an alkaline developer containing, for example, 8% by mass of potassium hydroxide to remove the unexposed regions of the photoresist layer, and thus the photoresist layer is patterned. Then, the exposed metal layer 6a is etched to be removed with an etchant mainly containing, for example, hydrochloric acid. Thus, a light-shielding layer 6b having a predetermined matrix pattern is obtained to serve as a black matrix (step S2 in FIG. 39). The light-shielding layer 6b has a thickness of about 0.2 μm and a width of about 22 μm.

A transparent acrylic photosensitive negative resin composition 6c is further applied on the mother substrate 12 having the light-shielding layer 6b by, for example, spin-coating (step S3 in FIG. 39). The mother substrate 12 coated with the photosensitive resin composition 6c is prebaked at 100° C. for 20 minutes, and is subsequently exposed to ultraviolet light using a mask film, not shown in the drawing, in which a predetermined mask pattern is drawn. Then, the unexposed region of the resin composition is removed by development with an alkaline developer as in above. After being rinsed with pure water, the mother substrate 12 is dried by spinning. For a final drying, after-baking is performed at, for example, 200° C. for 30 minutes to cure the resin portions sufficiently, and thus a bank layer 6d is formed. The resulting bank layer 6d has a thickness of about 2.7 μm and a width of about 14 μm. The bank layer 6d and the light-shielding layer 6b form barrier walls 6 (step S4 in FIG. 39).

The light-shielding layer 6b and the bank layer 6d define filter-element-forming regions 7 in which colored layer will be formed, by partitioning. In order to improve the ink-wettability of the filter-element-forming regions 7 (particularly exposed surfaces of the mother substrate 12), dry-etching, or plasma polymerization, is performed. For example, a high voltage is applied to a gas mixture which is helium containing 20% of oxygen so that an etching spot is formed by plasma polymerization. The mother substrate 12 is passed under the etching spot, thus being subjected to pretreatment.

Then, filter element materials of red (R), green (G), and blue (B) are introduced, that is, discharged, by ink jetting to the filter-element-forming regions 7 of the pretreated mother substrate 12, separated by the barrier walls 6 (step 5 in FIG. 39).

In order to discharging the filter element materials by ink jetting, the head unit 420 are assembled in advance. Also, the quantity of the filter element materials 13 discharged from each nozzle 466 of the ink jet heads 421 is set a predetermined amount, for example, 10 pL, in the liquid discharge devices 405R, 405G, and 405B. On the other hand, the barrier walls 6 are formed in a grid pattern on one surface of the mother substrate 12 in advance.

The mother substrate 12 pretreated as described above is carried to the R color liquid discharge device 405 R by a carrier robot, not shown in the drawing, and placed on the pedestal in the liquid discharge device 405R. The mother substrate 12 on the pedestal is fixed by, for example, aspiration. The pedestal supporting the mother substrate 12 is moved to a predetermined position by the sweeping driver 425 while the imaging devices, such as various types of camera, observe the position of the mother substrate 12. The head unit 420 is appropriately shifted by the shifting driver 427, and the resulting position is observed. Then, the head unit 420 is shifted in the shifting direction, and the discharge state of the nozzles 466 are checked by the missing-dot detector 487 to ensure that no discharge failure occurs. Then, the head unit 420 is moved to the initial position.

Then, the mother substrate 12 supported on the pedestal moved by the sweeping driver 425 in the X direction. Thus while the head unit 420 is relatively swept over the mother substrate 12, predetermined nozzles 466 of the ink jet head 421 appropriately discharge the filter element material 13 to fill the recessed regions partitioned by the barrier walls 6 of the mother substrate 12. The discharge from the nozzles 466 is controlled by a control device, not shown in the drawing, such that some nozzles 466 located in predetermined regions X, shown in FIG. 37, at both ends of the nozzle lines, which may be 10 nozzles 466 from each end of the nozzle lines, do not discharge the filter element material 13 and the other 160 nozzles in the middle of the nozzle lines which can offer a relatively uniform discharge quantity discharge the filter element material 13.

There are two nozzles 466 on a line extending in the sweeping direction, that is, a sweeping line and each nozzle discharges two-dot equivalent, wherein one dot refers to two droplets 8. Therefore, one recessed portion is filled with eight droplets 8 discharged from two nozzles 466. The missing-dot detector 487 checks whether missing dot has occurred, every series of sweeping.

When no missing dot is detected, the head unit 420 is shifted a predetermined distance in the shifting direction, and discharge of the filter element material 13 is repeated while the pedestal supporting the mother substrate 12 is moved in the sweeping direction. Thus, the filter elements 3 are formed in predetermined filter-element-forming regions 7 in a predetermined color filter-forming region 11.

The mother substrate 12 onto which the R-color filter element material 13 is discharged is taken out from the liquid discharge device 405R by the carrier robot, not shown in the drawings, and is heated at 120° C. for 5 minutes in a multi-step baking oven, not shown in the drawings, to dry the filter element material 13. After drying, the mother substrate 12 is taken out from the multi-step baking oven by the carrier robot and carried while being cooled down. Then, the mother substrate 12 is carried from the liquid discharge device 405R to the G-color liquid discharge device 405G and subsequently the B-color liquid discharge device 405B, and the G- and B-color filter element materials 13 are discharged in predetermined filter-element-forming regions 7, as in the R-color filter element formation. In this instance, one of the three types of filter element material is discharged in a sweeping direction different from that for the other two types of filter element materials by, for example, changing the orientation of the mother substrate 12, as described above. The mother substrate 12 onto which the three types of filter element material 13 are discharged and dried is subjected to heat treatment to cure and fix the filter element material 13 (step 6 in FIG. 39).

The substantially entire surface of the mother substrate 12 having the completed filter elements 3 is covered with a protective layer 4. Furthermore, an ITO electrode layer 5 is patterned on the surface of the protective layer 4. Then, the mother substrate 12 is cut into pieces by the color-filter-forming region 11 to form a plurality of color filters 1 (step 7 in FIG. 39). The resulting substrate 12 having the color filter 1 is used as one of the pair of substrates in a liquid crystal device as shown in FIG. 18, as described in the embodiment.

(Effects of the Color Filter Manufacturing Device)

In addition to the effects described in the foregoing embodiments, the present embodiment shown in FIGS. 27 to 39 have the following effects.

In the present embodiment, a plurality of ink jet heads 421 in which a plurality of nozzles 466 for discharging the filter element material 13 acting as liquid ink are arranged on the surface thereof oppose an object, that is, the mother substrate 12, with a predetermined space therebetween. While these ink jet heads 421 are relatively moved along the surface of the mother substrate 12, an identical type of filter element material 13 is discharged onto the surface of the mother substrate 12 from the nozzles 466 of the plurality of ink jet head 421. As a result, the filter element material 13 can be discharged in a wide area of mother substrate 12 using, for example, ink jet heads 421 having substantially the same specifications. This means that it is not necessary to use a special ink jet head having a large length. Instead of the special product, a plurality of standardized products can be employed, and costs are reduced. Such a long ink jet head has a low yield, and thus expensive. In contrast, short ink jet head 421 has a high yield. In the present invention, a plurality of short ink jet heads substantially constitute a long ink jet head, thus remarkably reducing costs.

In addition, by appropriately selecting the arrangement, that is, the alignment or the number, of the ink jet heads 421 or the number of or intervals between the discharge nozzles 466 (intervals may be adjusted to correspond to the pitch of pixels by using the nozzles 466 at intervals of one or several nozzles), the filter element material 13 can be discharged to desired regions according to the size, pitch of the pixels, arrangement, and the like of the color filter 1. Thus, the present invention enhances the versatility of ink jet heads.

By using a plurality of ink jet heads 421 having substantially the same shape and by appropriately arranging them, a liquid material can be discharged to desired regions, even if only one type of inkjet heads is used. Thus, the structure of equipment is simplified, manufacturing efficiency can be increased, and further costs can be reduced.

Also, by using the ink jet head 421 having nozzles 466 aligned in a line at substantially identical intervals, a desired structure having a regularly arranged pattern, such as striped arrangement, mosaic arrangement, or delta arrangement, can be drawn.

In the present embodiment, a plurality of ink jet head 421 are relatively moved along the surface of the mother substrate 12 in a direction parallel to the direction of the substantially linear alignment of the nozzles 466 which is tilted so as to intersect the sweeping direction in which the ink jet heads 421 should be moved. Therefore, the alignment direction of the nozzles 466 of the plurality of the ink jet heads 421 is tilted with respect to the sweeping direction in which the ink jet heads 421 are moved along the surface of the mother substrate 12. As a result, the pitch of the discharged filter element material 13 becomes smaller than that between the nozzles. Thus, an excellent display device displaying finer images can be achieved when the resulting mother substrate 12 onto which the filter element material 13 has been discharged is used for electro-optic display devices, such as liquid crystal panels. In addition, interference between the adjacent ink jet heads 421 can be prevented and, thus, miniaturization can be easily achieved. By selecting the tilt angle, drawing dot pitches can be appropriately set and, thus, versatility is increased.

Furthermore, in the structure of the ink jet head 421 in which the nozzles 466 are aligned in a line at substantially identical intervals, by aligning the nozzles 466 in the longitudinal direction of the ink jet head 421, the ink jet head 421 can be miniaturized. Thus, interferences between the adjacent ink jet heads 421 and between the ink jet head and other parts can be prevented.

By arranging a plurality of the ink jet heads 421 on the carriage 426 to structure the head unit 420 such that the alignments of the nozzles 466 are parallel to one another, a plurality of droplets of an identical liquid material can be easily discharged in one region without using a special ink jet head having a large length. Also, different ink jet heads 421 can repeatedly discharge the filter element material 13 to one region. Consequently, the discharge quantity for each region can be easily uniformized and, thus, stable, excellent drawing can be achieved.

By tilting the plurality of ink jet head 421 such that the longitudinal direction thereof intersects the sweeping direction X, and by arranging the nozzles 466 such the alignments of the nozzles 466 extend to a direction different from that of the longitudinal direction of the ink jet head 421 so that all the alignments of the nozzles 466 are parallel to one another, the discharge area can be easily increased without preparing a special ink jet head having a large length. In addition, by tilting the alignment direction of the nozzles 466 so as to intersect the sweeping direction, the pitch of the discharged filter element material 13 becomes smaller than that between the nozzles 466 without interference between the adjacent ink jet heads 421. Thus, finer images can be achieved when the resulting mother substrate 12 onto which the filter element material 13 has been discharged is used for display devices or the like. By selecting the tilt angle, drawing dot pitches can be appropriately set and, thus, versatility is increased.

By arranging the plurality of inkjet heads 421 in a substantially staggered manner in a plurality of lines, for example, two lines, the filter element material 13 can be continuously, satisfactorily discharged and thus drawn without interference between the adjacent ink jet heads 421 or without forming regions not discharging the filter element material 13, between the ink jet heads, even if commercially available ink jet head 421 are used, instead of a special ink jet head 421 having a large length.

In the present embodiment, the plurality of ink jet heads 421 in which a plurality of nozzles 466 for discharging the filter element material 13 acting as a liquid material, such as ink are arranged on the surface thereof oppose an object, that is, the mother substrate 12, with a predetermined space therebetween. While these ink jet heads 421 are relatively moved along the surface of the mother substrate 12, the filter element material 13 is discharged such that a plurality of, for example, two, nozzles 466 on a line extending in the relative direction of the movement discharge the material. As a result, two different nozzles 466 can repeatedly discharge the filter element material 13 to one region. Therefore, even if there is a variation of the ink discharge quantity between the plurality of nozzles 466, the quantity of discharged filter element material 13 can be uniformized, and, thus, nonuniformity can be prevented and horizontally uniform discharge can be achieved. Thus, an electro-optic device having two-dimensionally uniform, satisfactory characteristics can be achieved.

In the present embodiment, the plurality of inkjet heads 421 in which a plurality of nozzles 466 for discharging the filter element material 13 are arranged on the surface thereof oppose an object, that is, the mother substrate 12, with a predetermined space therebetween. While these ink jet heads 421 are relatively moved along the surface of the mother substrate 12, the filter element material 13 is discharged such that some nozzles located in predetermined regions X at both ends of the alignments of the nozzles 466, which may be 10 nozzles from each end of the nozzle alignments, do not discharge the filter element material 13 and the other nozzles in the middle of the nozzle alignment discharge the filter element material 13. Since ten nozzles 466 from each end of the nozzle alignments whose discharge quantity is particularly larger do not discharge the filter element material 13 and the other nozzles 466 in the middle of the alignment whose discharge quantity is relatively uniform discharge the filter element material 13, horizontally uniform discharge can be performed on the mother substrate 12, thus resulting in a color filter 1 having horizontally uniform quality. Consequently, by using this color filter 1 for an electro-optic display device, excellent images can be displayed.

Also, the nozzles 466 having a discharge quantity 10% or more larger than an average discharge quantity are not allowed to discharge the filter element material 13. Consequently, nonuniformity does not occur, even if functional liquid materials, such as EL materials and functional liquid materials containing charged particles for electrophoretic device, as well as the filter element material 13 for the color filter 1 are used as a liquid material. Thus, Satisfactory characteristics for electro-optic devices, such as liquid crystal devices and EL devices, can be ensured.

Since the filter element material 13 is discharged in an amount of the average discharge quantity ±10% from the nozzles 466, relatively uniform discharge quantity is ensured and a uniform amount of the filter element material 13 can be discharged onto the surface of the mother substrate 12. Thus, an electro-optic device having excellent characteristic can be achieved.

In addition, the missing-dot detector 487 observes the discharge of the filter element material 13 from the nozzles 466, and, therefore, unevenness of the discharged filter element material 13 can be prevented. Thus, stable, satisfactory drawing of the liquid material can be ensured by such discharge.

The missing-dot detector 487 has an optical sensor which detects the passage of the filter element material 13 from a direction intersecting the direction in which the filter element material 13 is discharged. Therefore, the stable state of the discharged filter element material 13 can be recognized by a simple structure even during operation. Thus, unevenness of the discharged filter element material 13 can be prevented to ensure stable, satisfactory drawing of the filter element material 13.

The missing-dot detector 487 observes the discharge of the filter element material 13 before and after the nozzles 466 discharge the filter element material 13 onto the mother substrate 12. Therefore, the state of the discharged filter element material 13 can surely be recognized and, thus, missing-dots can be reliably prevented to ensure stable, satisfactory drawing of the filter element material 13. This observation may be performed either before or after the discharge.

The missing-dot detector 487 is disposed at a head unit 420 sweeping direction side. Therefore, the distance through which the head unit 420 moves so that the state of the discharged filter element material 13 is observed can be reduced, and the head unit 420 can maintain the movement in the sweeping direction. Thus, missing-dots can be efficiently detected with a simple structure.

The ink jet heads 421 are disposed in two lines in a symmetrical manner with respect to a point. Consequently, the supply pipes 478 for supplying the filter element material 13 can be bundled up to the vicinity of the head units 420, and thus, ease of assembling and maintenance can be ensured. The electric wires 442 for controlling the ink jet heads 421 run from both sides of the head units 420, thus preventing the generation of electric noise to ensure stable, satisfactory drawing.

Each ink jet head 421 is disposed at one end of the rectangular print board 435 and the connector 441 is disposed at the other end. Consequently, a plurality of ink jet head 421 can be arranged in a line without interference of connectors 441, and, thus, miniaturization can be achieved. In addition, the region where the nozzles 466 in the sweeping direction do not exist is not formed and a continuous alignment of the nozzles 466 can be obtained without using a special ink jet head having a large length.

The connector 441 is disposed at the opposite side in a symmetrical manner with respect to a point. Consequently, electric noises are eliminated and, thus, stable, satisfactory drawing can be achieved.

Similar effects to these effects in the embodiment can be obtained in the other embodiments described above, as long as they have the same structure.

[Display Device (Electro-optic Device) Including EL Elements and Method for Manufacturing the Same]

A display device (electro-optic device) and a method for manufacturing the device will now be illustrated with reference to drawings. In this embodiment, an active matrix display device including EL display elements is described for an electro-optic display device. First, the structure of the display device to be manufactured will be illustrated before a description of the method for manufacturing the display device.

(Structure of the Display Device)

Figure 40:
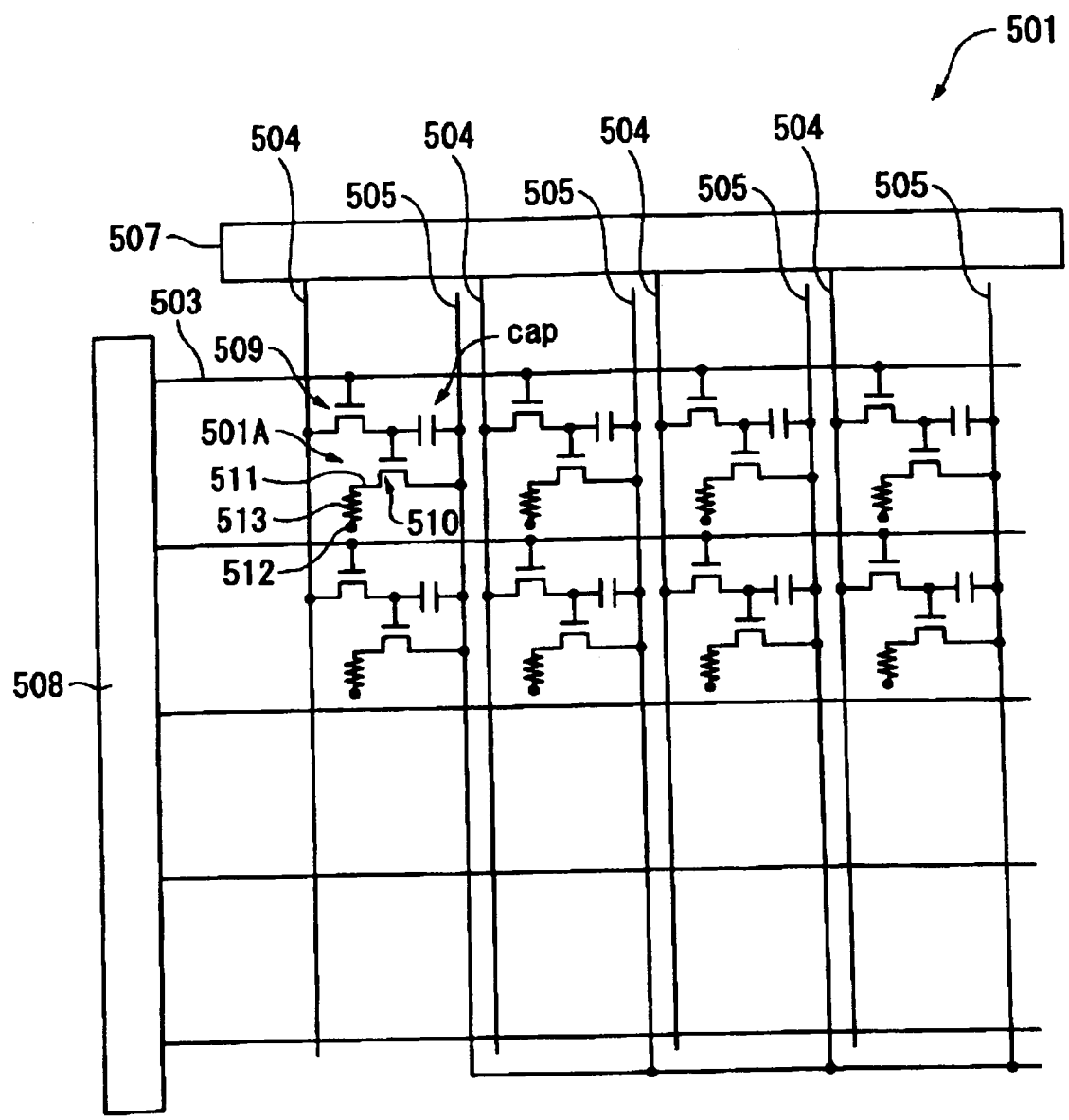
FIG. 40 is a circuit diagram partially showing a display device using EL display elements according to an electro-optic device of the present invention.

FIG. 40 is an equivalent circuit showing some of the organic EL devices included in an electro-optic device. FIG. 41 is an enlarged plan view of the plan structure of a display dot (pixel region) in a display device. The display device is an active matrix display device 501 using EL display devices, or EL devices, as shown in FIG. 40. The display device 501 includes a plurality of scanning lines 503, a plurality of signal lines 504 extending to intersect the scanning lines 503, and common power lines 505 extending in parallel with the signal lines 504, on a transparent display substrate 502. Pixel regions (display dots) 501A are disposed at the intersections of the scanning lines 503 and the signal lines 504.

A data driving circuit 507 including a shift register, a level shifter, a video line, and an analog switch is disposed for the signal lines 504. A scanning line driving circuit 508 including a shift register and a level shifter is disposed for the scanning lines 503. Each pixel region 501A has a switching thin-film transistor 509 whose gate electrode receives scanning signals supplied from the corresponding scanning line 503, a storage capacitor cap for storing a image signal supplied from the corresponding signal line 504 through the switching thin-film transistor 509, a current thin-film transistor 510 whose gate electrode receives the image signal supplied from the storage capacitor cap, a pixel electrode 511 for receiving a driving current from the common power line 505 when the pixel electrode 511 is connected to the common power line 505 through the current thin-film transistor 510, and a luminescent element 513 between the pixel electrode 511 and a reflection electrode 512.

When the switching thin-film transistor 509 is activated by driving the scanning line 503, the electric potential of the signal line 504 at that time is held in the storage capacitor cap. According to the state of the storage capacitor cap, the on/off state of the current thin-film transistor 510 is determined. Thus, a current flows from the common power line 505 to the pixel electrode 511 through the channel of the current thin-film transistor 510, and further flows to the reflection electrode 512 through the luminescent element 513. Thus, the luminescent element 513 emits light according to the current.

As shown FIG. 41, in which the reflection electrode 512 and the luminescent element 513 are omitted from the pixel region 501A, the four sides of the rectangular pixel electrode 511 in plan view is surrounded by the signal line 504, the common power line 505, the scanning line 503, and another scanning line 503, not shown in the drawing, for another pixel electrode 511.

Steps of a process for manufacturing an active matrix display device using the EL display devices will now be described. FIGS. 42 to 44 sectional views showing the steps of a process for manufacturing an active matrix display device using the EL display elements.

Figure 42A:
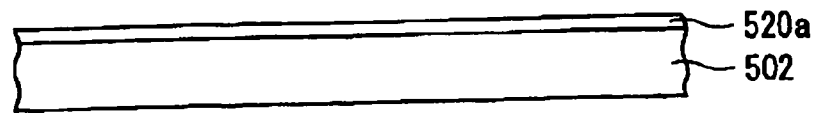
FIG. 42 is a sectional view showing steps of pretreatment in a process of manufacturing the display device.

First, as shown in FIG. 42(A), a silicon oxide protective base layer, not shown in the drawing, is deposited at a thickness of about 2000 to 5000 Å on the transparent display substrate 502, if necessary, by plasma CVD using a material gas, such as tetraethoxysilane (TEOS) or oxygen. Next, the display substrate 502 is heated to about 350° C., and a semiconductor layer 520a, which is an amorphous silicon film, is deposited at a thickness of about 300 to 700 Å on the surface of the protective base layer by plasma CVD. Then, the semiconductor layer 520a is crystallized into a polysilicon layer by laser annealing, solid phase deposition, or the like. In laser annealing, a line beam having a length of 400 nm is used at an output intensity of about 200 mJ/cm² with, for example, an excimer laser. The line beam is scanned such that the area thereof in the width direction having an intensity equivalent to 90% of the peak value of the laser intensity overlaps from one region to another.

Figure 42B:
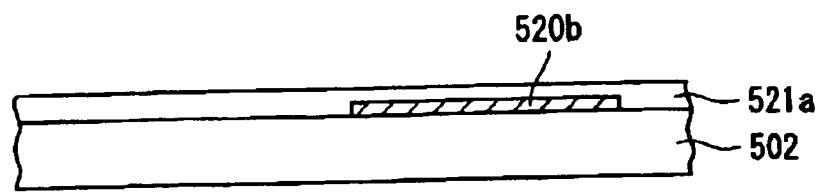

Then, as shown in FIG. 42(B), the semiconductor layer 520a is patterned in an island form to form the semiconductor layer 520b. A silicon oxide or nitride gate insulating layer 521a is deposited at a thickness of about 600 to 1500 Å on the surface of the display substrate 502 having the semiconductor layer 520b by plasma CVD using a material gas, such as TEOS or oxygen gas. The semiconductor layer 520b is intended to serve as a channel region and source/drain regions of the current thin-film transistor 510, and it is also intended to serve as a channel region and source/drain regions of the switching thin-film transistor 509 in a sectional view at a different position. Hence, the switching thin-film transistor 509 and the current thin-film transistor 510 are formed at one time by the same procedure in the process shown in FIGS. 42 to 44. Only the current thin-film transistor 510 will therefore be described in the following, and the description for the switching thin-film transistor 509 is omitted.

Figure 42C:
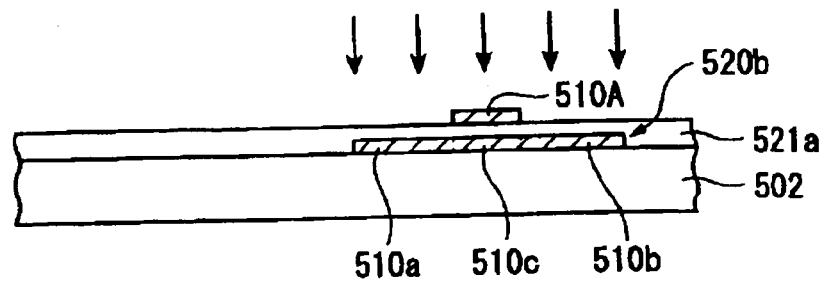

Then, a conductive layer is formed of a metal, such as aluminum, tantalum, molybdenum, titanium, or tungsten by sputtering, followed by patterning to form the gate electrode 510A shown in FIG. 41, as shown in FIG. 42(C). In this state, high-temperature phosphorus ions are implanted and, thus, source/drain regions 510a and 510b are formed in the semiconductor layer 520b for the gate electrode 510A by self aligning. The region into which dopant is implanted results in the channel region 510c.

Figure 42D:
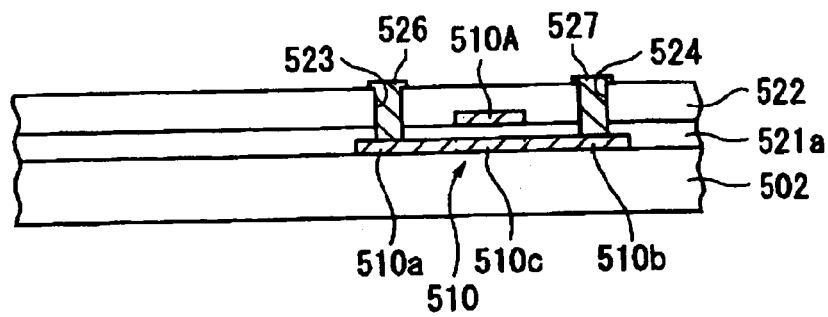

Turning to FIG. 42(D), after an insulating interlayer 522 is deposited, contact holes 523 and 524 are formed, followed by filling junction electrodes 526 and 527 in the contact holes 523 and 524.

Figure 42E:
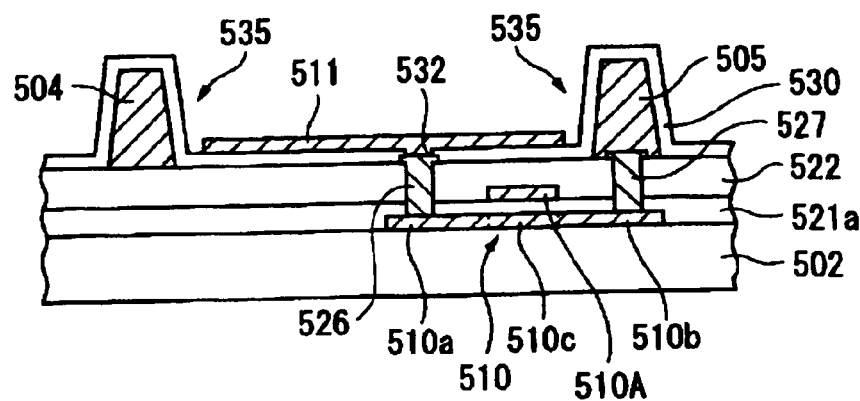

Then, as shown in FIG. 42(E), the signal line 504, the common power line 505, and scanning line 503 (not shown in FIG. 42) are formed on the insulating interlayer 522. The signal line 504, the common power line 505, and the scanning line 503 are formed to a sufficiently large thickness without considering the thickness required for wiring. Preferably, the thickness of the lines is about 1 to 2 µm. The junction electrode 527 and the lines may be formed in the same step. In this instance, the junction electrode 526 is formed of ITO described later.

Then, an insulating interlayer 530 is deposited so as to cover the surfaces of the wires and a contact hole 532 is formed at a position corresponding to the junction electrode 526. An ITO layer is deposited to fill the contact hole 532, and the ITO layer is patterned to form the pixel electrode 511 electrically connected to the source/drain regions 510a, in a predetermined regions surrounded by the signal line 504, the common power line 505, and the scanning lines 503.

Optical materials will be selectively disposed in the region between the signal line 504 and the common power line 505 in FIG. 42(E). The boundaries between this region and its surroundings have steps 535 because of the signal line 504 and the common power line 505. Specifically, the region between the signal line and the common power line is lower than its surroundings, thus forming U-shaped steps 535.

Figure 43A:
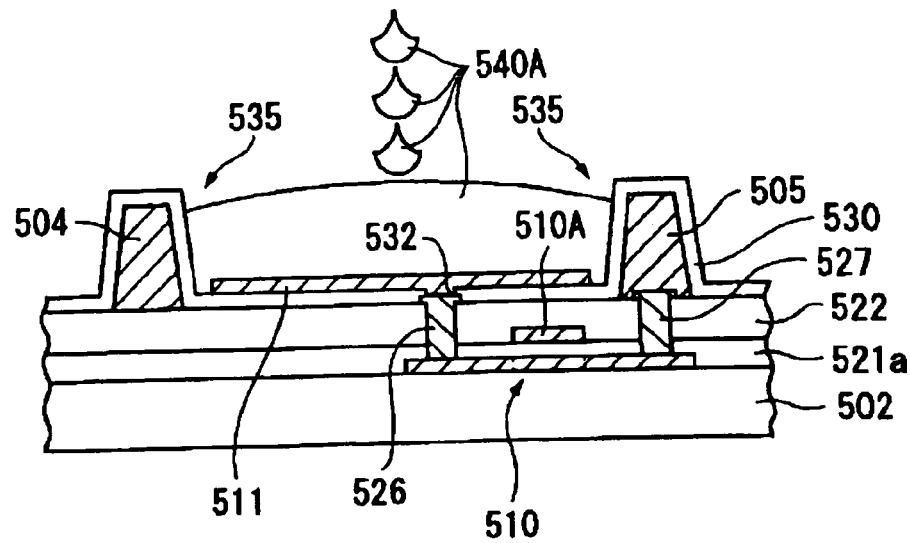
FIG. 43 is a sectional view showing steps of discharging an EL material in a process of manufacturing the display device.

Next, a functional liquid material, or EL material, is discharged onto the display substrate 502 treated as above by ink jetting. Specifically, as shown in FIG. 43(A), a luminescent material 540A, acting as the functional liquid precursor, solved in a solvent is discharged for forming a hole injection layer 513A which will be a lower layer of the luminescent element 140, onto the upturned surface of the display substrate 502 by ink jetting using the device according to the foregoing embodiment. Thus, the luminescent material 540A is selectively applied to the region between the steps 535.

Exemplary optical materials 540A for the hole injection layer 513A include polyphenylene vinylene, whose precursor is polytetrahydrothiophenylphenylene, 1,1-bis-(4-N,N-ditolylaminophenyl)cyclohexane, and tris(8-hydroxyquinolinol)aluminum.

The liquid optical material 540A has a high fluidity and tends to horizontally spread. However, the steps 535 surrounding the region onto which the optical material 540A is discharged prevents the optical material 540A from spreading over the steps 535 unless the discharge quantity per time is excessively large, as in the filter element material 13 discharged onto the region surrounded by the barrier walls in the foregoing embodiment.

Figure 43B:
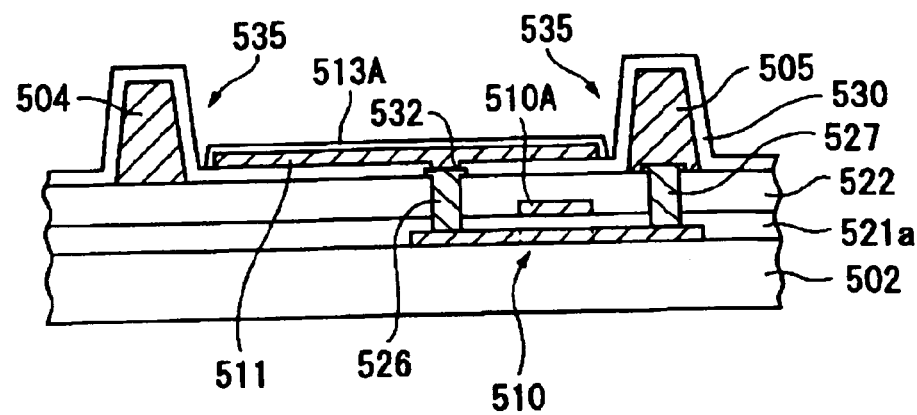
Figure 43C:
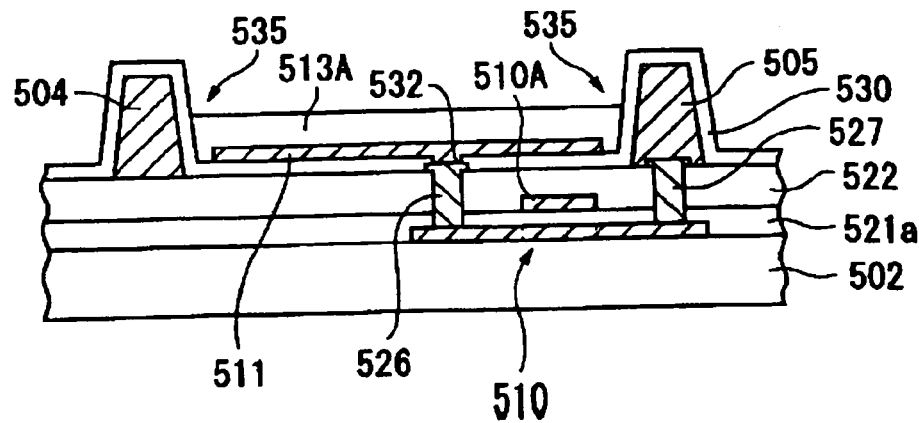

The optical material 540A is heated or exposed to light to vaporize the solvent, thus forming the solid, thin hole injection layer 513A on the pixel electrode 511, as shown in FIG. 43(B). The steps shown in (A) and (B) of FIG. 43 are repeated several times so that the hole injection layer 513A has a sufficient thickness, as shown in FIG. 43(C). If a plurality of droplets are discharged to form the hole injection layer, by sweeping the head in at least two different directions (for example, perpendicular to each other) to discharge the optical material, unevenness of the material can be reduced.

Figure 44A:
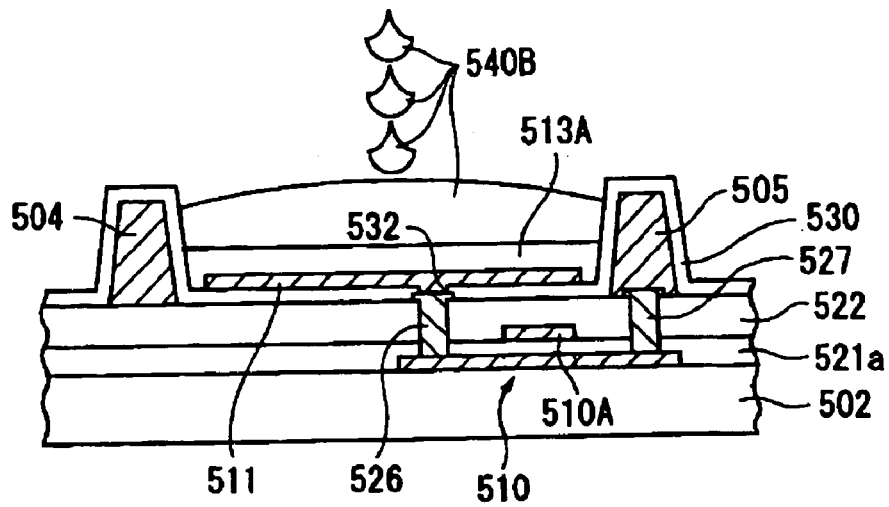
FIG. 44 is a sectional view showing steps of discharging an EL material in a process of manufacturing the display device.

Next, as shown in FIG. 44(A), an organic fluorescent optical material 540B, acting as a functional liquid, solved in a solvent is discharged for forming an organic semiconductor layer 513B which will be the upper layer of the luminescent element 513, onto the upturned surface of the display substrate 502 by ink jetting using the device according to the foregoing embodiment. Thus, the organic fluorescent optical material 540B is selectively applied to the region between the steps 535. This optical material 540B is also prevented from spreading over the steps 535, as in the optical material 540A.

Exemplary optical materials 540B for the organic semiconductor layer 513B include cyanopolyphenylene vinylene, polyphenylene vinylene, polyalkylphenylene, 2,3,6,7-tetrahydro-11-oxo-1H,5H,11H-(1)benzopyrano[6,7,8-ij]-quinolizine-10-carboxylic acid, 1,1-bis-(4-N,N-ditolylaminophenyl)cyclohexane, 2-(13,4'-dihydroxyphenyl)-3,5,7-trihydroxy-1-benzopyrylium perchlorate, tris(8-hydroxyquinolinol)aluminum, 2,3,6,7-tetrahydro-9-methyl-11-oxo-1H,5H,11H-(1))benzopyrano[6,7,8-ij]-quinolizine, aromatic diamine derivatives (TDP), oxadiazol dimer (OXD), oxadiazole derivatives (PBD), distyrylarylene derivatives (DSA), quinolinol metal complex, beryllium-benzoquinolinol complex (Bebq), triphenylamine derivatives (MTDATA), distyryl derivatives, pyrazoline dimer, rubrene, quinacridone, triazole derivatives, polyphenylene, polyalkylfluorene, polyalkylthiophene, azomethine zinc complex, porphyrin zinc complex, and benzoxazole zinc complex, phenanthroline europium complex.

Figure 44B:
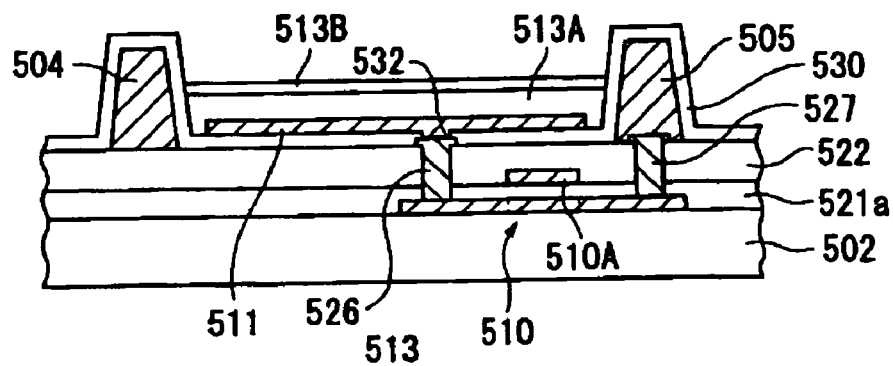
Figure 44C:
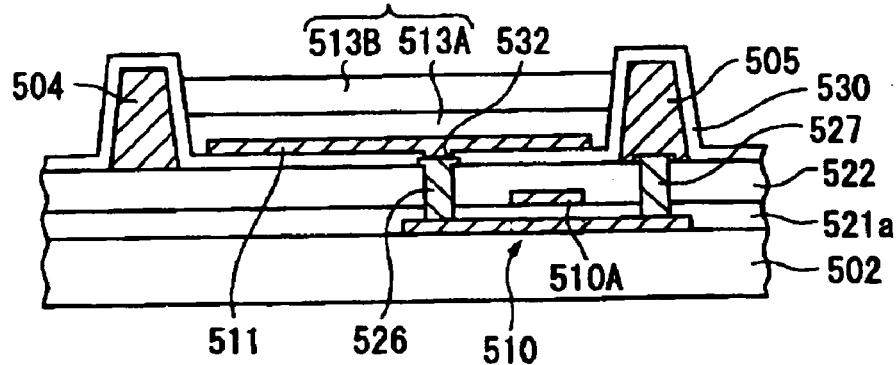

Next, the optical material 540B is heated or exposed to light to vaporize the solvent, thus forming the solid, thin organic semiconductor layer 513B on the hole injection layer 513A, as shown in FIG. 44(B). The steps shown in (A) and (B) of FIG. 44 are repeated several times so that the organic semiconductor layer 513B has a sufficient thickness, as shown in FIG. 44(C). If a plurality of droplets are discharged to form the organic semiconductor layer, or EL layer, by sweeping the head in at least two different directions (for example, perpendicular to each other) to discharge the optical material, unevenness of the material can be reduced.

Figure 44D:
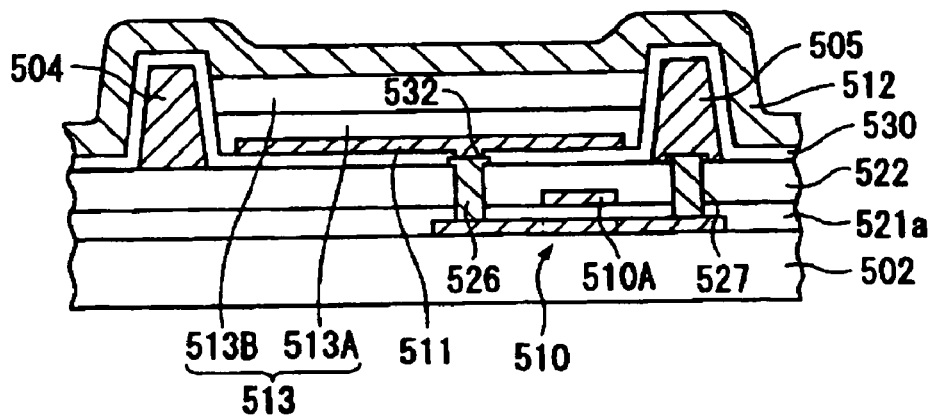

The hole injection layer 513A and the organic semiconductor layer 513B constitute the luminescent layer 513. Finally, the reflection electrode 512 is formed on the entire surface of the display substrate 502 or in a striped manner, as shown in FIG. 44(D), and thus the display device 501 is completed. The hole injection layer and the organic semiconductor layer (EL layer) are formed by discharging the materials in different sweeping directions from each other. Thus, unevenness of display resulting from unevenness of the discharged materials can be reduced, as in above.

By applying ink jetting as described above to the embodiment shown in FIGS. 40 to 44, the same effects can be obtained. Furthermore, the selectively discharged functional liquid materials can be prevented from spreading to the surroundings, and thus, highly precise patterning can be achieved.

Figure 45:
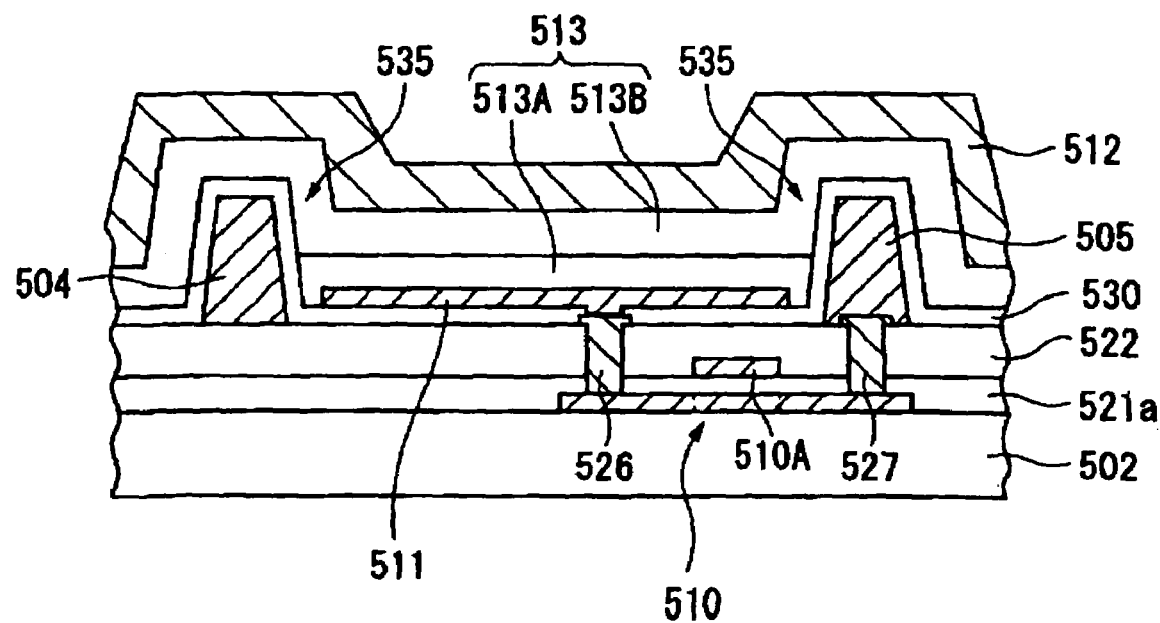
FIG. 45 is an enlarged sectional view showing a plan view of a pixel region of a display device using EL display elements according to an electro-optic device of the present invention.

The embodiment shown in FIGS. 40 to 44 illustrates an active matrix display device using the EL display elements, intended to display color images. However, the structure shown in FIGS. 40 to 44 can be applied to a monochrome display device, as shown in FIG. 45.

Specifically, the organic semiconductor layer 513B may be deposited all over the surface of the display substrate 502. Even in this case, since the hole injection layer 513A must be selectively disposed in predetermined regions in order to prevent crosstalk, it is extremely advantageous to use the steps 111. In FIG. 45, the same parts as in the embodiment shown in FIGS. 40 to 44 are designated by the same reference numerals.

Figure 46A:
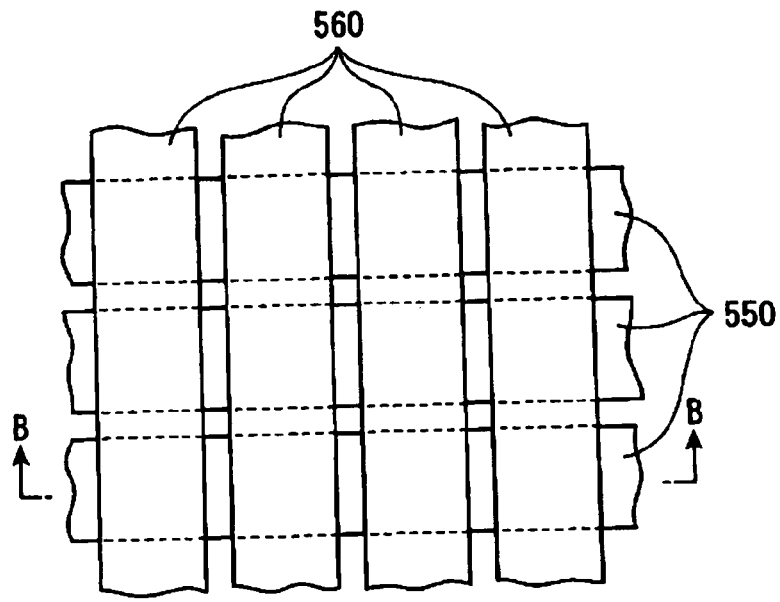
FIG. 46 is an enlarged view of a pixel region of a display device using EL display elements according to an electro-optic device of the present invention, and (A) is a plan view and (B) is a sectional view taken along line B-B in (A).
Figure 46B:
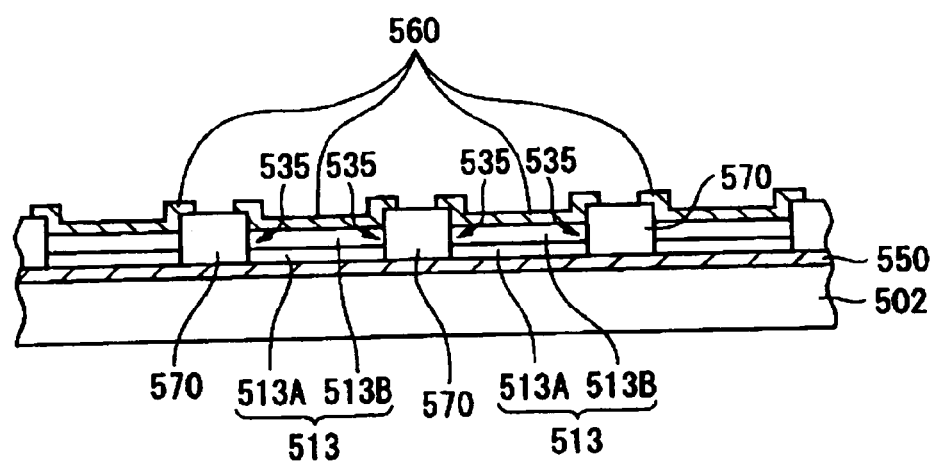

Also, the display device using the EL display elements are not limited to the active matrix type, but it may be a passive matrix type, as shown in FIG. 46. FIG. 46 shows EL devices included in an electro-optic device of the present invention. FIG. 46(A) is a plan view of the arrangement of a plurality of first bus wires 550 and a plurality of second bus wires 560 intersecting the first bus wires at right angles; and FIG. 46(B) is a sectional view taken along line B-B in FIG. 46(A). The same parts in FIG. 46 as in the embodiment shown in FIGS. 40 to 44 are designated by the same reference numeral and the description is not repeated. The steps of the manufacturing process are also the same as in the embodiment shown in FIGS. 40 to 44, and the drawing and description are therefore omitted.

In the display device shown in FIG. 46, an insulating layer 570, such as a $SiO_2$ film, is disposed so as to surround the region where the luminescent element 513 is deposited, thus forming the steps 535 between the region and the surroundings. Consequently, a selectively discharged functional liquid material can be prevented from spreading to the surroundings, and thus, highly precise patterning can be achieved.

The active matrix display device is not limited to the structure shown in FIGS. 40 to 44. Any of the structures shown in FIGS. 47, 48, 49, 50, 51, and 52 may be employed.

Figure 47:
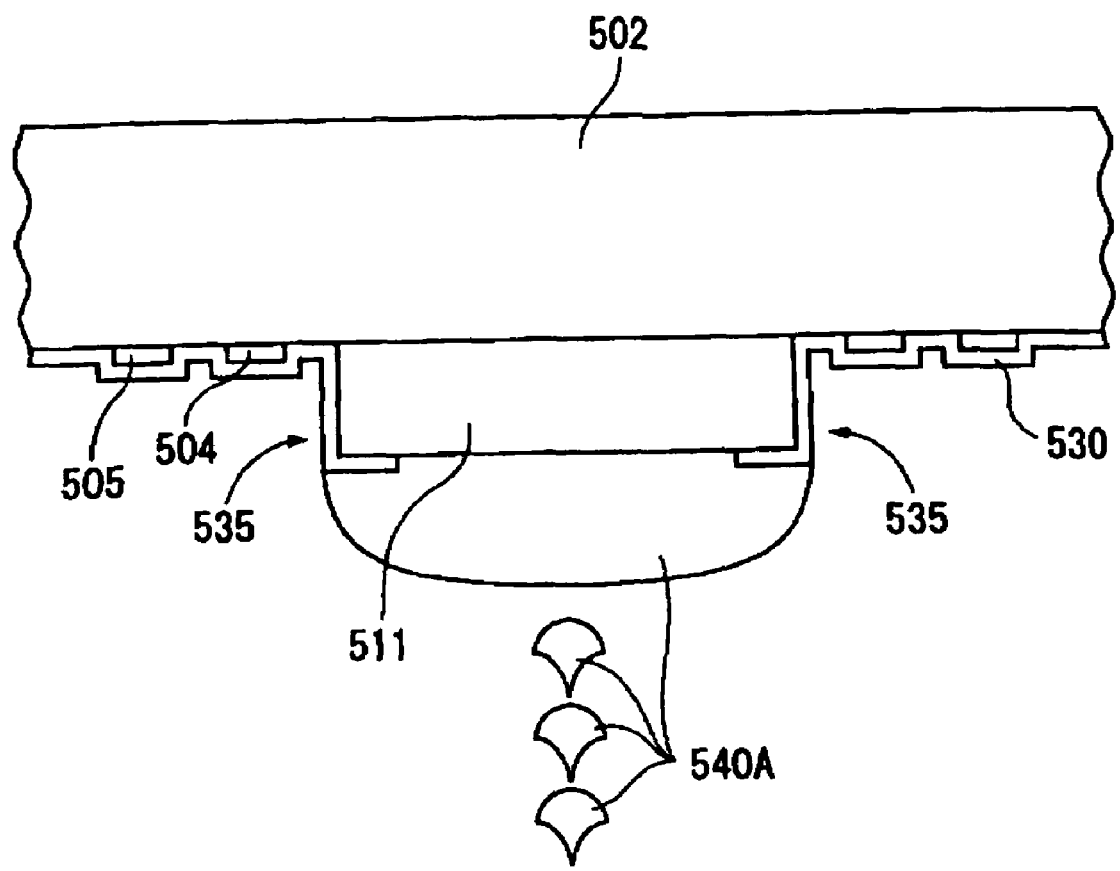
FIG. 47 is a sectional view showing a process of manufacturing a display device using EL display elements according to an electro-optic device of the present invention.

In the display device shown in FIG. 47, highly precise patterning is ensured by using the pixel electrode 511 to form the steps 535. FIG. 47 is a sectional view of a step midway through the process for manufacturing a display device. Its upstream and downstream steps are substantially the same as in the embodiment shown in FIGS. 40 to 44 and the drawings and description are therefore omitted.

In the display device shown in FIG. 47, the pixel electrode 511 has a thickness larger than that of conventional electrodes, thus forming steps 535 between the region and the surroundings. Specifically, in the display device shown in FIG. 47, the pixel electrode 511, where an optical material is to be applied later, has a height larger than that of the surroundings to form protrusion serving as steps. Then, an optical material 540A which is a precursor for forming a hole injection layer 513A acting as the lower layer of luminescent elements 513 is discharged on the surface of the pixel electrode 511 by ink jetting, as in the embodiment shown in FIGS. 40 to 44.

In this instance, unlike the embodiment shown in FIGS. 40 to 44, the display substrate 502 is turned upside down; hence, the surface of the pixel electrode 511 onto which the optical material 540A is applied faces downward, and, in this state, the optical material 540A is discharged. As a result, the optical material 540A remains on the upper surface (bottom surface in FIG. 47) of the pixel electrode

511 and, thus, does not spread to its surroundings due to the gravity and surface tension. The optic material is then heated or exposed to light to be cured, thus forming a thin hole injection layer 513A by repeating this discharge. The organic semiconductor layer 513B is also formed by the same technique. Thus, by using the protruding steps, highly precise patterning can be achieved. The optical materials 540A and 540B may be applied by making use of an inertial force, such as centrifugal force, instead of using gravity or surface tension.

Figure 48:
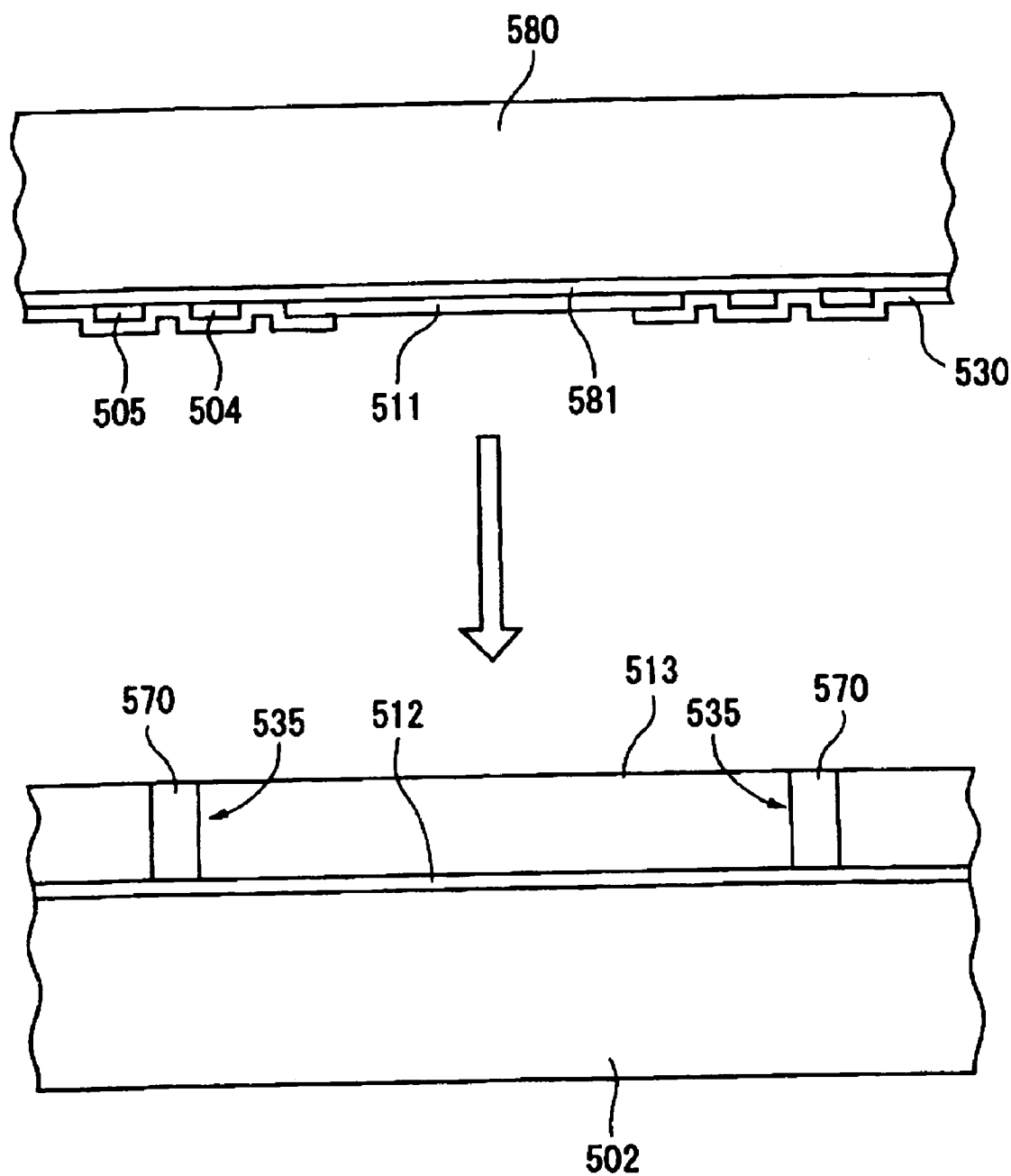
FIG. 48 is a sectional view showing a process of manufacturing a display device using EL display elements according to an electro-optic device of the present invention.

The display device shown in FIG. 48 is also an active matrix display device. FIG. 48 is a sectional view of a step midway through the process for manufacturing a display device. Its upstream and downstream steps are substantially the same as in the embodiment shown in FIGS. 40 to 44 and the drawings and description are therefore omitted.

In the display device shown in FIG. 48, first, the reflection electrode 512 is formed on the display substrate 502, and then the insulating layer 570 is deposited so as to surround the regions where the luminescent layer 513 will be disposed. Thus, the surrounded regions become lower than the surroundings, and thus, U-shaped steps 535 are formed.

The optical materials 540A and 540B, which are functional liquid materials, are discharged onto the region surrounded by the steps 535 by ink jetting to form luminescent elements 513, as in the embodiment shown in FIGS. 40 to 44.

On the other hand, scanning lines 503, signal lines 504, pixel electrodes 511, switching thin-film transistors 509, current thin-film transistors 510, and an insulating interlayer 530 are formed on a delamination layer 581 on the delamination substrate 580. Finally, the structure removed from the delamination layer 581 on the delamination substrate 580 is transferred onto the display substrate 502.

By the modification shown in FIG. 48, damages to the scanning lines 503, the signal lines 504, the pixel electrodes 511, the switching thin-film transistors 509, current thin-film transistors 510, and insulating interlayer 530 from the application of the optical materials 540A and 540B can be alleviated. This structure can be used for a passive matrix display element.

Figure 49:
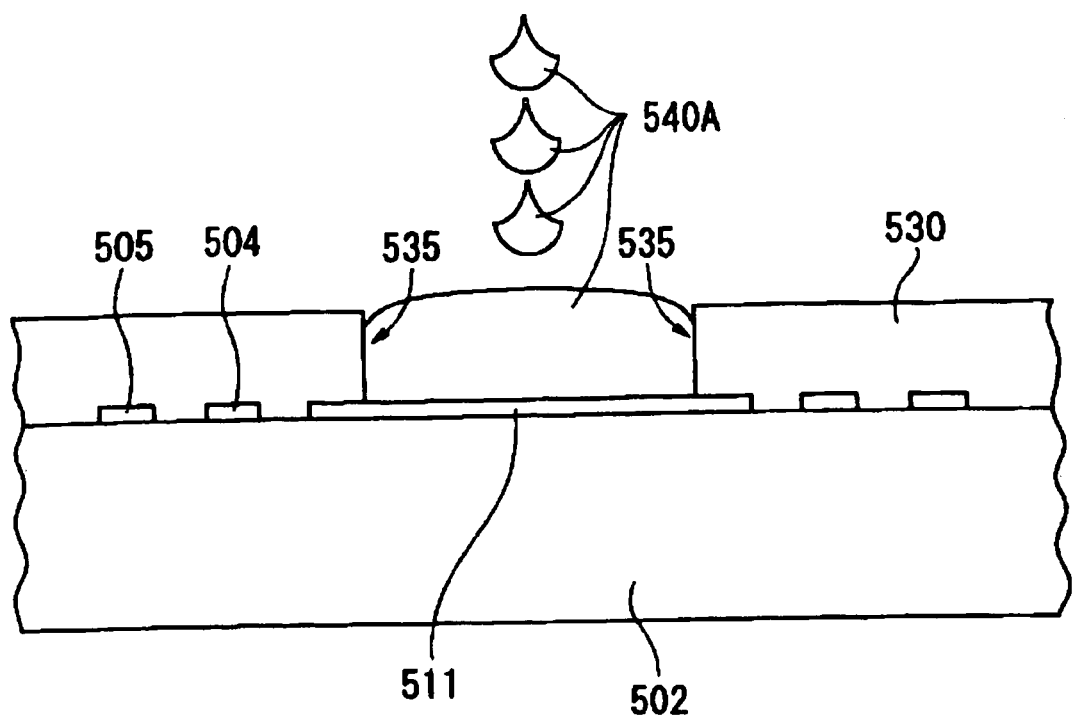
FIG. 49 is a sectional view showing a process of manufacturing a display device using EL display elements according to an electro-optic device of the present invention.

The display device shown in FIG. 49 is also an active matrix display device. FIG. 49 is a sectional view of a step midway through the process for manufacturing a display device. Its upstream and downstream steps are substantially the same as in the embodiment shown in FIGS. 40 to 44 and the drawings and description are therefore omitted.

In the display device shown in FIG. 49, U-shaped steps 535 are formed by using the insulating interlayer 530. As a result, using the insulating interlayer 530, the manufacturing process can be prevented from increasing the number of steps and, thus, becoming complicated. When the insulating interlayer 530 is formed of $SiO_2$, the resulting surface thereof may be exposed to ultraviolet or plasma of $O_2$, $CF_3$, Ar, or the like. Then the surface of the pixel electrode 511 may be exposed and the liquid optical materials 540A and 540B are selectively discharged. Thus, water-repellent regions are formed along the surface of the insulating interlayer 530, and both these water-repellent regions and the steps 535 facilitate the settlement of the optical materials 540A and 540B in the predetermined regions.

Figure 50:
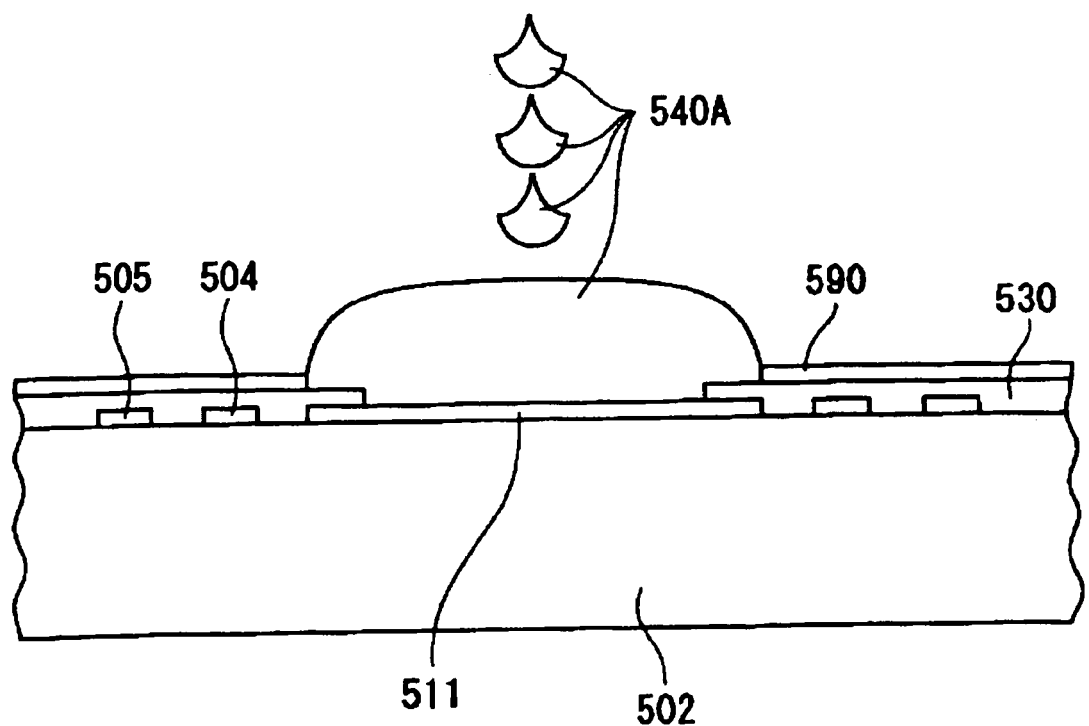
FIG. 50 is a sectional view showing a process of manufacturing a display device using EL display elements according to an electro-optic device of the present invention.

In the display device shown in FIG. 50, the regions where the optical materials 540A and 540B are applied have an affinity for water higher than that of the surroundings, so that the optical materials 540A and 540B do not spread to the surroundings. FIG. 50 is a sectional view of a step midway through the process for manufacturing a display device. Its upstream and downstream steps are substantially the same as in the embodiment shown in FIGS. 40 to 44 and the drawings and description are therefore omitted.

In the display device shown in FIG. 50, after the insulating interlayer 530 is formed, an amorphous silicon layer 590 is formed on the surface of the insulating interlayer 530. Since the amorphous silicon layer 590 is more water-repellent than ITO of the pixel electrode 511, the pixel electrode 511 becomes more hydrophilic than its surroundings. The optical materials 540A and 540B, which are functional liquid materials, are selectively discharged onto the upper surface of the pixel electrode 511 by ink jetting to form the luminescent elements 513, as in the embodiment shown in FIGS. 40 to 44 and, finally, the reflection electrode 512 is formed.

The structure shown in FIG. 50 is also applied to the passive matrix display device. This manufacturing process may include the step of transferring a structure formed on a delamination layer 581 on a lamination substrate 580 to the display substrate 502, as in the modification shown in FIG. 48.

Water-repellent regions and hydrophilic regions may be distributed by using a metal, an anodized film, an insulating film, such as polyimide or silicon, or other materials. In the case of a passive matrix display device, such a distribution may be formed with the first bus electrode 550; in the case of an active matrix display device, it is formed with the scanning lines 503, signal lines 504, the pixel electrodes 511, the insulating layer 530 or the light-shielding films 6b.

Figure 51:
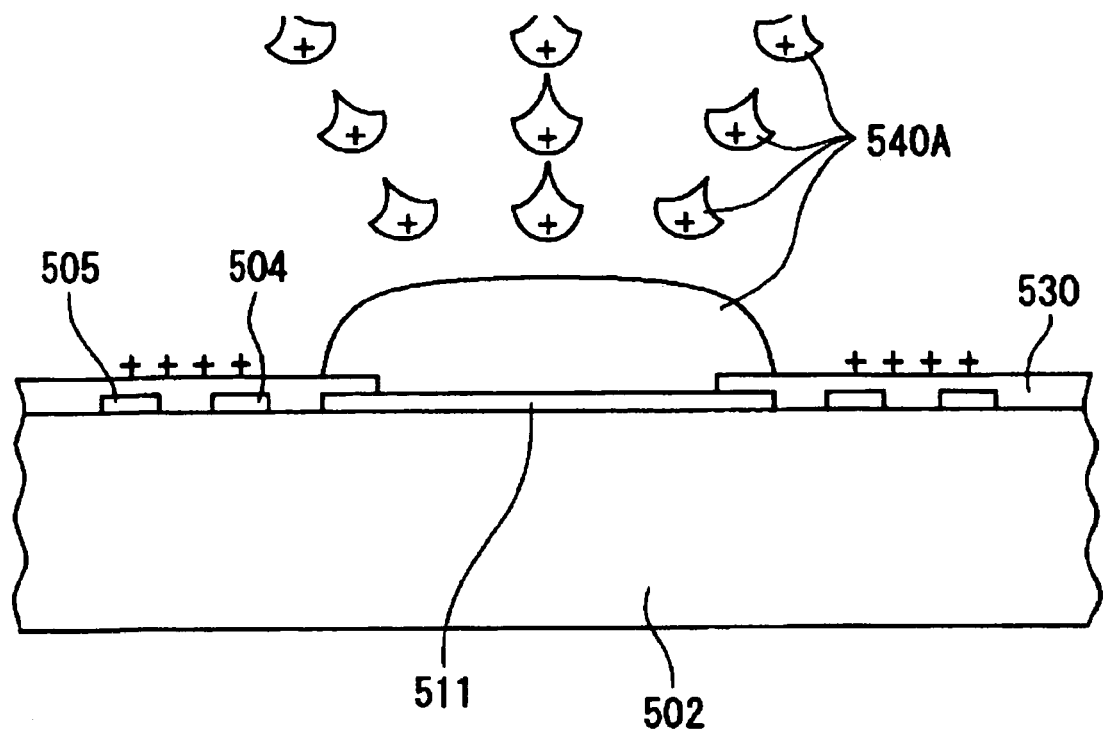
FIG. 51 is a sectional view showing a process of manufacturing a display device using EL display elements according to an electro-optic device of the present invention.
Figure 52:
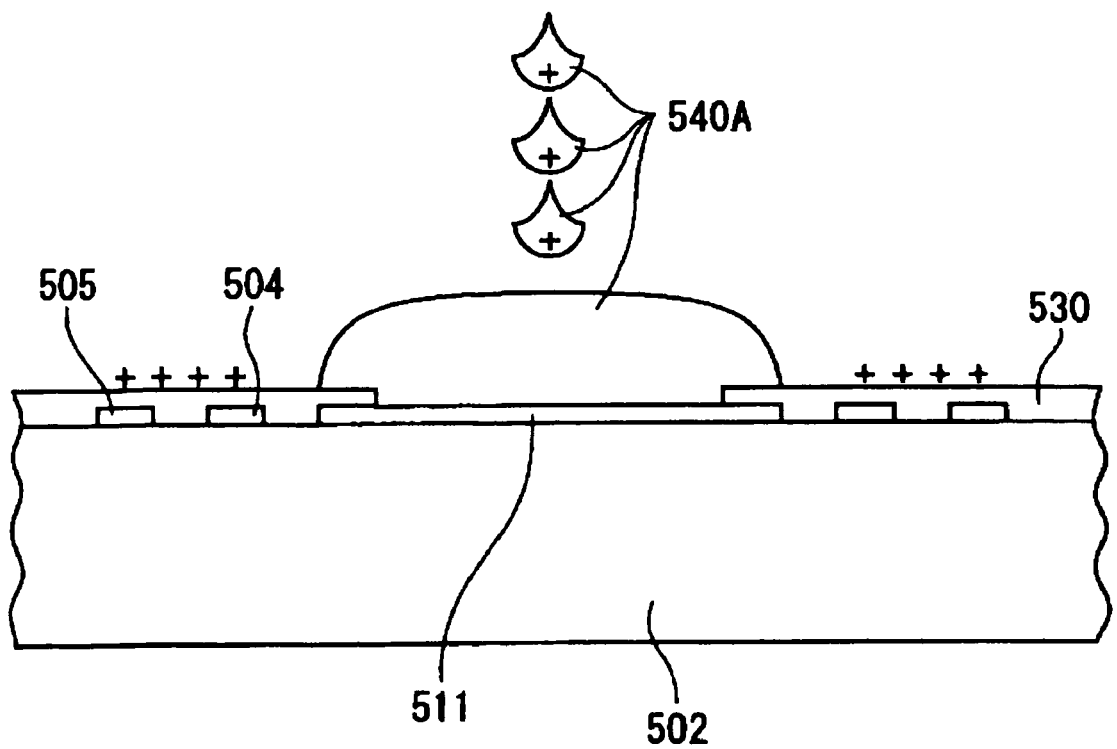
FIG. 52 is a sectional view showing a process of manufacturing a display device using EL display elements according to an electro-optic device of the present invention.

In the display device shown in FIG. 51, attraction of a potential or repulsive force is used, instead of using the steps 535 or water-repellent/hydrophilic distribution, in order to increase the patterning precision. FIG. 51 is a sectional view of a step midway through the process for manufacturing a display device. Its upstream and downstream steps are substantially the same as in the embodiment shown in FIGS. 40 to 44 and the drawings and description are therefore omitted.

In the display device, by activating the signal lines 504 and common power lines 505 and appropriately switching transistors, not shown in the drawing, the pixel electrode 511 becomes at a negative potential and the insulating interlayer 530 becomes at a positive potential. A positively charged liquid optical material 540A is selectively discharged onto predetermined regions by ink jetting. Since the optical material 540A is positively charged, electric charges as well as spontaneous polarization can be used and patterning precision is, thus, further increased.

The structure shown in FIG. 51 is also applied to the passive matrix display device. This manufacturing process may include the step of transferring a structure formed on a delamination layer 581 on a lamination substrate 580 to the display substrate 502, as in the modification shown in FIG. 48.

In this modification, potentials are applied to both the pixel electrode 511 and the surrounding insulating interlayer 530. However, it is not limited to this, and only the insulating interlayer 530 may be given a positive potential, but not to the pixel electrode 511. Then, the positively charged liquid optical material 540A is applied. In this modification shown in FIG. 52, since the liquid optical material 540A is surely maintained at a positive potential even after being discharged, the repulsive force between optical material 540A and the surrounding insulating interlayer 530 prevents the liquid optical material 540A from spreading to the surroundings with reliability.

[Structure of Liquid Discharge Means]

Other structures of the liquid discharge means capable of being applied to the above described embodiments will now be illustrated. The following structures each include a liquid discharge unit in which a plurality of liquid discharge head 22 are arranged and fixed together in a predetermined pattern. By using such a liquid discharge unit, efficient discharge can be achieved, according to various types of object without upsizing the structure of the liquid discharge heads 22 or preparing a plurality of types of liquid discharge head 22. A plurality of structures will now be illustrated with reference to drawings.

(Structure 1)

Figure 55:
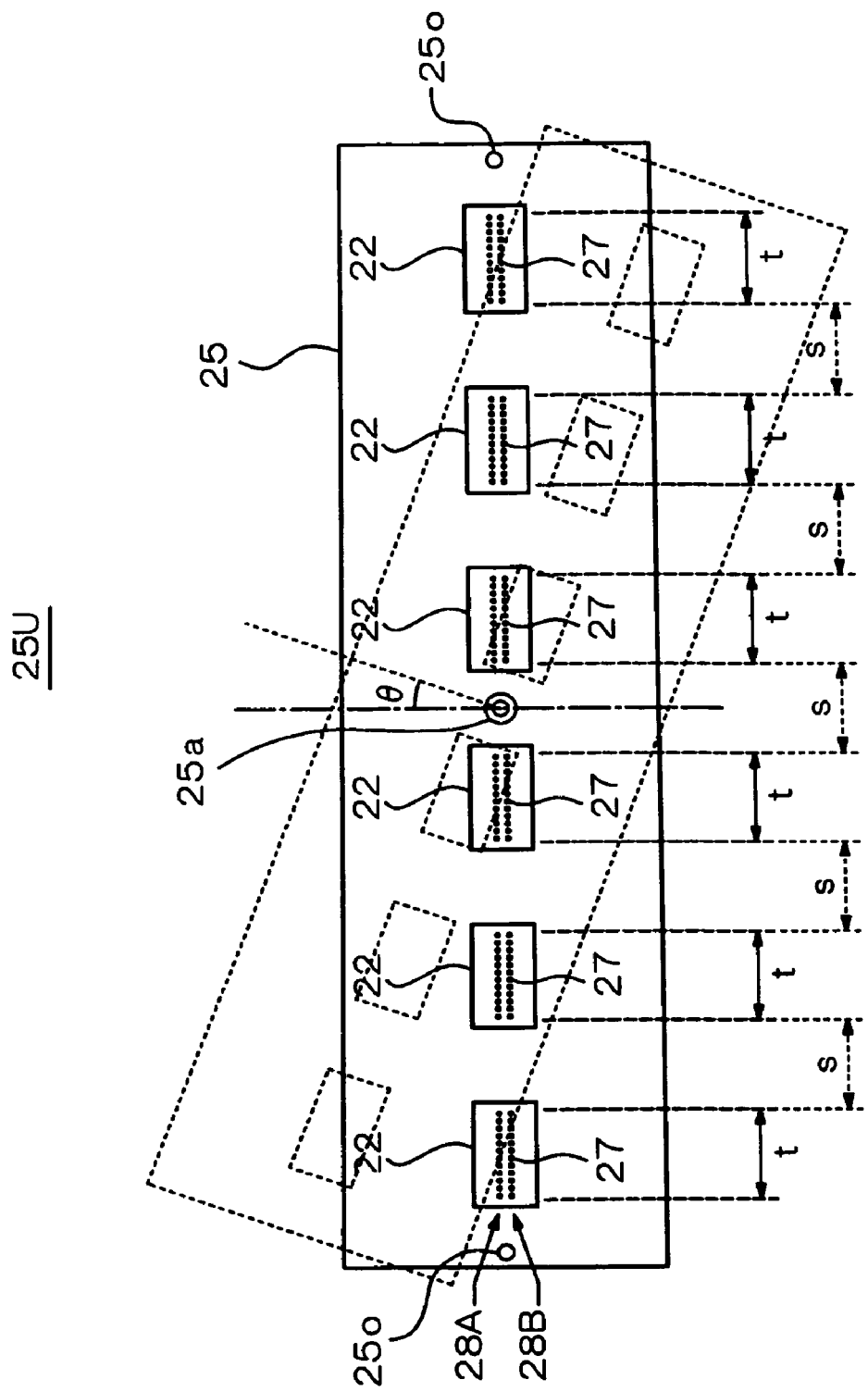
FIG. 55 is a plan view of a liquid discharge unit in which plurality of liquid discharge heads are arranged.

FIG. 55 is a schematic plan view of the structure of a liquid discharge unit according to Structure 1 of the present invention. In Structure 1, a plurality of liquid discharge heads 22, as described in the foregoing embodiments, are aligned in a line in the direction of extension of the nozzle lines 28 (28A and 28B in the drawing). The plurality of liquid discharge heads 22 are mounted on a sub carriages 25. The liquid discharge heads 22 are aligned at predetermined intervals in the direction in which the nozzle lines 28 extend, and accordingly, there are intervals s, which have no nozzle 27, between the nozzle lines 28 each having a discharge width t of the liquid discharge head 22. Preferably, the interval s and the discharge width t of the liquid discharge head 22 are the same.

The liquid discharge unit 25U has a center of rotation 25a on which the sub carriage 25 rotates, in the sub carriage 25. For example, the sub carriage 25 is attached in the head unit 26 described in the foregoing embodiments so as to be able to rotate on the center of rotation 25a, and is oriented such that the entire liquid discharge unit is tilted in a direction forming a tilt angle θ with respect to the direction (shifting direction Y) perpendicular to the sweeping direction X. Preferably, the center of rotation 25a is positioned in the center of the sub carriage 25, as shown in the drawing.

The liquid discharge heads 22 are precisely positioned with respect to an alignment origin point 25o provided on the sub carriage 25 and fixed to the sub carriage 25. Preferably, the alignment origin point 25o is provided at both ends of the sub carriage 25 in the nozzle line 28 extending direction. The alignment origin point 25o may be a minute mark formed by a printing pattern.

Figure 57A:
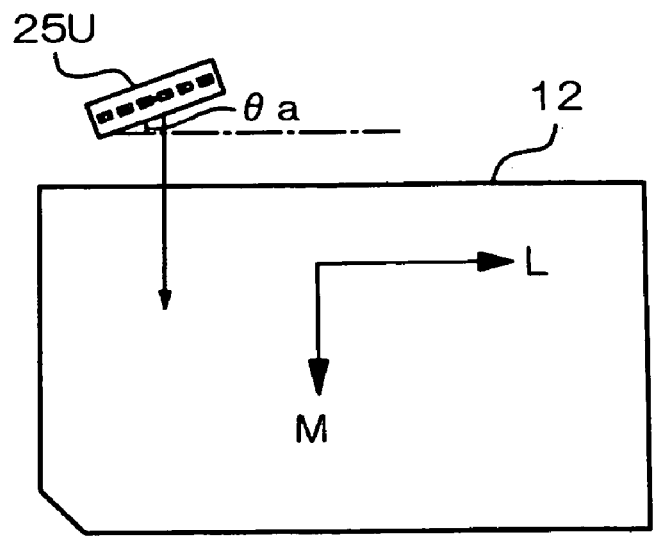
FIG. 57A is a schematic illustration of a posture of a liquid discharge unit to a substrate 12.
Figure 57B:
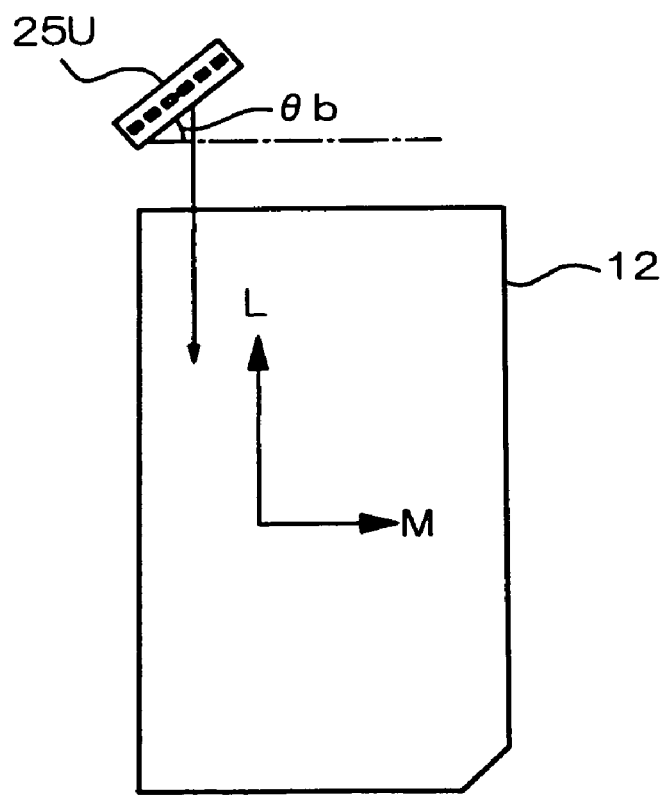
FIG. 57B is a schematic illustration of a posture of a liquid discharge unit to a substrate 12.

FIG. 56 shows a state in which the liquid discharge unit 25U operates on a substrate 12. The substrate (mother substrate) 12 has pattern-forming regions (unit regions) 11, as in above, arrayed lengthwise and crosswise. While the liquid discharge unit 25 is swept over the substrate 12, as in the foregoing embodiments, the nozzles of the liquid discharge heads 22 discharge droplets. In this instance, the droplets are discharged in the regions corresponding to the regions of the liquid discharge head 22 having the width t, but not in the regions corresponding to the regions having the intervals s, during a series of sweeping. Accordingly, another series of sweeping must be performed to discharge liquid to the untreated regions. For example, after a series of sweeping ST1 is performed from the position of the liquid discharge unit 25U at the top of the drawing, the liquid discharge unit 25U is shifted δy in the shifting direction Y, as shown in the bottom of the drawing and, then, another series of sweeping (ST2) is performed again. Preferably, δy is equivalent to the discharge width t or the interval s. In particular, the relationship expressed by δy=t=s in the case of t=S, the two series of sweepings ST1 and ST2 can eliminate untreated regions. In this instance, the tilt angle θa of the liquid discharge unit 25U for sweeping in the width direction M of the substrate 12 and the tilt angle θb for sweeping in the longitudinal direction L of the substrate 12 may be different from each other, according to the difference between the cycles of the pattern arrangement in the width direction M and the longitudinal direction L of the substrate 12, as shown in FIGS. 57A and 57B.

In the present embodiment as well as the foregoing embodiments, by sweeping the liquid discharge unit 25U in both the width direction M and the longitudinal direction L, unevenness of film formation can be reduced. Alternatively, whether sweeping is performed in the width direction or the longitudinal direction of the substrate 12 may be selected according to the efficiency of operation.

Also, the error variance method may be applied to this structure, as in the foregoing embodiments. In this instance, while the liquid discharge unit is shifted a predetermined distance in the shifting direction Y, series of sweeping are repeated. For this purpose, for example, a process of performing the series of sweeping ST1 and ST2 is defined as a set, and a plurality of sets are performed while shifted in the shifting direction Y. Alternatively, series of sweeping ST1 are performed while shifted in the shifting direction Y, and then series of sweeping ST2 are performed while shifted in the shifting direction Y.

(Structure 2)

Figure 58:
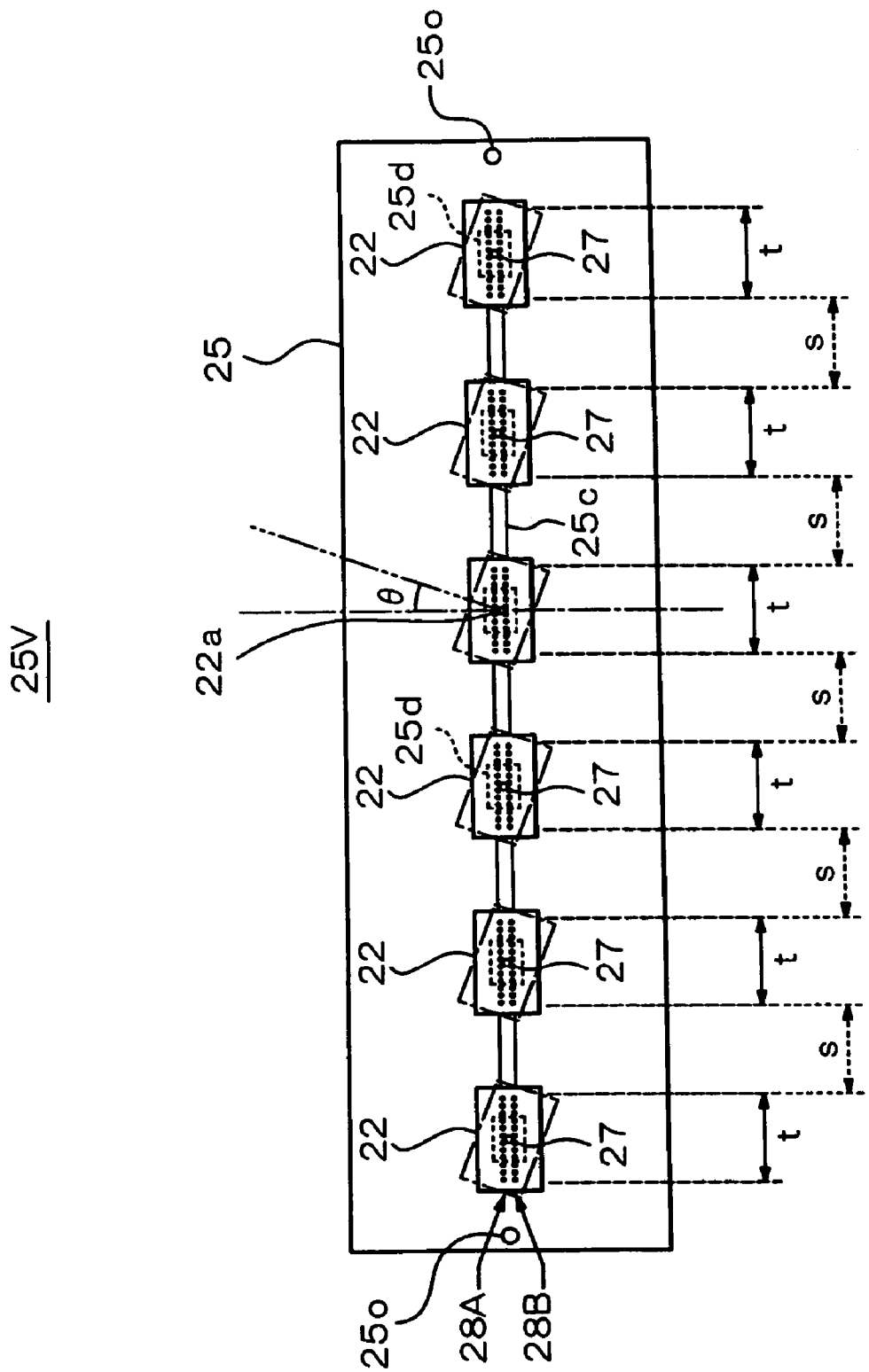
FIG. 58 is a plan view of a liquid discharge unit in which a plurality of liquid discharge heads are arranged.

A liquid discharge unit according to Structure 2 will now be described with reference to FIG. 58. The liquid discharge unit 25V has the same structure as in Structure 1 in that a plurality of liquid discharge head 22 are aligned at predetermined intervals; the liquid discharge heads 22 have a similar structure; and the sub carriage 25 has an alignment origin point 25o, and the description for the same parts is omitted. However, the liquid discharge unit 25V is different from Structure 1 in that each liquid discharge head 22 can be rotated with respect to the sub carriage 25. Also, the intervals between the liquid discharge heads 22 are changeable.

The sub carriage 25 has a guide 25c extending in the longitudinal direction thereof and movable mounting members 25d along the guide 25c. Each liquid discharge head 22 is mounted so as to rotate, with respect to the mounting member 25d, on a center of the rotation 22a. More specifically, the guide 25c is formed in a recessed groove or a protruded line. The mounting members 25d are fitted to the guide 25c so as to slide along the guide 25c. The position of the mounting members 25d can be adjusted with adjusting means, such as micrometer. The liquid discharge head 22 are rotatable with respect to the corresponding mounting member 25d, and the orientation thereof is adjusted at a tilt angle θ, if necessary, with adjusting means, such as a micrometer.

Structure 2 is the same as Structure 1 in that the regions having a discharge width t of the liquid discharge heads 22 are aligned at intervals s. In structure 1, however, the liquid discharge heads 22 are fixed to the sub carriage 25 and the tilt angle θ is set by rotating the sub carriage 25 on the whole, so that the liquid discharge heads 22 are disposed over a wide area in the sweeping direction. As a result, the liquid discharge heads 22, particularly away from the center of rotation 25a, must be swept with a long useless sweeping distance after start of series of sweeping or before end of the series. In contrast, in Structure 2, since each liquid discharge head 22 can rotate with respect to the sub carriage 25 to form a predetermined tilt angle θ, such an useless sweeping distance is substantially eliminated. Thus, the useless sweeping distance and consequently stroke of the movement can be reduced.

Since, in Structure 2, the liquid discharge heads 22 mounted on the sub carriage 25 are rotated to set the tilt angle θ, the intervals between the liquid discharge heads 22 must be varied according to changes of the tilt angle θ, in order to maintain the ratio of the discharge width t of the liquid discharge heads 22 to the intervals s constant. For example, when the substantial discharge width t and the interval s are set equivalent to each other, the interval s must equivalent to t·cos θ in the case where the tilt angle is not 0 though the interval s is equivalent to the discharge width s in the case where the tilt angle is 0. Accordingly, the liquid discharge heads 22 are shifted along the guide 25c to adjust the intervals according to the tilt angle θ so as to satisfy s=t·cos θ.

(Structure 3)

Figure 59:
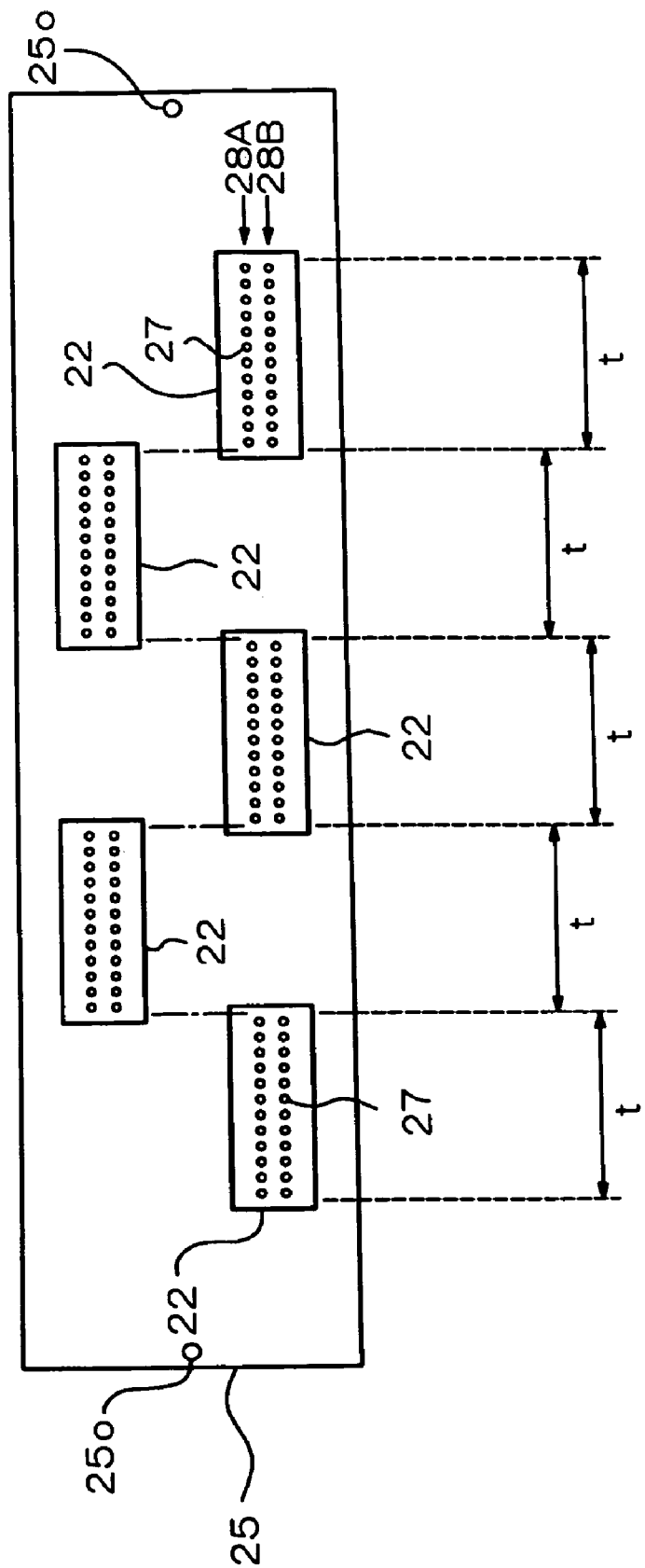
FIG. 59 is a plan view of a liquid discharge unit in which a plurality of liquid discharge heads are arranged.

A liquid discharge unit 25W according to Structure 3 will now be described with reference to FIG. 59. The liquid discharge unit 25W is the same as that of Structures 1 and 2 in that a plurality of liquid discharge heads 22 are used, but the manner of arrangement is different. The liquid discharge heads 22 of Structure 3 are mounted on the sub carriage 25, as well. However, the liquid discharge heads 22 of Structure 3 is arranged in two lines such that one line is displaced in the direction perpendicular to the direction of the nozzle lines 28 (28A and 28B) (in the standard direction S described above). Hence the liquid discharge heads 22 are arranged in staggered manner and, thus, the liquid discharge unit 25W, on the whole, has a continuous nozzle alignment. Specifically, the regions having the discharge width t of the liquid discharge heads 22 in one line and the regions having the discharge width t of the liquid discharge heads 22 in the other line are adjacent to each other.

The liquid discharge unit 25W of Structure 3 can therefore serve as if it had a continuous single nozzle line aligned in an integrated liquid discharge head. As a result, additional liquid discharge heads having a different number of nozzles are not necessary, and only by using a plurality of conventional liquid discharge heads 22, the number of nozzles can be increased. Also, since the structure does not have the intervals s as in Structures 1 and 2, additional series of sweeping are not necessary to discharge liquid to untreated regions corresponding to the regions having the intervals s.

In Structure 3 as well as Structure 1, the liquid discharge unit 25W may be rotated on a center of rotation to set a predetermined tilt angle θ. Alternatively, each of the liquid discharge heads 22 may be rotated with respect to the sub carriage 25 and capable of translationally sliding so that the tilt angle θ can be set a predetermined value and the intervals between the liquid discharge heads 22 can be set according to the set tilt angle θ.

[Film Formation Pattern on Object]

Figure 60:
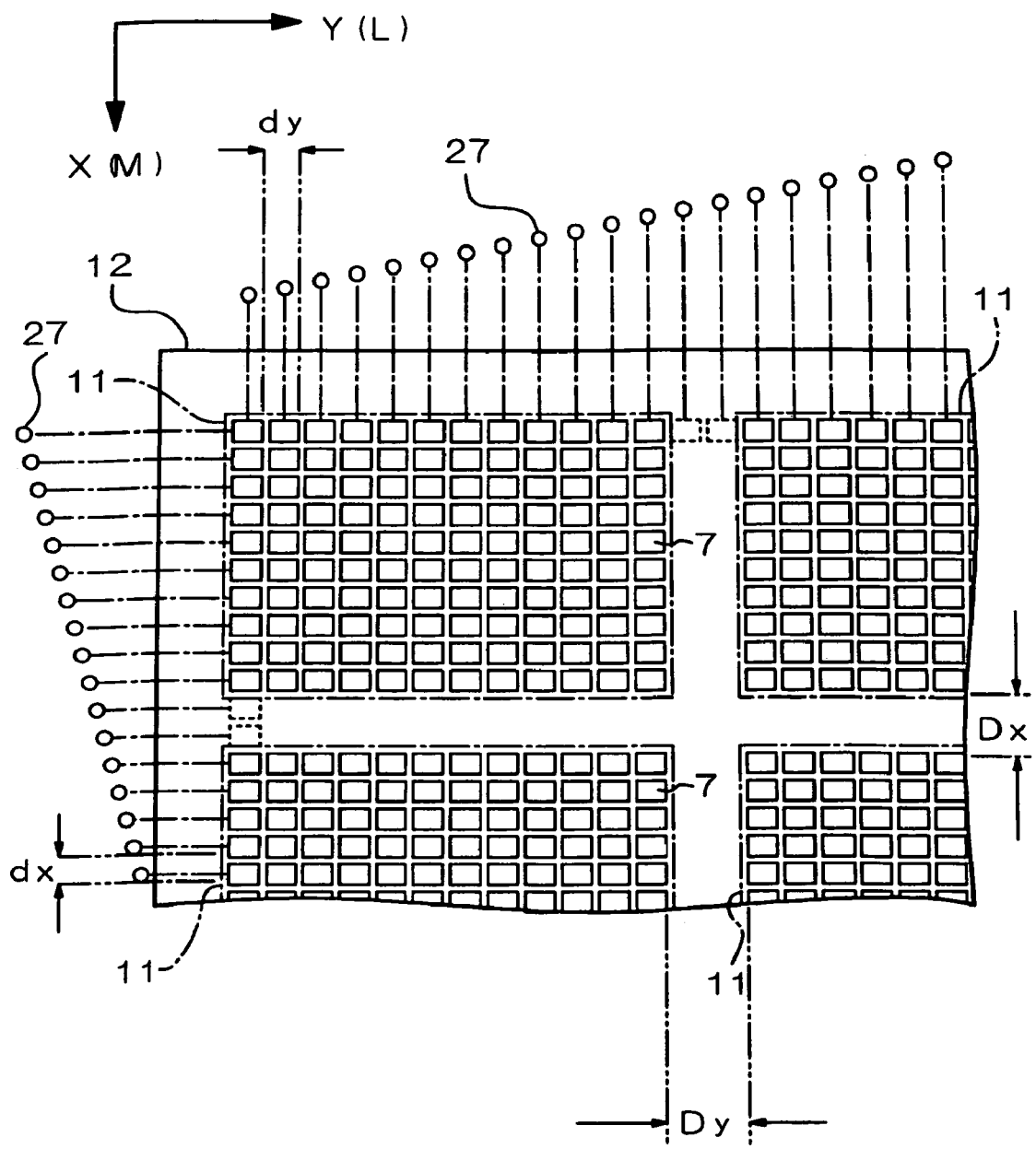
FIG. 60 is a schematic illustration of an arrangement of pattern-forming regions on a mother substrate.
Figure 61A:
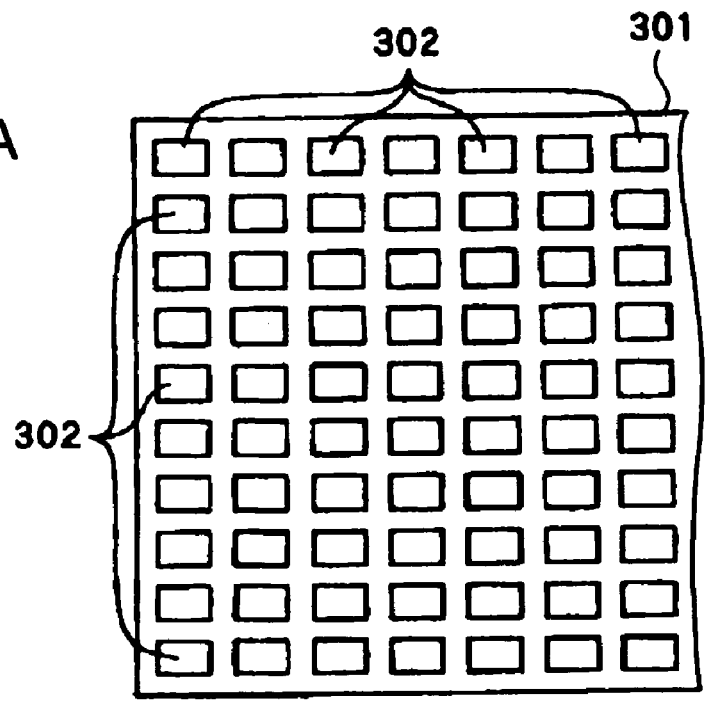
FIG. 61 is an illustration of a known method for manufacturing a color filter.
Figure 61B:
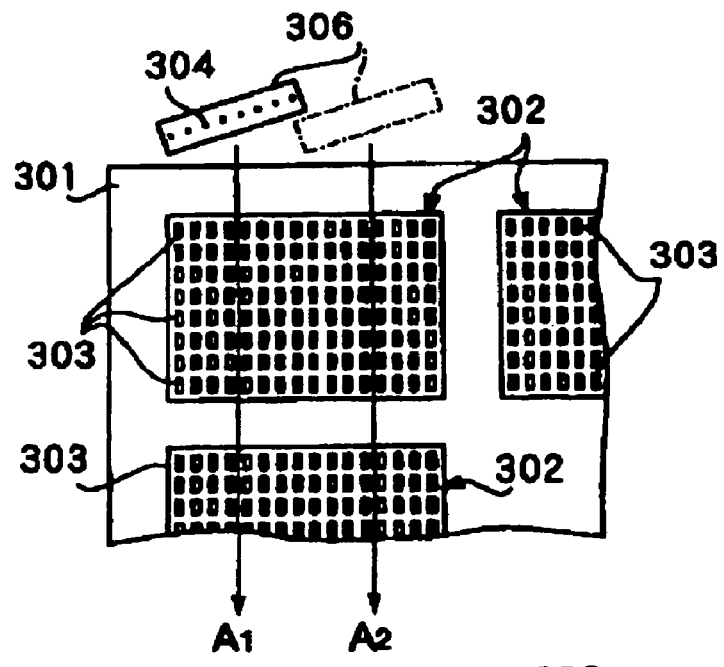
Figure 61C:
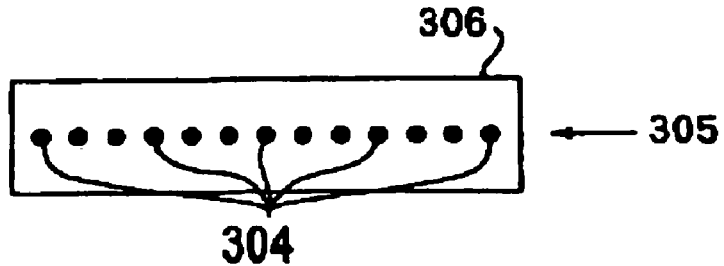
Figure 62A:
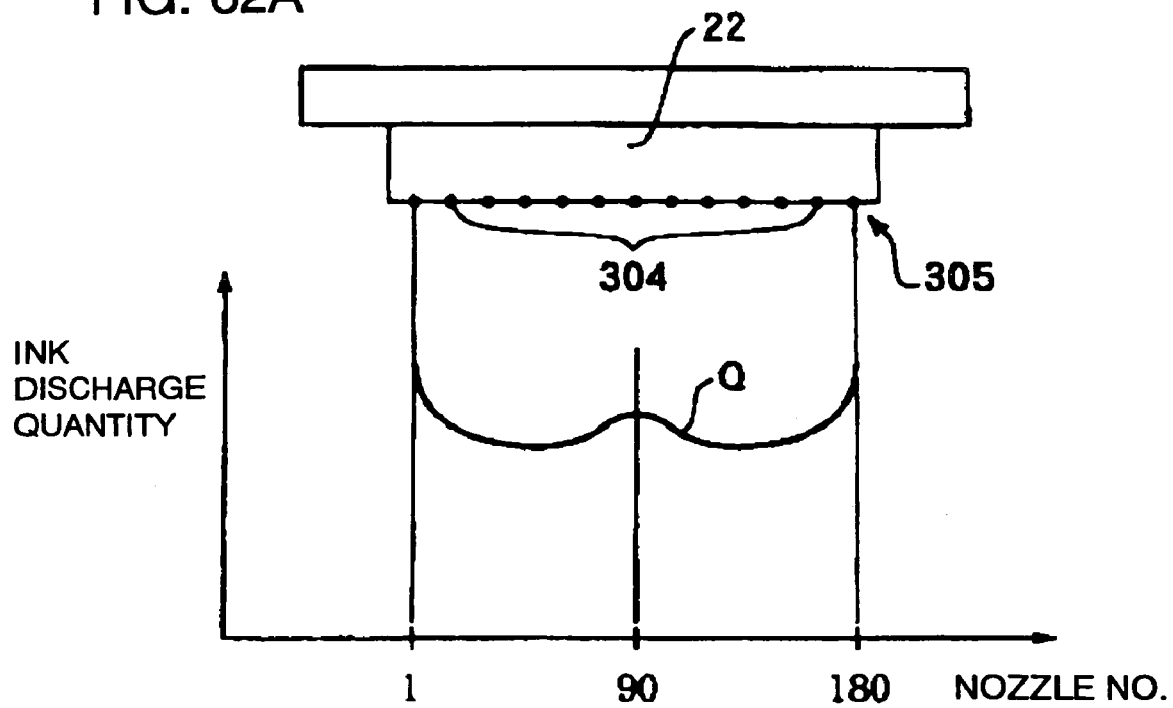
FIG. 62 is a schematic illustration of a characteristic of a known color filter.
Figure 62B:
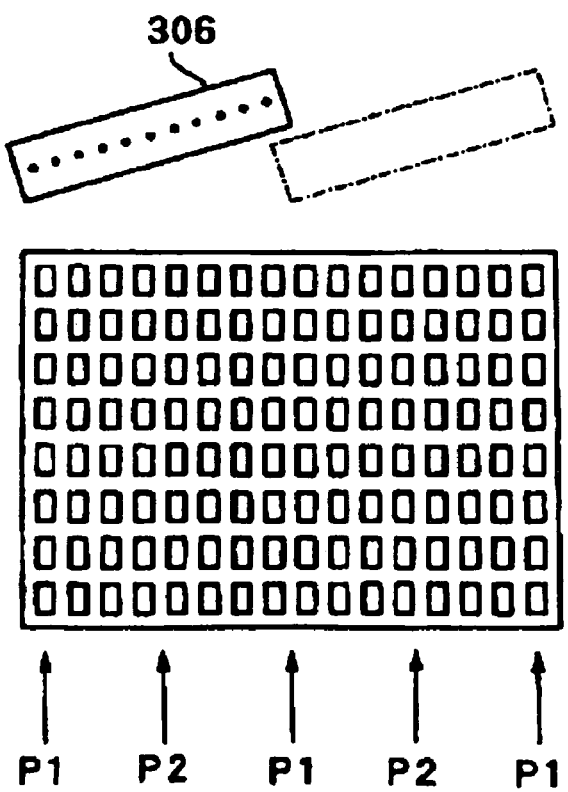

A film formation pattern on the mother substrate 12, acting as an object, in the foregoing embodiments and structures will now be illustrated. FIG. 60 is a fragmentary enlarged plan view of a film formation pattern on the mother substrate 12. The mother substrate 12 has pattern-forming regions (unit regions) 11, as in above, arrayed lengthwise and crosswise, and the pattern-forming regions 11 each have a plurality of regions 7 in an arrangement pattern therein. When the pattern-forming regions 11 are separated into color filter substrates, the regions 7 act as the filter element regions in which desired filter elements, such as R (red), G (green), and B (blue), are arrayed in a desired arrangement, such as striped arrangement, delta arrangement, or oblique mosaic arrangement. When the pattern-forming regions 11 are separated into EL devices or plasma display panels, the regions 7 act as the display dots in which a luminescent layer or a fluorescent material is arrayed in a desired pattern.

In the mother substrate 12, the interval Dx between the pattern-forming regions 11 in the X direction (for example, the width direction M) is set to be positive integral multiple of the arrangement cycle dx, in the X direction, of the regions 7 in each pattern-forming region 11. The interval Dy between the pattern-forming regions 11 in the Y direction (for example, the longitudinal direction L) is set to be positive integral multiple of the arrangement cycle dy, in the Y direction, of the regions 7 in each pattern-forming region 11. As a result, liquid can be discharged in the plurality of pattern-forming regions 11 at one time from nozzles 27 aligned at regular intervals, and thus, more efficient manufacturing can be achieved.

(Modifications)

While the present invention has been illustrated using preferred embodiments thereof, the invention is not limited to those embodiments, and includes the following modifications and others in form and detail without departing from the scope and object of the invention.

Specifically, in the device for manufacturing a color filter (liquid discharge device) shown in FIGS. 8 and 9, while the liquid discharge head 22 is swept over the mother substrate 12 by moving the liquid discharge head 22 in the sweeping direction X, the mother substrate 12 is shifted by the shifting driver 21 so that the liquid discharge head 22 is shifted relative to the mother substrate 12. Alternatively, the mother substrate 12 may be moved to perform sweeping and the liquid discharge head 22 may be shifted. Furthermore, any technique can be applied, as long as at least one of the liquid discharge head 22 and the mother substrate 12 is shifted relative to the other and the liquid discharge head 22 is moved along the surface of the mother substrate 12 relative to the mother substrate 12. For example, the mother substrate 12 may be shifted, but not liquid discharge head 22, or both may be shifted in relatively opposite directions.

The liquid discharge means (ink jet head) 421 for discharging ink makes use of deformation of a piezoelectric element in the embodiment. However, different types of ink jet head having other structures, such as the type which may discharge ink by bubbles generated by heating may be used.

The ink jet head 421 of the embodiment shown in FIGS. 27 to 37 has nozzles 466 aligned in two lines at substantially regular intervals. However, the number of nozzle lines is not limited to two, and other plurality of numbers may be used. The intervals between the nozzles may not be regular or the nozzles may not be aligned in line.

The liquid discharge heads 16 and 401 are used for manufacturing the color filter 1, the liquid crystal device 101, the EL device 201, but not limited to these. The liquid discharge heads 16 and 401 may be used for electron emission devices such as FEDs (field emission displays); PDP (plasma display panel); electrophoretic devices, in which a functional liquid ink containing charged particles is discharged in recessed portions of pixels partitioned by barrier walls and the pixels display images by applying a voltage to electrodes separated by the pixels to collect the charged particles to one electrode side; low-profile Braun tubes; CRT (cathode-ray tube) displays; and other various display devices (electro-optic devices) in which predetermined layers are deposited on a substrate.

The devices of the present invention include color filters and display devices (electro-optic devices) having a substrate (base). The methods of the present invention is applied to various processes for manufacturing these devices in which droplets 8 are discharged onto the substrate (base). For example, the present invention may be applied to the structures in which a liquid metal, a conductive material, a paint containing a metal is discharged by ink jetting to form electric wires on a print circuit board; fine microlenses are discharged onto a substrate by ink jetting to form an optical member; a resist is applied onto a desired portion of a substrate by ink jetting; and light-scattering protrusions or a fine white pattern is formed on a light-transmissive substrate such as resin by ink jetting to form a light-scattering plate. Also, the present invention may be applied to the structure in which RNA (ribonucleic acid) is discharged onto spike spots arranged on a DNA (deoxyribonucleic acids) chip by ink jetting to form a fluorescent label probe and hybridization is performed on the DNA chip; and other biochip formation in which, for example, a sample, an antibody, DNA (deoxyribonucleic acids), or the like is discharged in regions partitioned in a dot manner on a substrate, by ink jetting.

The present invention may be applied to liquid crystal devices 101 including active matrix liquid crystal panels having active elements, such as TFTs, other transistors, and TFDs, in which ink is discharged in recessed regions defined by barrier walls 6 surrounding pixel electrodes by ink jetting to form a color filter 1; an ink containing a color material and a conductive material is discharged on pixel electrodes to form a color filter 1 acting as conducive color filter; spacers in a grain form are discharged by ink jetting to hold a gap between substrates, and other structures of electro-optic systems for the liquid crystal devices 101.

The present invention is not limited to using for the color filter 1 and may be applied to the EL device 201 and other electro-optic devices. The EL device 201 may be a striped type having ELs corresponding to three colors R, G and B arranged in a striped manner; an active matrix type having transistors for controlling current applied to the luminescent films from one pixel to another; a passive matrix type; or other structures.

Figure 53:
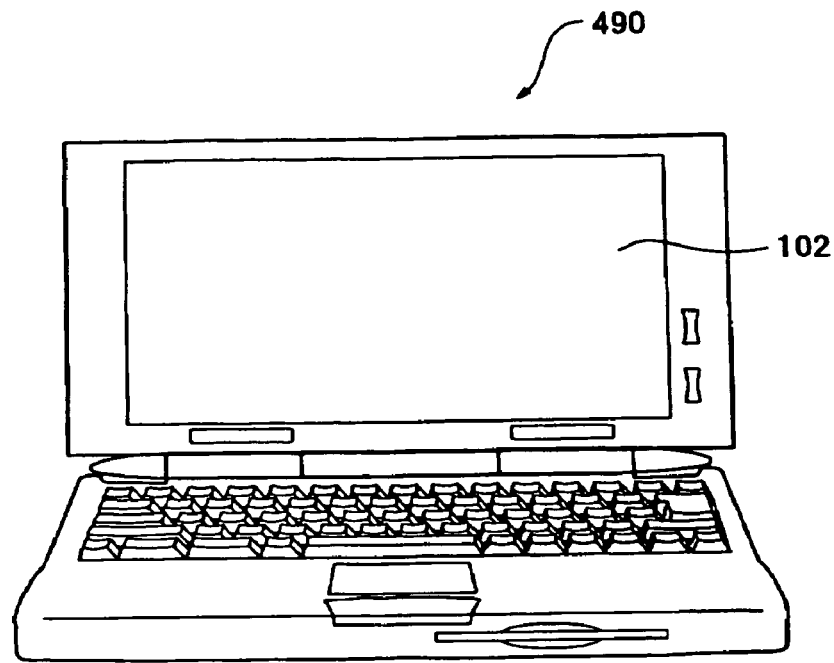
FIG. 53 is a perspective view of a personal computer, which is an electronic apparatus including the electro-optic device.
Figure 54:
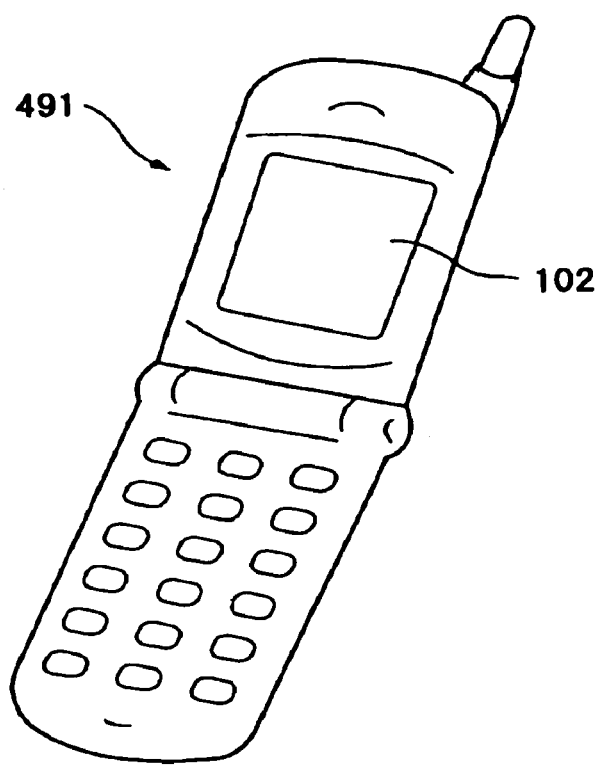
FIG. 54 is a perspective view of a cellular telephone, which is an electronic apparatus including the electro-optic device.

The electro-optic devices of the present invention are incorporated in various electronic apparatuses including personal computers 490 as shown in FIG. 53, portable phone such as cellular telephones 491, as shown in FIG. 54, and PHSs (personal handy phone systems), electronic notebooks, pagers, POS (point of sales) terminals, IC cards, mini disc players, liquid crystal projectors, engineering work stations (EWS), word processors, TV sets, viewfinder-type and monitor-direct-view-type video tape recorders, electronic calculators, car navigation systems, apparatuses having touch panels, watches, and game machines.

Concrete structures and procedures of the present invention may be changed within the scope of the invention. For example, the ink jet heads 421 described with reference to FIGS. 28, 36, and 37 are arranged in one direction. However, one of the two alignments may be oriented in the direction rotated 90° with respect to the tilt angle of the other alignment so as to form a tapered shape at a right angle with each other. Alternatively, the adjacent ink jet heads in one alignment may form tapered shapes at a right angle with each other. Various modifications may be made as long as they do not depart from the spirit of the invention.

The method and device for forming a film of the present invention can be widely used for forming a film on the surface of a desired object. For example, when a film is uniformly formed on the surface of an object, by discharging a plurality of droplets one by one in at least two different directions along the sweeping direction, unevenness of the film formation resulting from the sweeping direction can be reduced. Exemplary films include photosensitive resist films and protective coating films. Also, the present invention can be used for forming various types of structure on the surface of an object, as well as forming a simple film. For example, columnar spacers may be dispersed on the surface of an object by the method of the invention. A substrate having such columnar spacers may be used for liquid crystal display devices and input pads.

According to the present invention, by discharging droplets of a liquid material in at least two different sweeping directions relative to the object, the material can be efficiently discharged onto various types of object. By setting the sweeping direction in at least two different directions relative to the object, unevenness of film formation resulting from the sweeping direction can be reduced.

What is claimed is:

1. A method to form a film by discharging a liquid material onto the surface of an object with a liquid discharge device to manufacture a color filter, the method comprising:

first discharging a plurality of droplets of the liquid material from a row of ink jets comprising an ink jet head at a first row position onto the surface of the object while the liquid discharge device sweeps with the same first row position over the object in a first sweeping direction with respect to the object, along the surface of the object; and second discharging a plurality of droplets of the liquid material from a row of ink jets comprising an ink jet head at a second row position onto the surface while the liquid discharge device sweeps with the same second row position over the object in a second sweeping direction different from the first sweeping direction with respect to the object, along the surface of the object wherein each of the first and second sweeping directions have different x and y directions and further the rows of ink jets for each sweep are not parallel to each other during successive sweeps.

2. The method to form a film according to claim 1, the object being rotated to be oriented in a direction different from one discharging to the other so that the first direction and the second direction intersect each other with respect to the object.

3. A method to manufacture a color filter in which filter elements are formed by discharging a liquid material onto an object, the method comprising:

continuously discharging droplets of the liquid material from a row of ink jets comprising an ink jet head at a first row position onto the object, in a first sweeping direction; and continuously discharging droplets of the liquid material from a row of ink jets comprising an ink jet head at a second row position onto the object, in a second sweeping direction different from the first sweeping direction, wherein each of the first and second sweeping directions have different x and y directions and further the rows of ink jets for each sweep are not parallel to each other during successive sweeps.

4. The method to manufacture a color filter according to claim 3, in the first discharge, first filter elements having a first color are formed in a first region of the object; and in the second discharge, second filter elements having a second color different from the first color are formed in a second region of the object, different from the first region.

5. The method to manufacture a color filter according to claim 4, the filter elements comprising:

three types of filter elements having three colors, and one type of the filter elements, having one color exhibiting the strongest color shading resulting from the sweeping direction is discharged in one of the discharges and the other types having the other two colors are discharged in the other discharge step.

6. The method to manufacture a color filter according to claim 3, wherein each of the filter elements is formed of a plurality of droplets of the liquid material, and some of the plurality of droplets are discharged in the first discharge and the other droplets are discharged in the second discharge.

7. A method to manufacture a display device which includes discharging a liquid material to manufacture a color filter onto a substrate to form a film, comprising:
  continuously discharging droplets of a liquid material from a row of ink jets comprising an ink jet head at a first row position onto a substrate in a first sweep in direction; and
  continuously discharging droplets of the liquid material from a row of ink jets comprising an ink jet head at a second row position onto the substrate, in a second sweeping direction different from the first sweeping direction,
  wherein each of the first and second sweeping directions have different x and y directions and further the rows of ink jets for each sweep are not parallel to each other during successive sweeps.

8. The method to manufacture a display device according to claim 7, discharged droplets of the liquid material forming display dots.

9. The method to manufacture a display device according to claim 8, each of the display dots being formed of a plurality of droplets of the liquid material, and some of the plurality of droplets being discharged in the first discharge and the other droplets are discharged in the second discharge.

* * * * *